(12) United States Patent
Norman et al.

(10) Patent No.: US 12,105,650 B2
(45) Date of Patent: *Oct. 1, 2024

(54) QUASI-VOLATILE SYSTEM-LEVEL MEMORY

(71) Applicant: SUNRISE MEMORY CORPORATION, San Jose, CA (US)

(72) Inventors: Robert D. Norman, Pendleton, PA (US); Eli Harari, Saratoga, CA (US); Khandker Nazrul Quader, Santa Clara, CA (US); Frank Sai-keung Lee, San Jose, CA (US); Richard S. Chernicoff, Mercer Island, WA (US); Youn Cheul Kim, Saratoga, CA (US); Mehrdad Mofidi, Los Altos Hills, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/087,661

(22) Filed: Dec. 22, 2022

(65) Prior Publication Data

US 2023/0131169 A1 Apr. 27, 2023

Related U.S. Application Data

(63) Continuation of application No. 17/169,212, filed on Feb. 5, 2021, now Pat. No. 11,580,038.

(Continued)

(51) Int. Cl.
*G06F 12/00* (2006.01)
*G06F 9/4401* (2018.01)
(Continued)

(52) U.S. Cl.
CPC ........ *G06F 13/1668* (2013.01); *G06F 9/4403* (2013.01); *G06F 9/541* (2013.01);
(Continued)

(58) Field of Classification Search
CPC ................. G06F 13/1668; G06F 13/28; G06F 13/4282; G06F 9/4403; G06F 9/541;
(Continued)

(56) References Cited

U.S. PATENT DOCUMENTS 4,213,139 A 7/1980 Rao
4,984,153 A 1/1991 Kregness et al.
(Continued)

FOREIGN PATENT DOCUMENTS

CN 107658317 A 2/2018
CN 108649031 A 10/2018
(Continued)

OTHER PUBLICATIONS

"EP Extended Search Report EP168690149.3", Oct. 18, 2019.
(Continued)

*Primary Examiner* — Cheng Yuan Tseng
(74) *Attorney, Agent, or Firm* — Edward C. Kwok; VLP Law Group LLP

(57) ABSTRACT

A high-capacity system memory may be built from both quasi-volatile (QV) memory circuits, logic circuits, and static random-access memory (SRAM) circuits. Using the SRAM circuits as buffers or cache for the QV memory circuits, the system memory may achieve access latency performance of the SRAM circuits and may be used as code memory. The system memory is also capable of direct memory access (DMA) operations and includes an arithmetic logic unit for performing computational memory tasks. The system memory may include one or more embedded processor. In addition, the system memory may be config-
(Continued)

ured for multi-channel memory accesses by multiple host processors over multiple host ports. The system memory may be provided in the dual-in-line memory module (DIMM) format.

51 Claims, 27 Drawing Sheets

Related U.S. Application Data

(60) Provisional application No. 63/027,850, filed on May 20, 2020, provisional application No. 62/980,596, filed on Feb. 24, 2020, provisional application No. 62/971,859, filed on Feb. 7, 2020.

(51) Int. Cl.
| | |
|---|---|
| G06F 9/54 | (2006.01) |
| G06F 12/0893 | (2016.01) |
| G06F 12/10 | (2016.01) |
| G06F 13/16 | (2006.01) |
| G06F 13/28 | (2006.01) |
| G06F 13/42 | (2006.01) |
| H01L 25/065 | (2023.01) |
| H01L 25/18 | (2023.01) |

(52) U.S. Cl.
CPC .......... *G06F 12/0893* (2013.01); *G06F 12/10* (2013.01); *G06F 13/28* (2013.01); *G06F 13/4282* (2013.01); *H01L 25/0652* (2013.01); *H01L 25/18* (2013.01); *G06F 2212/3042* (2013.01); *H01L 2225/06513* (2013.01); *H01L 2225/06541* (2013.01)

(58) Field of Classification Search
CPC ..... G06F 12/0893; G06F 12/10; H01L 25/18; H01L 25/0652; H01L 2225/06513; H01L 2225/06541
See application file for complete search history.

(56) References Cited

U.S. PATENT DOCUMENTS

| | | |
|---|---|---|
| 5,388,246 A | 2/1995 | Kasai |
| 5,583,808 A | 12/1996 | Brahmbhatt |
| 5,646,886 A | 7/1997 | Brahmbhatt |
| 5,656,842 A | 8/1997 | Iwamatsu |
| 5,768,192 A | 6/1998 | Eitan |
| 5,789,776 A | 8/1998 | Lancaster et al. |
| 5,915,167 A | 6/1999 | Leedy |
| 6,040,605 A | 3/2000 | Sano et al. |
| 6,057,862 A | 5/2000 | Margulis |
| 6,107,133 A | 8/2000 | Furukawa |
| 6,118,171 A | 9/2000 | Davies et al. |
| 6,130,838 A | 10/2000 | Kim et al. |
| 6,314,046 B1 | 11/2001 | Kamiya et al. |
| 6,434,053 B1 | 8/2002 | Fujiwara |
| 6,580,124 B1 | 6/2003 | Cleeves et al. |
| 6,744,094 B2 | 6/2004 | Forbes |
| 6,774,458 B2 | 8/2004 | Fricke et al. |
| 6,873,004 B1 | 3/2005 | Han et al. |
| 6,881,994 B2 | 4/2005 | Lee et al. |
| 6,946,703 B2 | 9/2005 | Ryu et al. |
| 7,005,350 B2 | 2/2006 | Walker et al. |
| 7,221,613 B2 | 5/2007 | Pelley et al. |
| 7,284,226 B1 | 10/2007 | Kondapalli |
| 7,307,308 B2 | 12/2007 | Lee |
| 7,475,174 B2 | 1/2009 | Chow |
| 7,489,002 B2 | 2/2009 | Forbes et al. |
| 7,524,725 B2 | 4/2009 | Chung |
| 7,612,411 B2 | 11/2009 | Walker |
| 7,804,145 B2 | 9/2010 | Shimizu et al. |
| 8,026,521 B1 | 9/2011 | Or-Bach et al. |
| 8,139,418 B2 | 3/2012 | Carman |
| 8,178,396 B2 | 5/2012 | Sinha et al. |
| 8,244,993 B2 | 8/2012 | Grundy et al. |
| 8,417,917 B2* | 4/2013 | Emma .................. G06F 9/3838 |
| | | 712/15 |
| 8,630,114 B2 | 1/2014 | Lue |
| 8,653,672 B2 | 2/2014 | Leedy |
| 8,767,473 B2 | 7/2014 | Shim et al. |
| 8,848,425 B2 | 9/2014 | Schloss |
| 8,878,278 B2 | 11/2014 | Alsmeier et al. |
| 8,984,368 B2* | 3/2015 | Loh ..................... G06F 11/1044 |
| | | 714/763 |
| 9,190,293 B2 | 11/2015 | Wang et al. |
| 9,202,694 B2 | 12/2015 | Konevecki et al. |
| 9,230,985 B1 | 1/2016 | Wu et al. |
| 9,256,026 B2* | 2/2016 | Thacker .................. G02B 6/42 |
| 9,297,971 B2* | 3/2016 | Thacker .............. H01L 25/0652 |
| 9,348,786 B2* | 5/2016 | Gillingham ........... G06F 1/3203 |
| 9,412,752 B1 | 8/2016 | Yeh et al. |
| 9,455,268 B2 | 9/2016 | Oh et al. |
| 9,502,345 B2* | 11/2016 | Youn ...................... H01L 24/49 |
| 9,620,605 B2 | 4/2017 | Liang et al. |
| 9,633,944 B2 | 4/2017 | Kim |
| 9,748,172 B2 | 8/2017 | Takaki |
| 9,799,761 B2 | 10/2017 | Or-Bach et al. |
| 9,837,132 B2* | 12/2017 | Ware .................... G11C 29/025 |
| 9,842,651 B2 | 12/2017 | Harari |
| 9,892,800 B2 | 2/2018 | Harari |
| 9,911,497 B1 | 3/2018 | Harari |
| 9,997,232 B2* | 6/2018 | Murphy .................. G11C 7/08 |
| 10,074,667 B1 | 9/2018 | Higashi |
| 10,096,364 B2 | 10/2018 | Harari |
| 10,102,884 B2 | 10/2018 | Coteus et al. |
| 10,121,553 B2* | 11/2018 | Harari ................ H01L 29/7926 |
| 10,217,667 B2 | 2/2019 | Or-Bach et al. |
| 10,217,719 B2* | 2/2019 | Watanabe .............. H01L 24/19 |
| 10,249,370 B2 | 4/2019 | Harari |
| 10,254,968 B1 | 4/2019 | Gazit et al. |
| 10,283,452 B2 | 5/2019 | Zhu et al. |
| 10,283,493 B1 | 5/2019 | Nishida |
| 10,319,696 B1 | 6/2019 | Nakano |
| 10,373,956 B2 | 8/2019 | Gupta et al. |
| 10,381,370 B2 | 8/2019 | Shin et al. |
| 10,381,378 B1 | 8/2019 | Harari |
| 10,395,737 B2 | 8/2019 | Harari |
| 10,410,685 B2* | 9/2019 | Oh ......................... G11C 29/48 |
| 10,431,596 B2 | 10/2019 | Herner et al. |
| 10,475,812 B2 | 11/2019 | Harari |
| 10,622,377 B2 | 4/2020 | Harari et al. |
| 10,642,762 B2* | 5/2020 | Ware .................... G06F 13/4243 |
| 10,644,826 B2* | 5/2020 | Wuu ...................... H01L 24/73 |
| 10,651,153 B2 | 5/2020 | Fastow et al. |
| 10,692,837 B1 | 6/2020 | Nguyen et al. |
| 10,692,874 B2 | 6/2020 | Harari et al. |
| 10,725,099 B2* | 7/2020 | Ware .................... H03L 7/00 |
| 10,742,217 B2* | 8/2020 | Dabral ................ G06F 13/4022 |
| 10,776,046 B1 | 9/2020 | Dreier et al. |
| 10,978,427 B2* | 4/2021 | Li ....................... H01L 25/0652 |
| 11,010,316 B2* | 5/2021 | Park .................... G06F 11/3409 |
| 11,031,377 B2 | 6/2021 | Liu |
| 11,126,550 B1 | 9/2021 | Yeung et al. |
| 11,152,343 B1* | 10/2021 | Dokania ........... H01L 23/49894 |
| 11,500,803 B2 | 11/2022 | Ngo et al. |
| 11,513,729 B1 | 11/2022 | Ben-Yehuda et al. |
| 11,580,038 B2* | 2/2023 | Norman .................. G06F 12/10 |
| 2001/0030340 A1 | 10/2001 | Fujiwara |
| 2001/0053092 A1 | 12/2001 | Kosaka et al. |
| 2002/0028541 A1 | 3/2002 | Lee et al. |
| 2002/0051378 A1 | 5/2002 | Ohsawa |
| 2002/0193484 A1 | 12/2002 | Albee |
| 2004/0043755 A1 | 3/2004 | Shimooka et al. |
| 2004/0214387 A1 | 10/2004 | Madurawe et al. |
| 2004/0246807 A1 | 12/2004 | Lee |
| 2004/0262681 A1 | 12/2004 | Masuoka et al. |
| 2004/0262772 A1 | 12/2004 | Ramanathan et al. |
| 2005/0128815 A1 | 6/2005 | Ishikawa et al. |
| 2005/0280061 A1 | 12/2005 | Lee |
| 2006/0080457 A1 | 4/2006 | Hiramatsu et al. |

(56) References Cited

U.S. PATENT DOCUMENTS

| | | |
|---|---|---|
| 2006/0155921 A1 | 7/2006 | Gorobets et al. |
| 2006/0212651 A1 | 9/2006 | Ashmore |
| 2007/0192518 A1 | 8/2007 | Rupanagunta et al. |
| 2007/0236979 A1 | 10/2007 | Takashima |
| 2008/0022026 A1 | 1/2008 | Yang et al. |
| 2008/0091888 A1 | 4/2008 | Sandy |
| 2008/0239812 A1 | 10/2008 | Naofumi et al. |
| 2008/0301359 A1 | 12/2008 | Smith |
| 2009/0057722 A1 | 3/2009 | Masuoka et al. |
| 2009/0103345 A1 | 4/2009 | McLaren et al. |
| 2009/0157946 A1 | 6/2009 | Arya |
| 2009/0237996 A1 | 9/2009 | Kirsch et al. |
| 2009/0279360 A1 | 11/2009 | Peter et al. |
| 2009/0290442 A1 | 11/2009 | Rajan |
| 2009/0316487 A1 | 12/2009 | Lee et al. |
| 2010/0036960 A1 | 2/2010 | Kowalewski |
| 2010/0078790 A1 | 4/2010 | Ito et al. |
| 2010/0121994 A1 | 5/2010 | Kim et al. |
| 2010/0124116 A1 | 5/2010 | Takashi et al. |
| 2010/0128509 A1 | 5/2010 | Kim et al. |
| 2010/0219392 A1 | 9/2010 | Awaya et al. |
| 2010/0254191 A1 | 10/2010 | Son et al. |
| 2011/0044113 A1 | 2/2011 | Kim |
| 2011/0115011 A1 | 5/2011 | Masuoka et al. |
| 2011/0134705 A1 | 6/2011 | Jones et al. |
| 2011/0170266 A1 | 7/2011 | Haensh et al. |
| 2011/0208905 A1 | 8/2011 | Shaeffer et al. |
| 2011/0298013 A1 | 12/2011 | Hwang et al. |
| 2011/0310683 A1 | 12/2011 | Gorobets |
| 2012/0166682 A1 | 6/2012 | Chang et al. |
| 2012/0182801 A1 | 7/2012 | Lue |
| 2012/0243314 A1 | 9/2012 | Takashi |
| 2012/0307568 A1 | 12/2012 | Banna et al. |
| 2013/0007349 A1 | 1/2013 | D'Abreu et al. |
| 2013/0031325 A1 | 1/2013 | Nakamoto et al. |
| 2013/0256780 A1 | 10/2013 | Kai et al. |
| 2014/0015036 A1 | 1/2014 | Fursin et al. |
| 2014/0040698 A1 | 2/2014 | Loh et al. |
| 2014/0075135 A1 | 3/2014 | Choi et al. |
| 2014/0117366 A1 | 5/2014 | Saitoh |
| 2014/0151774 A1 | 6/2014 | Rhie |
| 2014/0173017 A1 | 6/2014 | Takagi et al. |
| 2014/0229131 A1 | 8/2014 | Cohen et al. |
| 2014/0247674 A1 | 9/2014 | Karda et al. |
| 2014/0328128 A1 | 11/2014 | Louie et al. |
| 2014/0340952 A1 | 11/2014 | Ramaswamy et al. |
| 2015/0098272 A1 | 4/2015 | Kasolra et al. |
| 2015/0113214 A1 | 4/2015 | Sutardja |
| 2015/0155876 A1 | 6/2015 | Jayasena et al. |
| 2015/0194440 A1 | 7/2015 | Noh et al. |
| 2015/0220463 A1 | 8/2015 | Fluman et al. |
| 2015/0249143 A1 | 9/2015 | Sano |
| 2015/0263005 A1 | 9/2015 | Zhao et al. |
| 2015/0279431 A1 | 10/2015 | Li et al. |
| 2015/0347331 A1 | 12/2015 | Park et al. |
| 2015/0372099 A1 | 12/2015 | Chen et al. |
| 2016/0013156 A1 | 1/2016 | Zhai et al. |
| 2016/0019951 A1 | 1/2016 | Park et al. |
| 2016/0035711 A1 | 2/2016 | Hu |
| 2016/0079164 A1 | 3/2016 | Fukuzumi et al. |
| 2016/0086970 A1 | 3/2016 | Peng |
| 2016/0225860 A1 | 8/2016 | Karda et al. |
| 2016/0248631 A1 | 8/2016 | Duchesneau |
| 2016/0300724 A1 | 10/2016 | Levy et al. |
| 2016/0314042 A1 | 10/2016 | Plants |
| 2016/0321002 A1 | 11/2016 | Jung et al. |
| 2017/0092370 A1 | 3/2017 | Harari |
| 2017/0092371 A1 | 3/2017 | Harari |
| 2017/0148517 A1 | 5/2017 | Harari |
| 2017/0148810 A1 | 5/2017 | Kai et al. |
| 2017/0213821 A1 | 7/2017 | Or-Bach et al. |
| 2017/0358594 A1 | 12/2017 | Lu et al. |
| 2018/0033960 A1 | 2/2018 | Jameson et al. |
| 2018/0095127 A1 | 4/2018 | Pappu et al. |
| 2018/0108416 A1 | 4/2018 | Harari |
| 2018/0211696 A1 | 7/2018 | Kim et al. |
| 2018/0261575 A1 | 9/2018 | Tagami et al. |
| 2018/0269229 A1 | 9/2018 | Or-Bach et al. |
| 2018/0285252 A1* | 10/2018 | Kwon ................ G06F 12/0848 |
| 2018/0331042 A1 | 11/2018 | Manusharow et al. |
| 2018/0357165 A1 | 12/2018 | Helmick et al. |
| 2018/0366471 A1 | 12/2018 | Harari et al. |
| 2018/0366485 A1 | 12/2018 | Harari |
| 2018/0366489 A1 | 12/2018 | Harari et al. |
| 2019/0006009 A1 | 1/2019 | Harari |
| 2019/0019564 A1 | 1/2019 | Li et al. |
| 2019/0028387 A1 | 1/2019 | Gray |
| 2019/0043836 A1 | 2/2019 | Fastow et al. |
| 2019/0067327 A1 | 2/2019 | Herner et al. |
| 2019/0121699 A1 | 4/2019 | Cohen et al. |
| 2019/0130946 A1 | 5/2019 | Sim et al. |
| 2019/0148286 A1 | 5/2019 | Or-Bach et al. |
| 2019/0157296 A1 | 5/2019 | Harari et al. |
| 2019/0171391 A1 | 6/2019 | Dubeyko et al. |
| 2019/0171575 A1 | 6/2019 | Chen et al. |
| 2019/0180821 A1 | 6/2019 | Harari |
| 2019/0205273 A1 | 7/2019 | Kavalieros et al. |
| 2019/0206890 A1 | 7/2019 | Harari et al. |
| 2019/0214077 A1 | 7/2019 | Oh et al. |
| 2019/0238134 A1 | 8/2019 | Lee et al. |
| 2019/0244971 A1 | 8/2019 | Harari |
| 2019/0259769 A1 | 8/2019 | Karda et al. |
| 2019/0303042 A1 | 10/2019 | Kim et al. |
| 2019/0318775 A1 | 10/2019 | Rakshit et al. |
| 2019/0325945 A1 | 10/2019 | Linus |
| 2019/0325964 A1 | 10/2019 | Harari |
| 2019/0332321 A1 | 10/2019 | Chen |
| 2019/0319044 A1 | 11/2019 | Harari |
| 2019/0348424 A1 | 11/2019 | Karda et al. |
| 2019/0355672 A1 | 11/2019 | Fujita et al. |
| 2019/0355747 A1 | 11/2019 | Herner et al. |
| 2019/0370005 A1 | 12/2019 | Moloney et al. |
| 2019/0370117 A1 | 12/2019 | Fruchtman et al. |
| 2019/0384884 A1 | 12/2019 | Thuries et al. |
| 2020/0006306 A1 | 1/2020 | Li |
| 2020/0051990 A1 | 2/2020 | Harari et al. |
| 2020/0098738 A1 | 3/2020 | Herner et al. |
| 2020/0098779 A1 | 3/2020 | Cernea et al. |
| 2020/0176468 A1 | 6/2020 | Herner et al. |
| 2020/0194416 A1 | 6/2020 | Or-Bach et al. |
| 2020/0201718 A1 | 6/2020 | Richter et al. |
| 2020/0227123 A1 | 7/2020 | Salahuddin et al. |
| 2020/0243486 A1* | 7/2020 | Quader ................ H01L 25/0657 |
| 2020/0258897 A1 | 8/2020 | Yan et al. |
| 2020/0326889 A1 | 10/2020 | Norman et al. |
| 2020/0341838 A1 | 10/2020 | Hollis |
| 2020/0395328 A1 | 12/2020 | Fastow et al. |
| 2021/0034482 A1 | 2/2021 | Deguchi et al. |
| 2021/0216243 A1 | 7/2021 | Shin et al. |
| 2021/0247910 A1 | 8/2021 | Kim et al. |
| 2021/0248094 A1 | 8/2021 | Norman et al. |
| 2021/0265308 A1 | 8/2021 | Norman et al. |
| 2021/0294739 A1 | 9/2021 | Oh et al. |
| 2021/0374066 A1 | 12/2021 | Shah et al. |
| 2022/0043596 A1 | 2/2022 | Madraswala et al. |

FOREIGN PATENT DOCUMENTS

| | | |
|---|---|---|
| EP | 3916784 A1 | 12/2021 |
| JP | 2010108522 A1 | 5/2010 |
| JP | 2011028540 A1 | 2/2011 |
| KR | 20120085591 A1 | 8/2012 |
| WO | 2018039654 A1 | 3/2018 |
| WO | 2018236937 A1 | 12/2018 |

OTHER PUBLICATIONS

"European Search Report, EP 16852238.1", Mar. 28, 2019.
"European Search Report, EP17844550.8", Aug. 12, 2020, 11 pages.
"Invitation to Pay Additional Fees (PCT/ISA/206), PCT/US2020/015710", Mar. 20, 2020, 2 pages.

(56) References Cited

OTHER PUBLICATIONS

"Notification of Reasons for Refusal, Japanese Patent Application 2018-527740", (English translation), Nov. 4, 2020, 8 pages.
"Partial European Search Report EP 16869049.3", Jul. 1, 2019, pp. 1-12.
"Partial Search Report, European Patent Application No. 20748610. 1", Sep. 29, 2022, 13 pages.
"PCT Search Report and Written Opinion, PCT/US2018/038373", Sep. 10, 2018.
"PCT Search Report and Written Opinion, PCT/US2019/014319", Apr. 15, 2019.
"PCT Search Report and Written Opinion, PCT/US2019/052164", Feb. 27, 2020.
"PCT Search Report and Written Opinion, PCT/US2019/052446", Dec. 11, 2019.
"PCT Search Report and Written Opinion, PCT/US2020/015710", Jun. 9, 2020.
"PCT Search Report and Written Opinion, PCT/US2020/017494", Jul. 20, 2020, 13 pages.
"PCT Search Report and Written Opinion, PCT/US2020/065374", Mar. 15, 2021, 17 pages.
"PCT Search Report and Written Opinion, PCT/US2021/016964", Jun. 15, 2021, 19 pages.
"PCT Search Report and Written Opinion, PCT/US2022/15497", Jul. 11, 2022, 20 pages.
Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.
Kim, N., et al., "Multi-layered Vertical gate NANO Flash Overcoming Stacking Limit for Terabit Density Storage", Symposium on VLSI Tech. Dig. of Technical Papers, 2009, pp. 188-189.
Lue, H.T., et al., "A Highly Scalable 8-Layer 3D Vertical-gate {VG} TFT NANO Flash Using Junction-Free Buried Channel BE-SONOS Device", Symposium on VLSI: Tech. Dig. of Technical Papers, 2010, pp. 131-132.
Tanaka, T., et al., "A 768 GB 3b/cell 3D-Floaling-Gate NANO Flash Memory", Digest of Technical Papers, the 2016 EEE International Solid-Slate Circuits Conference, 2016, pp. 142-144.
Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.

\* cited by examiner

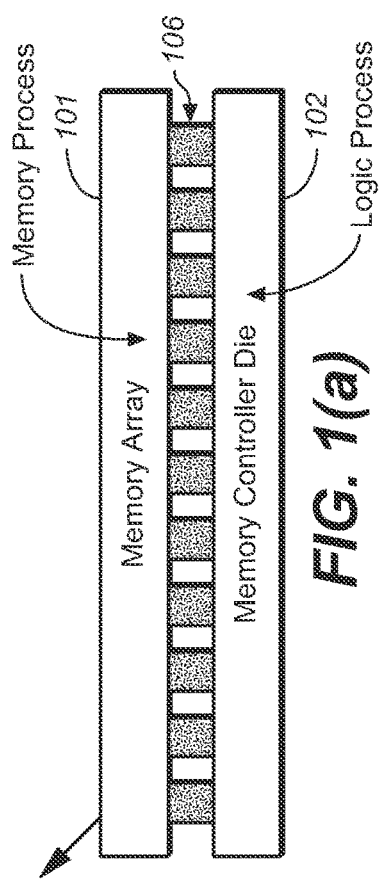
*FIG. 1(a)*
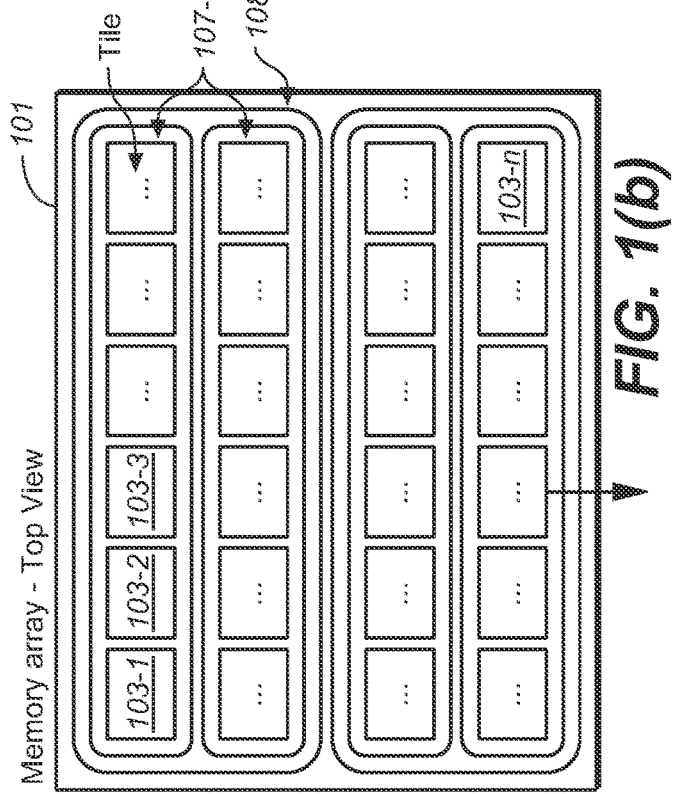
*FIG. 1(b)*
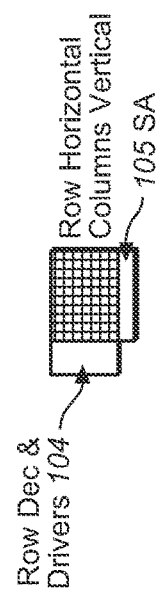
*FIG. 1(c)(i)*
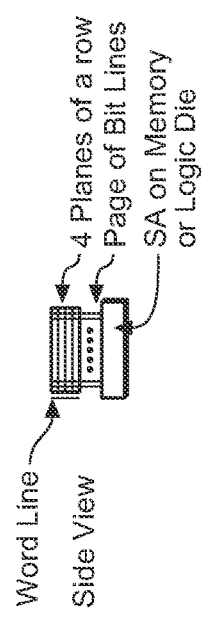
*FIG. 1(c)(ii)*

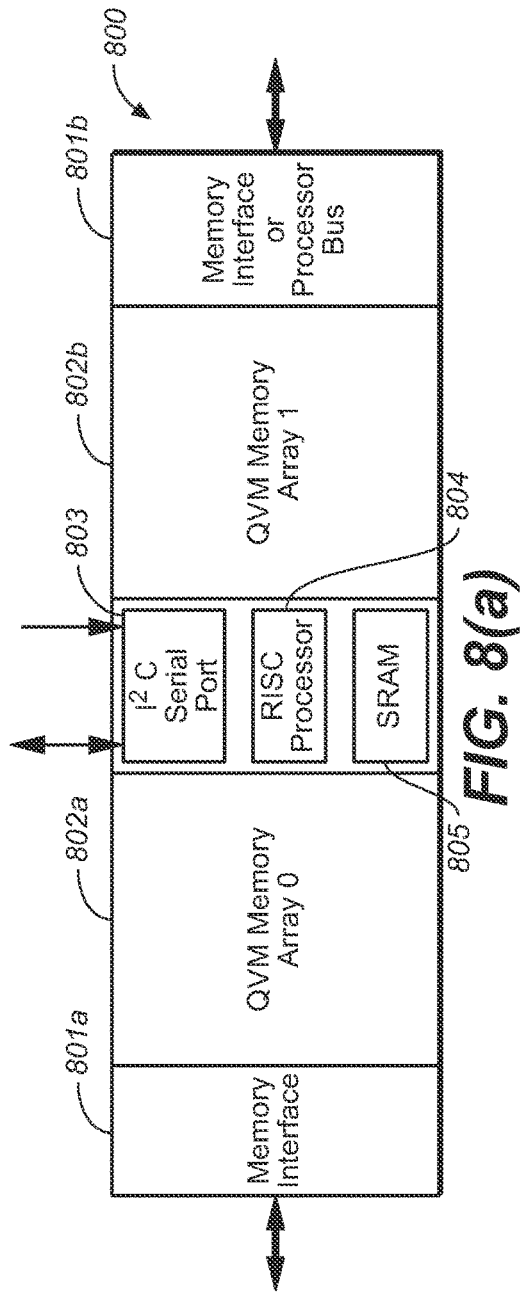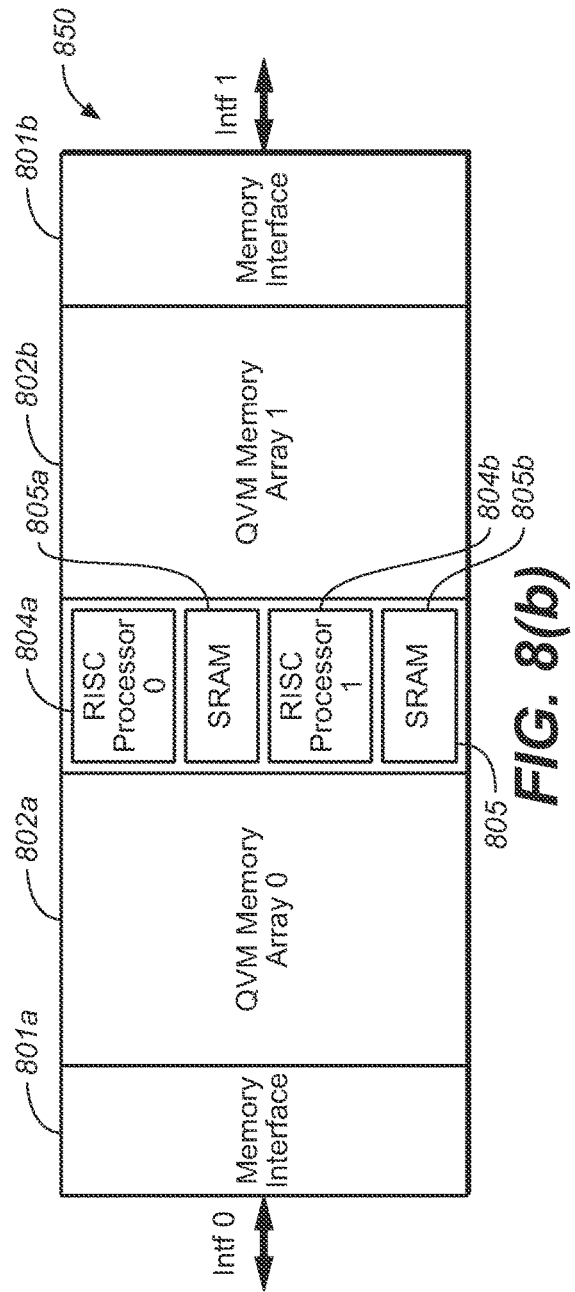
FIG. 8(a)
FIG. 8(b)

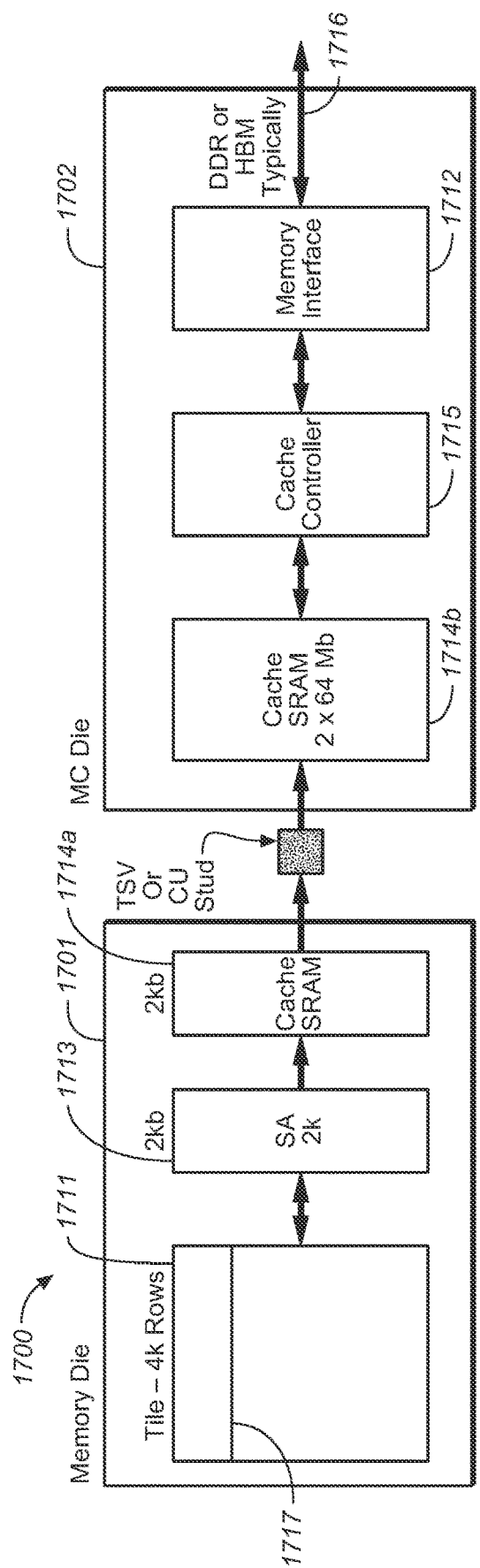
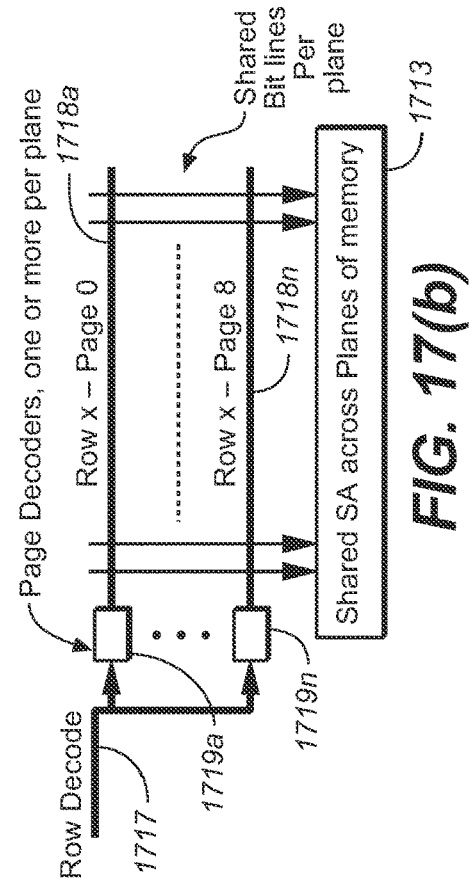
FIG. 17(a)
FIG. 17(b)

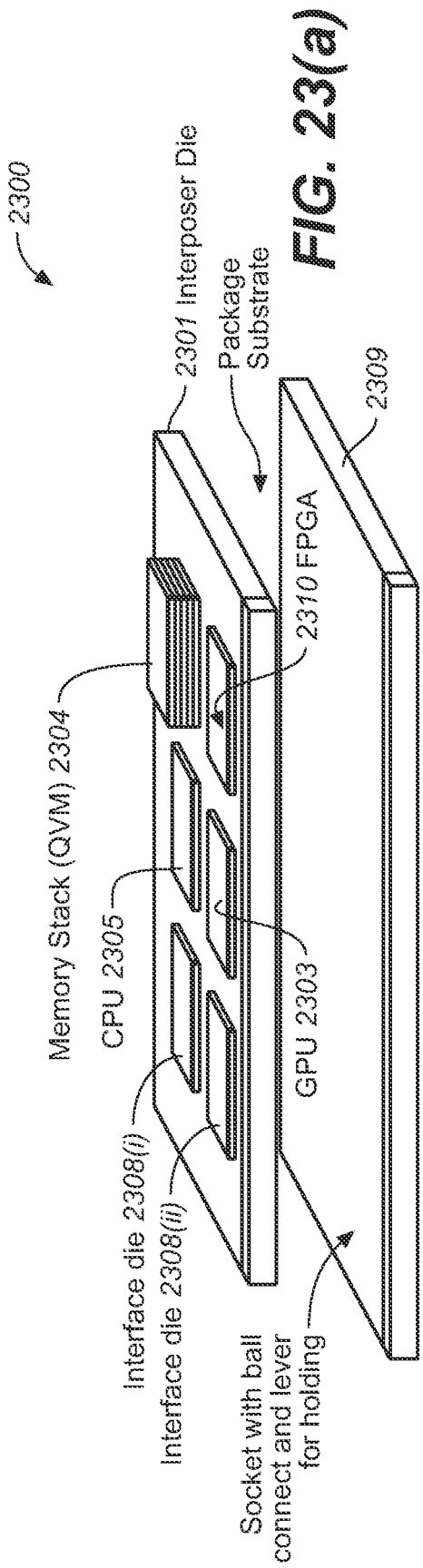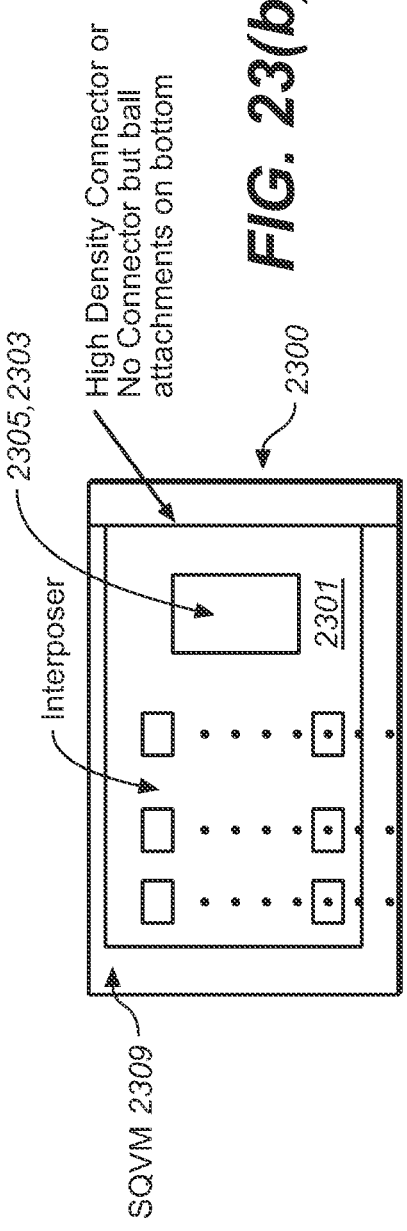
FIG. 23(a)
FIG. 23(b)

QUASI-VOLATILE SYSTEM-LEVEL MEMORY

CROSS-REFERENCE TO RELATED APPLICATIONS

The present application is a continuation application of U.S. patent application ("Parent Application"), Ser. No. 17/169,212, entitled "QUASI-VOLATILE SYSTEM-LEVEL MEMORY," filed on Feb. 5, 2021, which is related to and claims priority of: (i) U.S. provisional patent application ("Provisional Application I"), Ser. No. 62/971,859, entitled "Quasi-volatile Memory System," filed on Feb. 7, 2020; and (ii) U.S. provisional patent application ("Provisional Application II"), Ser. No. 62/980,596, entitled "Quasi-volatile Memory System-Level Memory," filed on Feb. 24, 2020; (iii) U.S. provisional patent application ("Provisional Application III"), Ser. No. 63/027,850, entitled "Quasi-volatile Memory System-Level Memory," filed on May 20, 2020. The present application is also related to (i) U.S. provisional patent application ("Provisional Application IV), Ser. No. 62/971,720, entitled "High-Capacity Memory Circuit with Low Effective Latency," filed on Feb. 7, 2020; and (ii) U.S. provisional patent application ("Provisional Application V), Ser. No. 62/980,571, entitled "Channel Controller For Shared Memory Access," filed on Feb. 24, 2020. The Parent Application and Provisional Applications I-V (collectively, the "Provisional Applications") are hereby incorporated by reference in their entireties.

BACKGROUND OF THE INVENTION

1. Field of the Invention

The present invention relates to semiconductor memories and their usage and technology. More specifically, the present invention relates to system capabilities associated with semiconductor memory integrated circuits, modules incorporating semiconductor memory integrated circuits, exemplary structures and their usage.

2. Discussion of the Related Art

Conventional memory systems of different technology and architecture types are known. For example, a memory system may be built with components that are selected based on the requirements and the memory access patterns of a host computer, a telecommunication device, or another hardware and software (hereinafter, such a memory-accessing device is referred to as the "host," "host processor," or "host system"). In a conventional host system, a memory system may include different memory types, such as random-access memory (RAM), flash memory, read-only memory (ROM), and other suitable types of memory devices.

In the prior art, a RAM is typically a volatile memory device that stores the host's most frequently accessed data. A volatile memory loses its data when power is interrupted. Examples of RAMs include static RAM ("SRAM") and dynamic RAM ("DRAM"). A typical SRAM circuit is a single-bit flip-flop formed by cross-coupled transistors. A typical DRAM circuit includes an access transistor and a storage capacitor. To compensate for charge leakage from the capacitor, the DRAM circuit requires frequent refreshes to retain the stored data. Because a typical DRAM circuit has fewer components than a typical SRAM circuit, the DRAM circuit can achieve a higher data density than SRAM circuit; however, the typical SRAM circuit is faster and does not require refreshing.

Because of their cost and density advantages, DRAMs have been the dominate technology to service host systems, many of which are often referred to as "central processing units" ("CPUs"). As used herein, the term "CPU" refers to any logic circuit that manages and accesses a memory system, and thus includes such device as a graphics processing unit ("GPU"). Recently, DRAMs are seen to be reaching their limits, as it has become increasingly difficult for circuit density improvement (e.g., by reducing the physical dimensions of the storage capacitor). As the DRAM capacitor decreases in size, higher refresh rates are required, which increase power consumption. One impediment to changing refresh rates is the industry standards (e.g., the DDR standards promulgated by JEDEC) that compliant host systems must follow. Also, a higher refresh rate decreases the fraction of time available for memory access by the host, thereby adversely impacting performance. One approach for maintaining the conventional refresh rate is to refresh more units of memory in each refresh cycle, at the expense of power and heat dissipation. These conditions limit the current growth rate of DRAM density.

Thus, a long-felt need exists for a different memory type without the conventional power and density limitations. A novel type of memory—referred to as "quasi-volatile memory" ("QV memory")—is believed to have an effective performance rivalling DRAMs while having a much higher density. The QV memory is disclosed, for example, in U.S. Pat. No. 10,121,553 ("the Harari Patent"), entitled "Capacitive-coupled Non-volatile Thin-film Transistor NOR Strings in Three-Dimensional Arrays," issued on Nov. 16, 2018. The Harari patent is incorporated herein by reference in its entirety. Like those of a non-volatile memory (NVM), the memory cells of a QV memory each store a data bit as an electric charge in a charge storage material (e.g., ONO). In one instance, a high-capacity QV memory is implemented by 3-dimensional arrays of NOR-type memory strings formed over a semiconductor substrate. Because of the nature of its charge-storage layer, a typical QV memory cell has a much longer data retention time than a DRAM cell and, hence, requires a lower refresh rate than the DRAM cell. For example, a typical DRAM system is designed to be refreshed every 64 milliseconds microseconds; a QV memory with a comparable effective access performance, however, may be refreshed every 10 minutes. The reduced refresh rate provides the QV memory great advantages in a lower power requirement, a reduced heat dissipation, and a higher memory availability. The memory availability delivers a better host performance.

While a write operation in both an NVM and an QV memory requires a preceding erase step, the QV memory completes the task in a much shorter time (e.g., in the order of a tenth of a microsecond). Also, because the NVM typically carries out the erase operation simultaneously over a large block of memory cells, the erase operation typically requires management by a complex controller. Furthermore, because of its low wear-out, resulting from its generally lower-voltage operations, a typical QV memory cell has much higher endurance (e.g., $10^{12}$ erase-program cycles) than a typical NVM cell (e.g., $10^4$ erase-program cycles).

SUMMARY

According to one embodiment of the present invention, a memory device includes: (a) multiple quasi-volatile (QV)

memory circuits each formed on a separate semiconductor substrate and interconnected with each other by through-silicon vias (TSVs) formed in the semiconductor substrates; and (b) a memory controller circuit also formed on a semiconductor substrate separate from the semiconductor substrates of the QV memory circuits, wherein the memory controller circuit is interconnected to one of the QV memory circuits through hybrid bonds and wherein the memory controller circuit operates the QV memory circuits as one or more QV memories. The memory device may be used to form larger memory devices, such a PCB memory module, a dual-in-line memory module (DIMM), or any memory module enabled by wafer-scale stacking techniques.

In one embodiment, each QV quasi-volatile memory circuit may be formed out of modular memory circuits ("tiles") arranged as a 2-dimensional array (e.g., in rows and columns) on the semiconductor substrate on which the QV memory circuit is formed. Each QV memory circuit may be logically or physically organized as memory banks and memory bank groups. The memory controller circuit can also be modularized to allow modularized control circuits to be hybrid-bonded to their associated tiles to attain modularized control and memory functions.

The QV memory circuits may be stacked one on top of another to achieve a uniform footprint but are not required to be identical. For example, some QV memory circuits may have more layers of memory cells than others. The QV memory circuits may also have different operational capabilities.

According to one embodiment of the present invention, the QV memory implemented in the QV memory circuits may be organized in one or more non-overlapping partitions. The memory controller circuit may provide multiple memory controllers each tasked with control operations of an assigned group of partitions. Each group of partition may be accessed by a host processor over a memory channel through a memory interface.

The QV memory circuits of the present invention may execute in-memory computational commands, as the memory controller circuit may include computational elements, such as one or more arithmetic-logic units or processors (e.g., RISC processors). In addition, intra-memory copy operations, direct memory access (DMA) operations, and search operations can be executed by the computational elements without host intervention.

The SRAM circuits may be used for various application of data buffering, as program stores for the computation elements, and as cache memory for the QV memory circuits. Suitably tailoring the data units used in QV memory transactions and the data units of cache line transactions with the host processor, together with suitable data prefetching policies, the QV memory of the present invention achieves an effective performance close to that of the SRAM circuits. Various memory read and write back policies may be implemented to match the requirements of the QV memory's intended applications.

According to one embodiment of the present invention, a QV memory system ("QV DIMM") may be built using a dual-in-line memory module (DIMM) format. The QV DIMM may be built out of the aforementioned QV memory devices, a memory interface and a DIMM processor circuit that controls the operations in the memory devices and the memory interface circuit. The QV DIMM may support multiple memory channels. In addition, the in-memory computation and operational capabilities (e.g., intra-memory copy and search operations) may be carried out at the DIMM level. Furthermore, these capabilities may be extended to even higher levels by enabling the DIMM processor circuits to carry out these operations across QV DIMMs.

The present invention is better understood upon consideration of the detailed description below in conjunction with the accompanying drawings.

BRIEF DESCRIPTION OF THE DRAWINGS

FIGS. 1(a), 1(b), 1(c)(i) and 1(c)(ii) show multi-die QV memory module 100 including memory die 101 and controller die 102; numerous memory arrays organized as tiles are formed on memory die 101, and a memory controller 102 for the memory arrays of memory die 101 is formed on the memory die.

FIG. 8(a) is a block diagram for controller die 800 in a QV memory module, including RISC processor 804 and SRAM 805, in accordance with one embodiment of the present invention.

FIG. 8(b) is a block diagram for controller die 850 in a QV memory module, including RISC processors 804a and 804b, serviced by SRAMs 805a and 805b, respectively, in accordance with one embodiment of the present invention.

FIG. 14(*b*) shows computer system 1450, including processors 1410*a*-140*d* coupled to memory channels 1405*a*-1405*d* of QV DIMM 1400, respectively, in accordance with one embodiment of the present invention.

FIGS. 17(*a*) and 17(*b*) provide a functional view of a read path from tile 1711 in memory die 1701 to memory interface 1712 of controller die 1702 in QV memory module 1700, according to one embodiment of the present invention.

FIG. 20(*b*) shows system 1970 in which data buffer 1905 is partitioned into SRAM blocks 1905(*i*), . . . , 1905(*n*), each the size of a memory block of QV memory 1901, such that each SRAM block in data buffer 1905 caches a memory block in the corresponding bank of QV memory 1901, according to one embodiment of the present invention.

FIG. 20(*c*) shows system 1990 in which SRAM data buffer 1905 is separately addressed from QV memory 1901, in accordance with one embodiment of the present invention.

FIGS. 23(*a*) and 23(*b*) are, respectively, exemplary side and top views of implementations of ball-grid array socket-based system 2300, including interposer device 2301, according to one embodiment of the present invention.

Although the previous drawings depict various examples of the invention, the invention is not limited by the depicted examples. In these drawings, like reference numerals designate like structural elements. Also, the depictions in the drawings are not necessarily to scale.

DETAILED DESCRIPTION OF THE PREFERRED EMBODIMENTS

Figure 2:
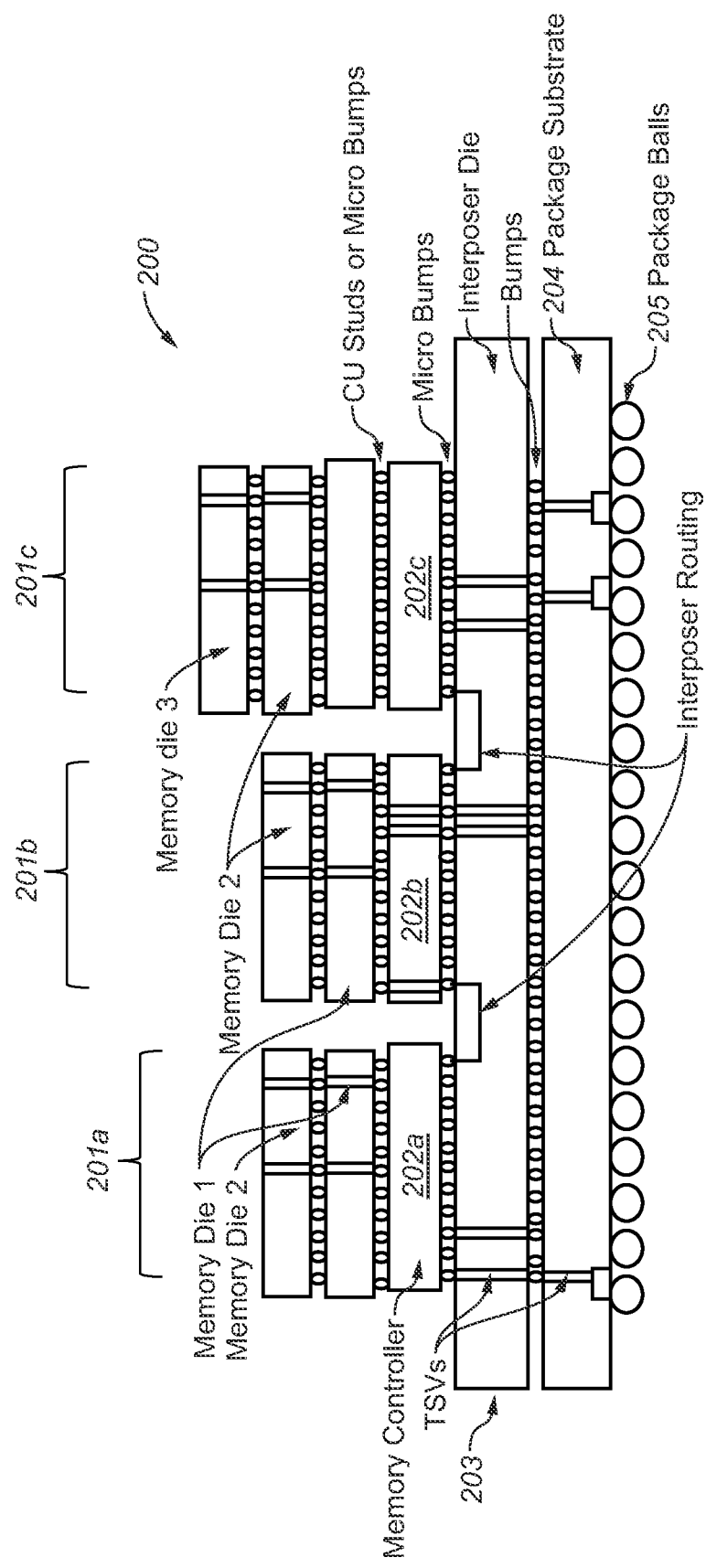
FIG. 2 shows QV memory module 200, which includes in one package multiple QV memory modules 201a, 201b and 201c, and interposer die 203, according to one embodiment of the present invention.

In this detailed description, various embodiments or examples of the present invention may be implemented in numerous ways, including as a system, a process, an apparatus, or a series of program instructions on a computer-readable medium (e.g., a computer-readable storage medium or a computer network where the program instructions are sent over optical, electronic, or wireless communication links).

The present invention is applicable, for example, in a system that integrates a QV memory die with a logic die (e.g., using hybrid bonding), which enables new capabilities brought about by incorporating system-level features in the system architecture. Some of these capabilities are disclosed, for example, in co-pending patent application ("the Khandker Application"), Ser. No. 16/776,279, entitled "Device with Embedded High-Bandwidth, High-Capacity Memory using Wafer Bonding," filed on Jan. 29, 2020. In particular, the QV memory may be used in memory-centric computing applications that are unavailable in current DRAM-based system architectures. The Khandker Application is hereby incorporated by reference in its entirety.

As disclosed in the Khandker Application, a QV memory circuit may be built in a multi-die manner with at least one die with a memory array ("memory die") and one die with a memory controller ("controller die"), such as illustrated in FIGS. 1(*a*)-1(*c*). As shown in FIG. 1(*a*), multi-die QV memory module 100 includes memory die 101 and controller die 102 interconnected by copper interconnect conductors ("hybrid bonds" or "studs") 106. The large number of hybrid bonds provide a high-bandwidth data interface. On memory die 101, as shown in FIG. 1(*b*) numerous memory arrays are organized as a 2-dimensional array of "tiles" 103-1 to 103-*n* (i.e., the tiles are arranged in rows and columns). As shown in FIG. 1(*c*)(*i*), each tile may also include row decoders and drivers 104, which activate word lines, each word line accessing a row of the memory cells within the tile. In one embodiment, as illustrated in FIG. 1(*c*)(*i*), within each tile are multiple columns of memory cells in multiple planes. The column decoders activate bit lines, with each bit line selecting a column of memory cells as well as a plane, such that, together with an activated word line, a memory cell is selected. In one embodiment, the memory cells within the planes in each column of memory cells share the same group of sense amplifiers within sense amplifiers 105. In one embodiment, the memory cells in the selected row form a "page" of memory cells that are sensed simultaneously and output by selecting the bit lines successively in a suitable group size (e.g., 8 bits ("byte") at a time). FIG. 1(*c*)(*ii*) shows that the bits of an activated page are output to controller die 102 through studs 106. Any suitable page size (e.g., 1,024 or 2,048 bits) may be used.

On controller die 102, a memory controller for accessing the memory arrays of memory die 101 is formed. Memory controller die 102 may also include one or more external interfaces, such as memory interfaces for host access and other system functions, in addition to conventional memory controller functions. Alternatively, the memory control functions may be divided between memory die 101 and controller die 102 (e.g., some controller circuitry may be implemented on memory die 101). In that regard, the Khandker Application discloses building a memory die using a process optimized for memory circuits and building a controller die—referred to in the Khandker Application as a "companion chip"—using an advanced manufacturing process that is optimized for forming low-voltage and faster logic circuits. The companion die provides significant improvement over conventional circuitry that supports access to the memory arrays.

In one embodiment, an 8-layer (i.e., 8-plane) memory array provides 8 pages of data with each activated row. If the number of layers is increased to 16, 16 pages of data are provided with each activated row without affecting the tile's footprint. With 4 planes and a 1024-bit page, each row in a tile has 4,096 bits. Of course, the number of rows in a tile may be adjusted for a greater or a lesser capacity to trade-off for a longer or a shorter access time, in accordance with the intended applications.

As shown in FIG. 1(*b*), the tiles in memory die 102 are organized in a 2-dimensional array (i.e., rows and columns of tiles). In that configuration, each row of tiles (a "tile row") form an operating unit, which is referred to as a "bank." A group of banks, in turn, form a "bank group." For example, FIG. 1(*b*) shows banks 107-1 and 107-2 forming bank group 108. In that configuration, the banks within a bank group may share data input and output buses in a multiplexed manner. The tile is a building block that allows flexibility in configuring the system to adapt to application requirements. The tile-based design naturally results in a modular organization of hybrid bonds to controller die 102, which leads to modularization of controller circuitry also. For example, the controller may adopt a design that is based on banks and bank groups to allow for simultaneous access to a large amount of data. Many variations of such a control scheme may be achieved by configuring data routing and control in the controller logic circuitry.

In addition, multiple memory dies may be stacked atop one upon another and interconnected for data routing among the memory dies by, for example, through-silicon vias ("TSVs"). The stacked memory dies require maintaining an internal regular topological and control structure. For example, the memory arrays in each memory die in the stack may be controlled according to an assign-and-select methodology discussed below. Such an organization readily lends to a design that allows each memory die in the stack to have full access to the high bandwidth hybrid bond interface to the controller die. In addition, a customizable design allows many variations to adapt to various application needs; such variations may be realized by suitably configuring the controller logic circuitry in the controller die. The resulting memory system has a high memory capacity accessible by a high bandwidth memory interface.

The QV memory module—which integrates at least one memory die and at least one controller die—results in faster memory controller operations and, thus, faster memory performance. In addition, as the memory die or dies and the controller die or dies may be separately fabricated under their respective specialized manufacturing processes, the QV memory module enables the high-capacity memory arrays of the memory dies to be accessible at a high bandwidth from high-density logic circuits in the controller die, leading to new capabilities not previously achievable in conventional memory circuits. By integrating memory and controller dies that are each configured and optimized for specific memory operations, the QV memory module may achieve reduced die size in each memory or controller die.

The dies may be integrated using one or more integration techniques, including, for example, hybrid bonds, TSVs, exposed contacts and other suitable techniques for a very high interconnection density. The resulting advantage is especially significant when multiple memory dies are stacked to provide a high memory capacity, while sharing a memory controller among the multiple memory dies achieves a reduced cost-per-unit.

FIG. 2 shows QV memory module 200, which integrates in one package multiple QV memory modules 201*a*, 201*b* and 201*c*, and interposer die 203, according to one embodiment of the present invention. As shown in FIG. 2, QV memory modules 201*a* and 201*b* each include two stacked memory dies, and QV memory module 201*c* includes three stacked memory dies; a memory die in QV memory modules 201*a*-201*c*, for example, may receive on one side of the memory die signals over micro-bumps or hybrid bonds from another stacked memory die. These received signals may be routed by conductors formed on that surface of the memory die to TSVs, which route those signals to conductors on the opposite surface of the memory die. QV memory modules 201*a*-201*c* are controlled from their respective controller dies 202*a*-202*c*. Routing of signals among QV memory modules 201*a*-201*c* is accomplished through conductors formed on interposer substrate 203 (e.g., a silicon die). QV memory module 200 may be encapsulated in a conventional package. In FIG. 2, data and control signals for QV memory module 200 to and from external circuitry may be routed, for example, through solder balls connections 205 attached to package substrate 204 (e.g., a printed circuit board (PCB)) and by solder bumps with each of QV memory modules 201*a*-201*c*. The memory dies in each of QV memory module 201*a*-201*c* may be stacked atop a single memory controller, each memory die providing substantially the same set of signals to the memory controller. The signals from each memory die may be routed to the controller die through TSVs in intervening memory dies, if necessary. In this manner, the memory dies formed an integrated memory system, with signals received into each memory die gated by a select line. Power savings may be achieved by deactivating any memory die.

In addition to stacking memory dies, a QV memory module may also include dies with other functionalities, with their signals routed in like manner. Consequently, the memory arrays in a QV memory module may be used to support the added functions in these non-memory dies. Thus, small devices (e.g., mobile phones and other portable devices) may be incorporated in a QV memory module as a very dense package. Furthermore, this approach allows the functional circuitry in these small devices to directly connect to the memory dies through high-bandwidth connections (e.g., hybrid bonds), thereby attaining both high performance and low power dissipation without bottlenecks (e.g., conventional memory buses and off-chip input and output drivers).

If a controller die is fabricated using an advanced manufacturing process, the memory controller may only require a small silicon area, relative to the footprint of its associated high-capacity memory die. Preferably, the memory dies and the controller have substantially the same silicon areas, so that signaling can be achieved over short conductors, which avoids interconnection delays. The controller die, therefore, has silicon area that can be occupied by other logic circuits, if desired.

The memory interface provides an external device (e.g., a host processor) access to a QV memory module. In a conventional memory system, access is provided by a typically industry-standard memory interface (e.g. double data rate (DDR) or a high-bandwidth memory (HBM) interface). The conventional memory interface is controlled by the memory controller, regardless of memory capacity, as the memory controller manages all appropriate signals required by the memory system's internal organization. The memory interface of a QV memory module may also be implemented using this conventional approach. For example, the QV memory module can be packaged with a memory interface that conforms to an industry-standard dual-in-line memory module (DIMM). In one embodiment, an external interface is connected to the memory arrays of each memory die substantially identically. In that configuration, buffers for the input and output data of each memory die may be provided in the controller die, such as in the logic circuitry of an external interface. Such an approach maintains compatibility with existing system designs and provides routing efficiency within the QV memory module, as signals routing and protocols between the memory controller and each memory die may be made modular and substantially identical from memory die to memory die. Alternatively, when the memory controller connects to each memory die independently, timing variations from memory die to memory die due to different routing paths with different signal delays are possible, resulting in degraded window sampling, higher error rates, additional line drivers, board space and power dissipation.

Figure 3:
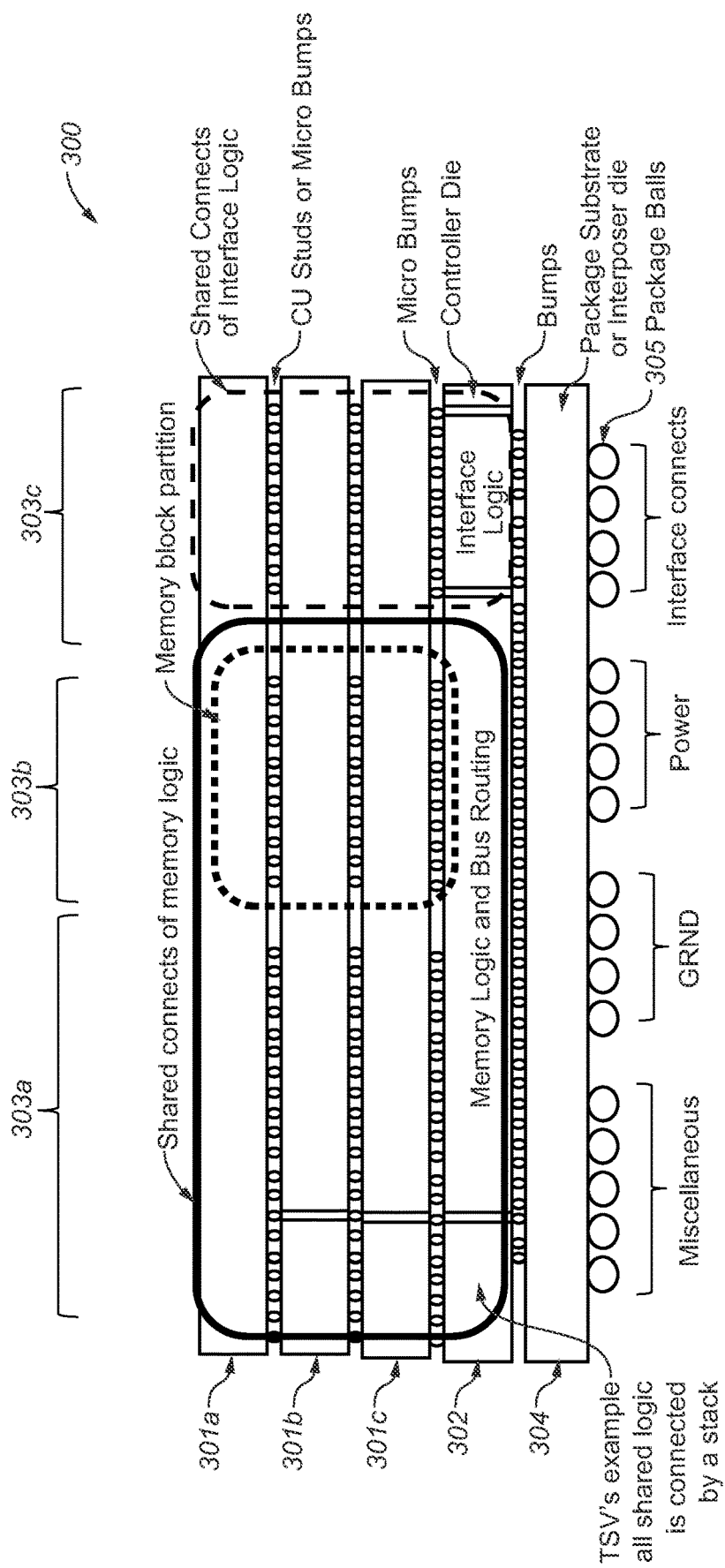
FIG. 3 shows QV memory module 300 including memory dies 301a-301c and controller die 302, organized into signal groups 303a-303c, accordance to one embodiment of the present invention.

FIG. 3 shows QV memory module 300 including memory dies 301a-301c and controller die 302, organized into memory channels or signal groups 303a-303c, accordance to one embodiment of the present invention. As shown in FIG. 3, each signal group is supported by its circuitry in memory dies 301a-301c, controlled by corresponding circuitry in controller die 302. For example, for each of signal groups 303a and 303b, the circuitry for the signal group on each memory die shares the corresponding circuitry in controller die 302. A combination of hybrid bonds and TSVs route signals exchanged between controller 302 and each memory die. Under this arrangement, for example, each signal group may provide its refresh signals independently to service its memory arrays, without requiring synchronization between signal groups. In each signal group, the signals to and from each memory die are routed directly to an external interface formed on controller die 302. Signals over the external interface are routed through s package substrate (e.g., a PCB) where the signals are provided to external connections over solder balls 305. (Alternatively, an interposer substrate (not shown) may be provided for connection to additional QV memory modules or other integrated circuits.) As shown in FIG. 3, the external connections typically encompass power and ground pins, interface control and data signals, and any other suitable signals.

In one embodiment, a high-capacity memory system may have two or more external interfaces, each independently servicing at least one memory channel or internal signal group. In a high-capacity memory system, the memory circuit may be partitioned into two separate memory channels, so that a QV memory module implemented by one stack of memory dies may be seen logically, for example, as a QV memory module with two stacks of memory dies. This dual-access capability facilitates more efficient access to the two memory channels through independently controlled ports. For a QV memory module with 128-Gb or 256-Gb memory dies—which is likely to be contemporary with 32 Gb DRAMs—having dual interfaces is advantageous. (A Gb is $2^{30}$ bits of data; a GB is $2^{33}$ bits of data.) Even larger number of channels may be suitable for memory dies with even greater capacity.

Figure 4:
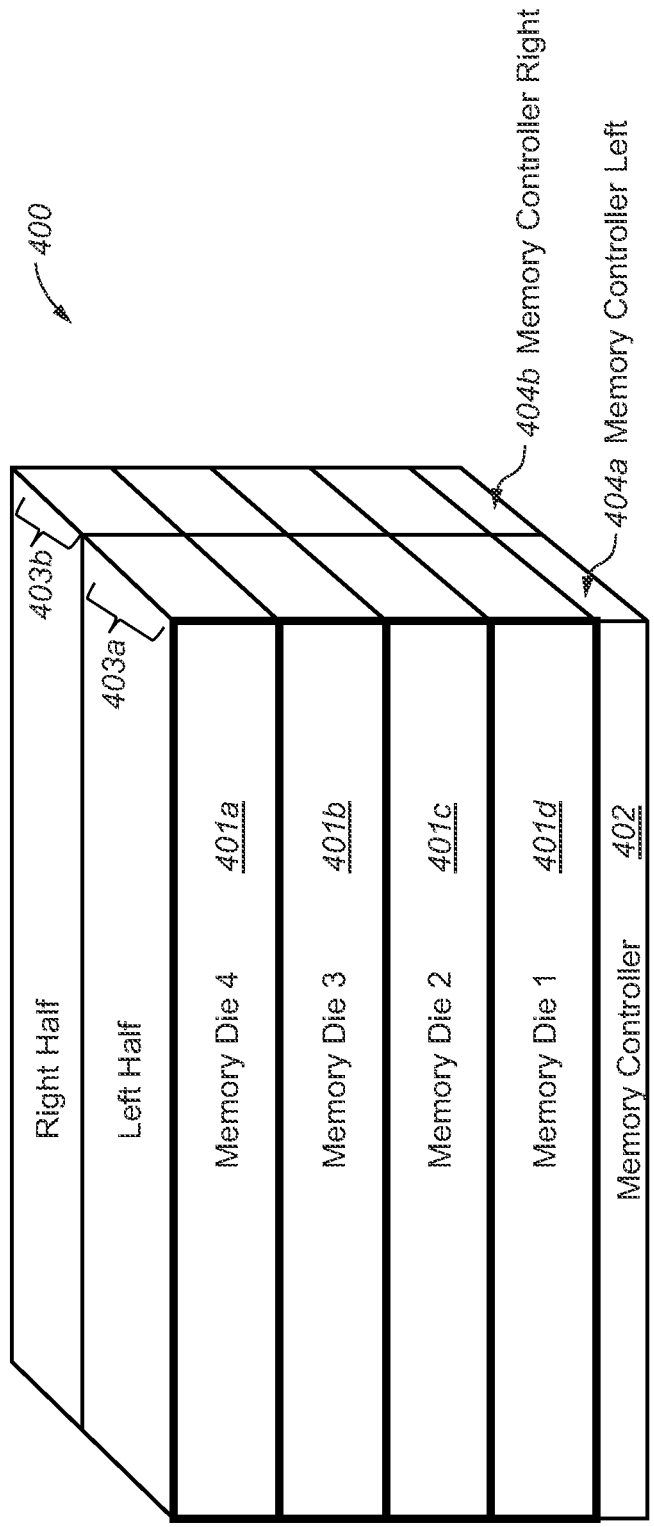
FIG. 4 shows QV module 400, including memory dies 401a-401d and controller die 402, partitioned into signal groups 403a and 403b, in accordance with one embodiment of the present invention.

FIG. 4 shows QV module 400, including memory dies 401a-401d and controller die 402, partitioned into memory channels 403a and 403b, in accordance with one embodiment of the present invention. In FIG. 4, the circuitries in memory dies 401a-401d for memory channels 403a and 403d are controlled, respectively, by memory controllers 404a and 404b. Because of the high capacity of QV memory arrays, the partitioning of a single stacked of dies into even greater number of memory channels, providing more than two memory interfaces are suitable in many anticipated applications. For example, a single QV memory module may support a multi-processor system, in which each processor is allocated a separate memory channel in the QV memory module for their respective independent operations. The multi-channel approach ensures a small enough granularity at the memory level for greater system level performance.

Figure 5:
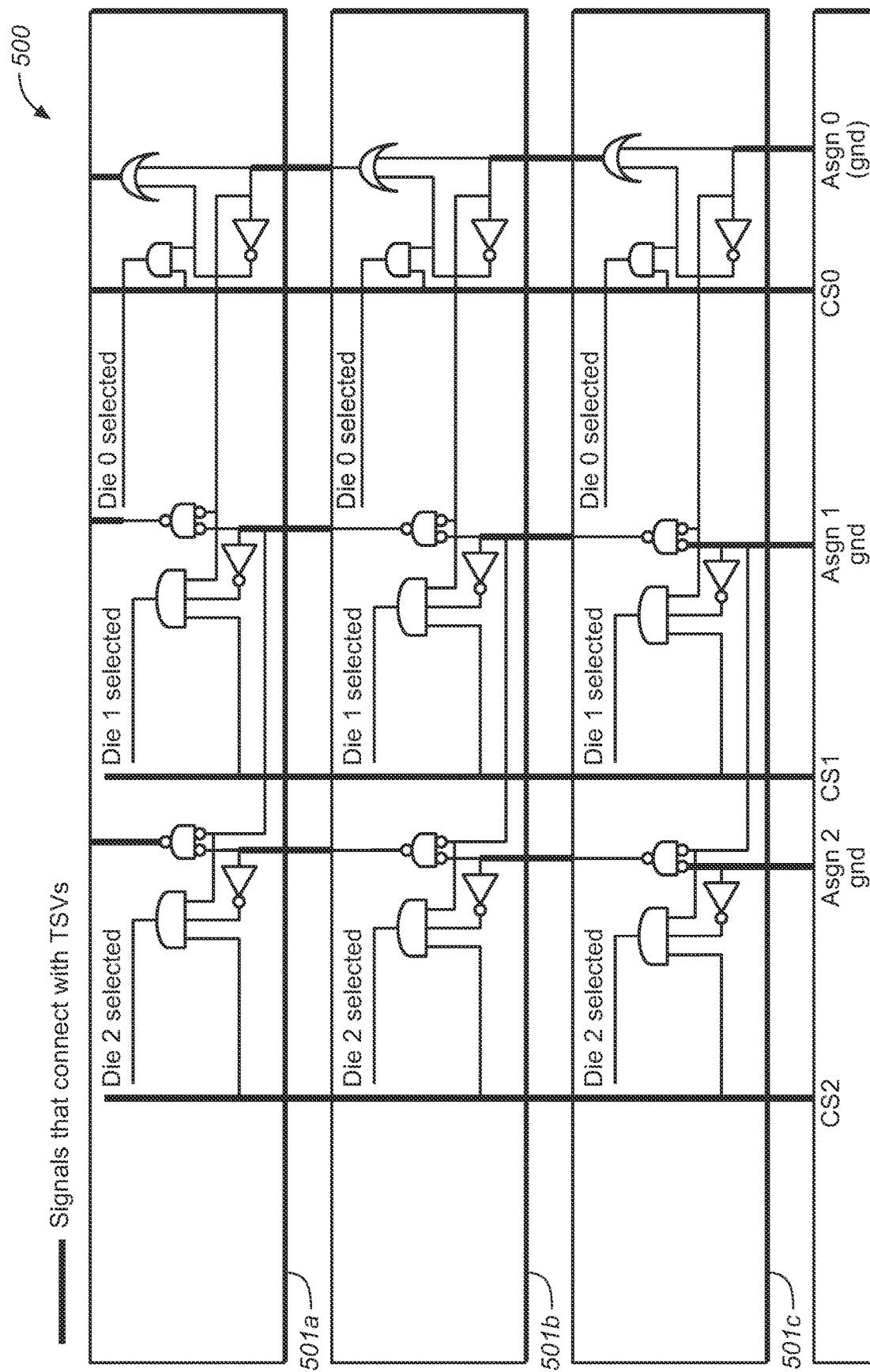
FIG. 5 shows selection circuit 500 that assigns to each of memory dies 501a-501c one of identity codes Asgn0, Asgn1 and Asgn2 and allows each memory die to be selected by a respective one of selection signals CS0, CS1 and CS2, according to one embodiment of the present invention.

FIG. 5 shows selection circuit 500 that assigns to each of memory dies 501a-501c one of assignment signals Asgn0, Asgn1 and Asgn2 and allows each memory die to be selected by a respective one of selection signals CS0, CS1 and CS2, according to one embodiment of the present invention. Controller die 502 may be partitioned, for example, to support two separate memory channels by two separate memory controllers in controller die 502, operating independently. In that case, the assignment and selection signals, generated from the memory controller of each memory channel in controller die 502, may be routed over dedicated paths through TSVs and decoded at each memory die. This assignment and selection method may be easily extended for additional memory dies to be stacked. Selection signals CS0-CS1 may serve as "rank" designators, when the corresponding circuitry in the selected memory die operate as a rank of the memory system. Alternatively, selection signals CS0-CS1 may select a bank group, a bank, or any suitable memory organization. Of course, numerous other assignment and selection methods exist and may be implemented, such that the assignment and selection method of FIG. 5 is merely one method among many. The assignment and selection signals may facilitate a power conserving scheme to allow selective deactivation or activation of circuitry in any memory die.

The way memory channels in a QV memory module are configured (i.e., how the memory arrays of the memory dies are partitioned) affects flexibility of memory usage. For example, a memory channel may encompass a group of vertical-aligned tiles in the memory dies. In that organization, as bit lines within a tile are suitably short, fast read and write operations may be carried out, even when the bit lines are not copper conductors (e.g., polysilicon). As discussed above with respect to FIGS. 1(c)(i) and (ii), each tile may include row and column decoders and drivers (i.e., word lines and bit lines) and sense amplifiers. In a 3-dimensional memory array, each tile includes multiple planes of 2-dimensional memory cell arrays stacked atop one another.

Figure 6:
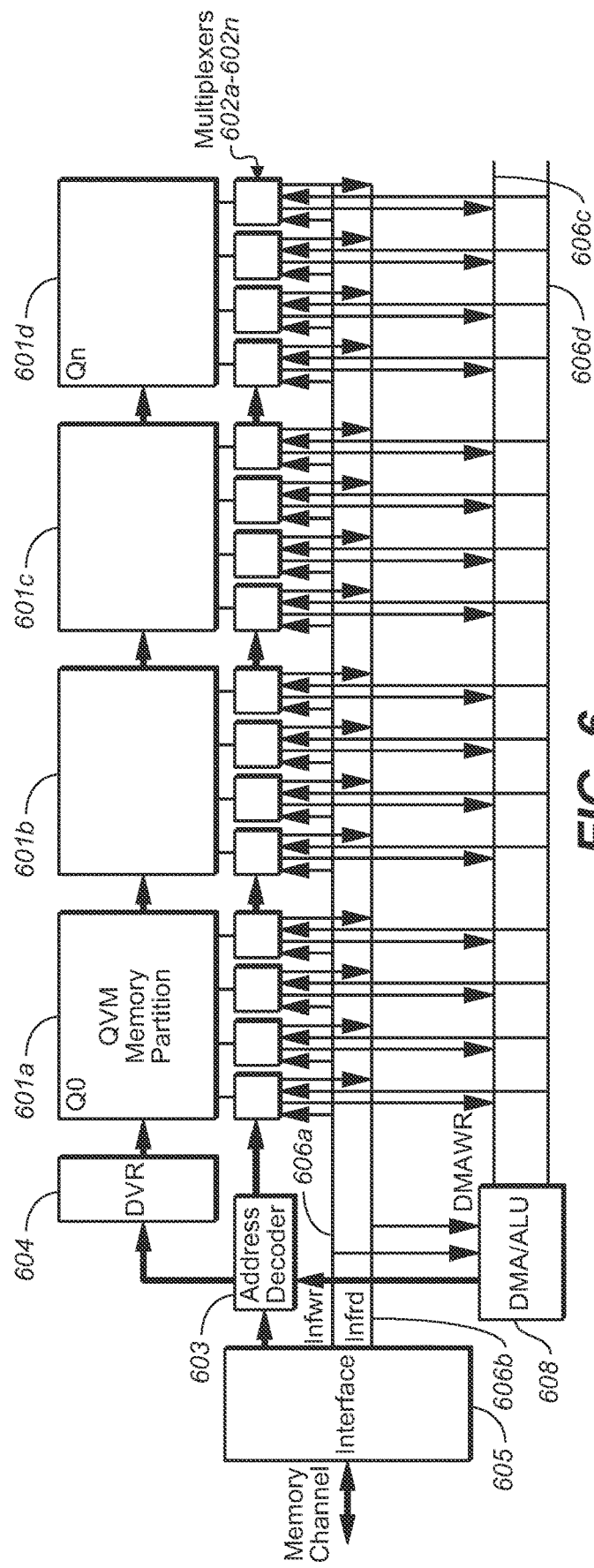
FIG. 6 shows memory control circuit 600 in a QV memory module; memory control circuit 600 handles read and write operations in the memory arrays of a signal group that includes partition units 601a-601d each provided in a memory die of the QV memory module, according to one embodiment of the present invention.

FIG. 6 shows memory control circuit 600 in a QV memory module; memory control circuit 600 handles read and write operations in a memory channel that includes partition units 601a-601d each provided in a memory die of the QV memory module, according to one embodiment of the present invention. As shown in FIG. 6, partition units 601a-601d may each consist of one or more tiles (e.g., a single tile, a tile row, a bank or a bank group) in a memory die. (Of course, it is merely for illustrative purpose that FIG.

6 shows four partition units; any suitable number of partition units are possible.) During a read operation, data and control signals are communicated over memory interface circuit 605 using read bus 606a. Similarly, during a write operation, data and control signals are communicated over memory interface circuit 605 using write bus 606b. Memory circuit 600 also handles a DMA operation in which a host processor requests copying data between locations in one range of memory addresses to locations in another range of memory addresses. (As known to those of ordinary skill in the art, locations in one of the memory address ranges may correspond to a memory-mapped peripheral device.) Arithmetic-logic circuit 608 carries out the requested memory operations of memory control circuit 600, receiving input data signals from partition units 601a-601d on bus 606d and providing output data signals on bus 606d to be written back to partition units 601a-601d. Under control by arithmetic-logic circuit 608, address decoder 603 decodes each memory address to provide (i) the decoded address (e.g., row and column addresses) to driver circuit 604 to activate the requisite word lines and bit lines for memory access, and (ii) control signals to multiplexers 602a-602n to connect the data signals between partition units 601a-601d and the selected one of buses 606-606c.

The memory channel of FIG. 6 may provide, for example, a 32-Gb memory from partition units 601a-601d. each partition unit being a tile on a memory die. Memory capacity may be doubled if, each tile includes twice the number of planes, each partition unit includes twice the number of tiles, or the signal group includes twice the number of partition units. In one embodiment, manufacturing of memory dies formed on the same substrate (e.g., a silicon wafer) can be started and (a) stored away after a predetermined number of planes (e.g., 4) have been formed or, alternatively, (b) completed. The stored-away substrate may be completed later with additional planes (e.g., 4 additional planes) added to each memory die for a greater capacity. This method also allows certain testing to be carried out on the memory dies after a predetermined number of planes have been built. Alternatively, the size of each tile may be adjusted by including additional rows or planes. As the loads and driving requirements are not expected to significantly change in the adjustment, new memory designs may be implemented in short order. Thus, the basic memory design may be used over several generations of capacity without scaling concerns.

The present inventors expect future memory systems (e.g., at 128-Gbits or higher per memory die) to become more complex by including capabilities of a computing system (e.g., introducing more intelligence and off-loading more computation tasks to the controller). For example, in addition to providing sequencer or specialized hardware functions (e.g., direct memory access (DMA) control), a RISC processor may be incorporated into a controller die to carry out at high-level operational tasks of the memory. The term "RISC," which stands for "reduced instruction set computer," encompasses any customized processor circuitry and those processor cores available from ARM, MIPS and IBM's PowerChip, graphics processing units (GPUs), and any other suitable processor or circuit generally incorporated into a logic circuit using the "system-on-a-chip" (SOC) approach. Over time, a wide range of functionalities and hardware enhancement may be incorporated into peripheral devices. For example, many conventional host computer functions may be off-loaded.

Off-loading memory operations from the host processor is advantageous because, as CPUs reach their technology limits, performance enhancement has become difficult. Benefits of increased parallelism, such as by increasing the number of CPU cores and hyper-threading of the cores, are also diminishing, while the cost of higher power consumption increases with the number of operating cores. The resulting heat dissipation has become so significant that CPU cycles are expended to monitor temperature and performing power conservation actions (e.g., shutting off cores when certain conditions are met).

Away from the memory, specialized devices are incorporated into peripheral devices to off-load the CPU. For example, disk-to-disk copy of a file is conventionally carried out by bringing the file into memory from the source location and then writing it out to the destination, even for copying within the same disk. Such an operation involves both the network channels and the memory. Memory involvement may be avoided by allowing the drives to perform the copy operation internally or between drives, without moving the data into memory. Such an operation is faster and more efficient, takes less power and reduces CPU overhead. A similar capability may be incorporated into a network controller (NIC) by routing an incoming file directly to a disk rather than first receiving it into memory. Conversely, files may be sent from a disk directly over a local area network or wide-area network. Accelerator circuits for carrying out specific tasks (e.g., file encryption in a storage system) take over from the CPU, where such tasks are conventionally carried out by the CPU in memory. Without involvement by the CPU and the memory, power savings are realized not only in the CPU but also in reduced memory and memory channel activities.

With respect to off-loading CPU capabilities to the memory system, adding a new functionality to a conventional memory (e.g., DRAM-based memory), is costly, as the new functionality is implemented on the memory die itself, at the expense of memory density. For a QV memory module, however, the functionality may be implemented the available die area mentioned above on the controller die. Power-savings may be realized as a single memory controller on the controller die may be shared among multiple memory arrays on multiple dies. The longer data retention in QV memory cells also provide the advantage of reduced refresh rate—relative to DRAMs—for significant power-savings.

Memory control circuit 600 of FIG. 6, for example, implements the capability of duplicating a file from one area of memory ("source area") to another area of memory ("destination area"). In one embodiment, a sequencer or state machine keeps track of the addresses in the source area and the addresses in the destination. After the location of each address in the source area ("source location") is read, tri-state drivers may be used to drive the data at the location onto read bus 606b, which is transferred to write bus 606a or DMA/ALU bus 606c. At substantially the same time, a corresponding destination address is received into the address decoder, so that the data on write bus 606a or DMA/ALU bus 606c is written into the corresponding destination location in the destination area. The copy operation completes when data in all source locations are copied into the corresponding destination locations.

Figure 7:
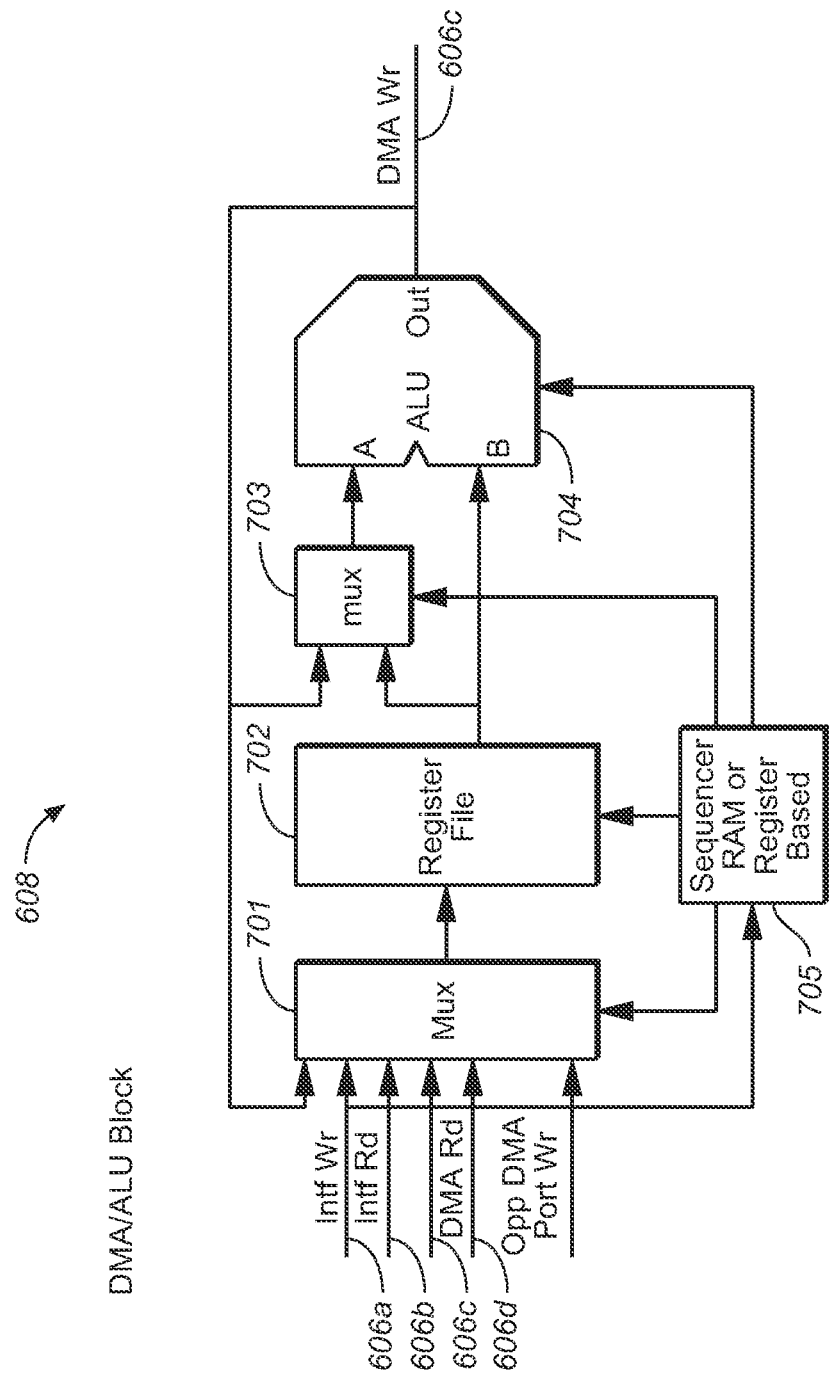
FIG. 7 shows one implementation of arithmetic-logic circuit 608 having an in-memory file duplication capability, in accordance with one embodiment of the present invention.

An alternative method for carrying out the copy operation is illustrated in FIG. 7. FIG. 7 shows one implementation of arithmetic-logic circuit 608 having the in-memory file duplication capability, accordance with one embodiment of the present invention. Sequencer or state machine 705 controls the operation of arithmetic-logic circuit 608. At the beginning, arithmetic-logic circuit 608 holds the initial source address and the initial destination area in designated registers in register file 702. Beginning with the initial source address, the memory locations corresponding to the addresses following the initial source address are successively accessed, with the data read from each location being loaded on bus 606*d*, which is then routed by multiplexer 701 to be latched into register file 702. The data is then retrieved from register file 702 for output by ALU 704 onto bus 606*c*, which is then written back into memory at the corresponding destination address. Sequencer or state machine 705 maintains the next addresses in the source and destination areas, updating their values after each bus transaction. Sequencer or state machine 705 continues the duplication operation until all data is copied from the source area into the destination area.

In a quasi-volatile memory, reading and writing into memory may be carried out a page (e.g., 4096 bits) per bus transaction, unlike a conventional memory channel, which is generally carried out at 8-bit or 16-bit increments. Recall that data transfer in a QV memory module is carried out over high-bandwidth hybrid bonds or copper studs, the data transfer does not require off-chip drivers; consequently, the copy operation is not power intensive. In addition, the page size represents a significantly higher bandwidth than is possible in a conventional memory channel.

By including arithmetic-logic circuit 608 in a QV memory module, many other memory and non-memory functions may be implemented. As illustrated in FIG. 7, arithmetic-logic circuit 608 may enable a DMA operation. In addition, with ALU 704 included in arithmetic-logic circuit 608, memory operations, such as the DMA operation, are not limited to those involving consecutive memory addresses, but other variations are also possible. As shown in FIG. 7, arithmetic-logic circuit 608 receives data input from interface buses 606*a* and 606*b* and DMA buses 606*c* and 606*d*, and also feeds back its output data from its ALU 704.

For this reason, it is preferred to make the DMA hardware using an ALU. The input to the ALU is multiplexed from the source, destination address registers as well as the feedback from the ALU.

A host processor may perform searching based on a key (e.g., searching for a file based on a file name, or searching for a data record based on a value of a field). Such an operation may be performed using arithmetic-logic unit 608. For that operation, a search command may be defined for sequencer or state machine 705, which causes (i) a search key to be latched into register file 702; (ii) sequencer or state machine 705 to access the memory locations where the target may reside (e.g., a directory or a set of data records); (iii) ALU 704 to compare the search key to the data retrieved from each memory location read; and (iv) return to the calling routine a hit or miss, and any relevant data (e.g., the location within the file where the target is identified). ALU 704 facilitates non-consecutive addresses to be generated. For example, in structured data (e.g., a table consisting of rows and columns), addresses to access only specific fields (e.g., columns) are easily generated using ALU 704. Such a capability can provide great efficiency in a search operation. In this manner, any data set or file in memory can be formatted, operated on or checked for specific patterns.

Besides address operations, ALU 704 of arithmetic-logic circuit 608 can also perform operations on data that is read or to be written into memory. Practically, any arithmetic or logic operation may be performed on any data retrieved from any location in the memory or stored in register file 702, with the result from the arithmetic or logic operation written back into register file 702 or any destination location in the memory. Many tasks carried out in a host processor on data retrieved from memory over a memory interface can be off-loaded to an arithmetic-logic circuit provided in a QV memory module, with a relative insignificant cost in silicon area. Without transferring data into and out of the memory off-chip over a memory interface, a QV memory enables significant power-savings and high processing speed. Other circuitry that can easily be incorporated into arithmetic-logic circuit 608 includes, for example, a barrel shifter for data alignment purposes. A barrel shifter pre-processing data to be provided to ALU 704 may allow ALU 704 to have a lesser data width and greater flexibility in arithmetic-logic operations. In a QV memory module, maintaining the controller die to have substantially the same silicon footprint as the memory dies provides improved and new functionalities to the memory at little or no additional cost.

ALU 704 may be implemented at different levels of sophistication. For example, ALU 704 may be a relatively simple logic circuit, together with a set of data registers, for performing simple arithmetic or logic operations (e.g., add, subtract, AND, OR, NOT or multiply). Alternatively, ALU 704 may be implemented as a general-purpose microprocessor (e.g., a RISC processor). Sequencer or state machine 705 may be, for example, set up to execute commands on memory data through a special direct address space-mapped register that is loaded by the host processor. Alternatively, sequencer or state machine 705 may execute micro-codes loaded into a reserved area in the quasi-volatile memory. Sequencer or state machine 705 may also, for example, be a RISC processor. In general, providing computational unit (e.g., a processor) in a QV memory module provides a greatest flexibility for in-memory computation.

In one embodiment, in addition to register file 702, a fast memory (e.g., an SRAM) may be included for use by ALU 704 in arithmetic or logic operations. FIG. 8(*a*) is a block diagram for controller die 800 in a QV memory module, including RISC processor 804 and SRAM 805, in accordance with one embodiment of the present invention. As shown in FIG. 8(*a*), controller die 800 includes memory interfaces 801*a* and 801*b*, memory array support circuits 802*a* and 802*b*, RISC processor 804, SRAM 805 and serial port 803. Memory interfaces 801*a* and 801*b* include industry-standard memory interfaces buses (e.g., any of the DDR interfaces) that allow a host processor to access the memory. Memory array support circuits 802*a* and 802*b* provide support circuitry, such as sense amplifiers, buffers, and column decoders and drivers, to support the memory arrays in the memory dies of the QV memory module. Serial port 803 allows the host processor to down-load into SRAM 805 code for execution by RISC processor 804. SRAM 805 may also be loaded from the memory, or over memory interfaces 801*a* and 801*b*. Once loaded, RISC processor 804 is responsible for all high-level computations conducted in controller die 800. In this embodiment, the QV memory is managed in two memory partitions managed from RISC processor 804. One or more internal memory buses (not shown) on controller die 800 may be provided in memory support circuits 802*a* and 802*b* for data transfers within and between the two portions of the QV memory. FIG. 8(*b*) is a block diagram for controller die 850 in a QV memory module, including RISC processors 804*a* and 804*b*, serviced by SRAMs 805*a* and 805*b*, respectively, in accordance with one embodiment of the present invention In FIG. 8(*b*), RISC processors 804*a* and 804*b* are responsible for operations in one-half of the QV memory, through memory support circuits 802*a* and 802*b* and memory interfaces 801*a* and 801*b*, respectively. Data transfers between the two portions of the QV memory may be achieved using inter-processor communication between RISC processors 804a and 804b. One of RISC processors 804a and 804b may act as master to conduct data transfers between the two partitions of the QV memory. Alternatively, RISC processor 804a and 804b, together with their associated SRAMs 805a and 805b, may operate in parallel on the entire memory, with access conflicts resolved through an arbitration protocol.

With in-memory computational commands implemented in the embedded processor or processors, the QV memory module offers a significantly large QV memory for gathering and operating on data without data transfers across a bottleneck, such as an industry-standard memory interface (e.g. DDR) bus. One of memory interface bus 801a or 801b may be converted to be a high-speed processor bus for a host processor to send commands for in-memory computation, intra-memory copy or DMA-type operations, thus enabling a low-cost mechanism to move or operate on a large block of data. The QV memory module becomes an embedded processor with access to a low-power memory system with a huge capacity.

Figure 9:
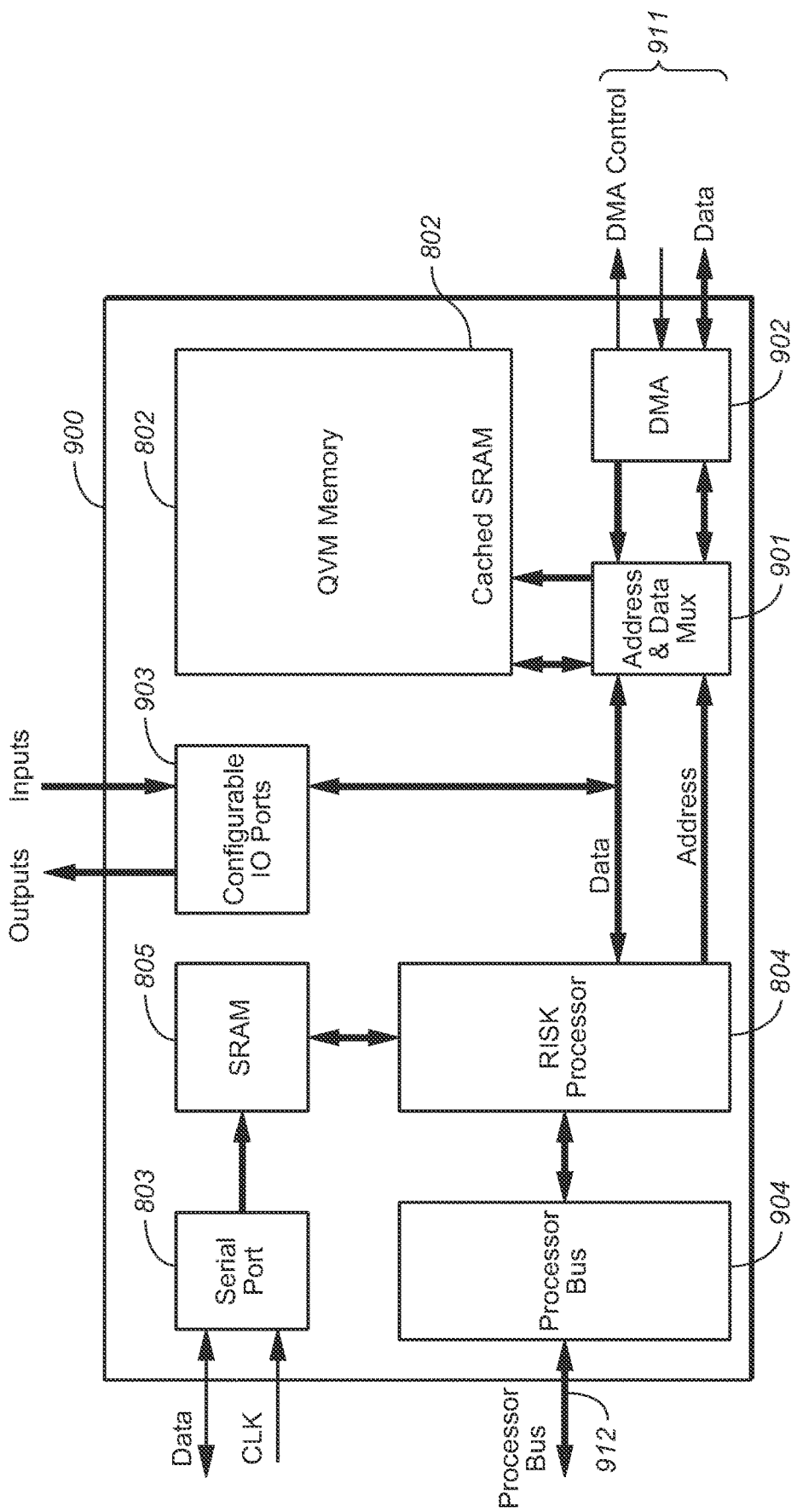
FIG. 9 is a functional block diagram of QV memory module 900, in accordance with one embodiment of the present invention.

FIG. 9 is a functional block diagram of QV memory module 900, in accordance with one embodiment of the present invention. QV memory module 900 may be, for example, an implementation of a QV memory module having a controller die represented by controller die 800 of FIG. 8(a). As shown in FIG. 9, DMA memory interface bus 911 and associated DMA control logic circuit 902 provide one interface for fast data transfer between QV memory 802 and an external device without host processor intervention after setting up the DMA command. In addition, processor bus 912 and processor bus circuitry 904 allows RISC processor bus 804 to communicate with a host processor or perform other data transactions. In addition, DMA interface bus 911 and processor bus 912, QV memory module may also implement a memory interface, such as industry-standard DDR-type interface. Serial port 803 allows RISC processor 804 to be bootable from code downloaded into SRAM 805 over an I2C interface. Alternatively, a portion of the QV memory module may be configured as a read-only, non-volatile memory (NVM; e.g., an erasable programmable read-only memory (EPROM)) accessible over processor bus 912 may be provided to store the boot-up executable code.

Figure 10:
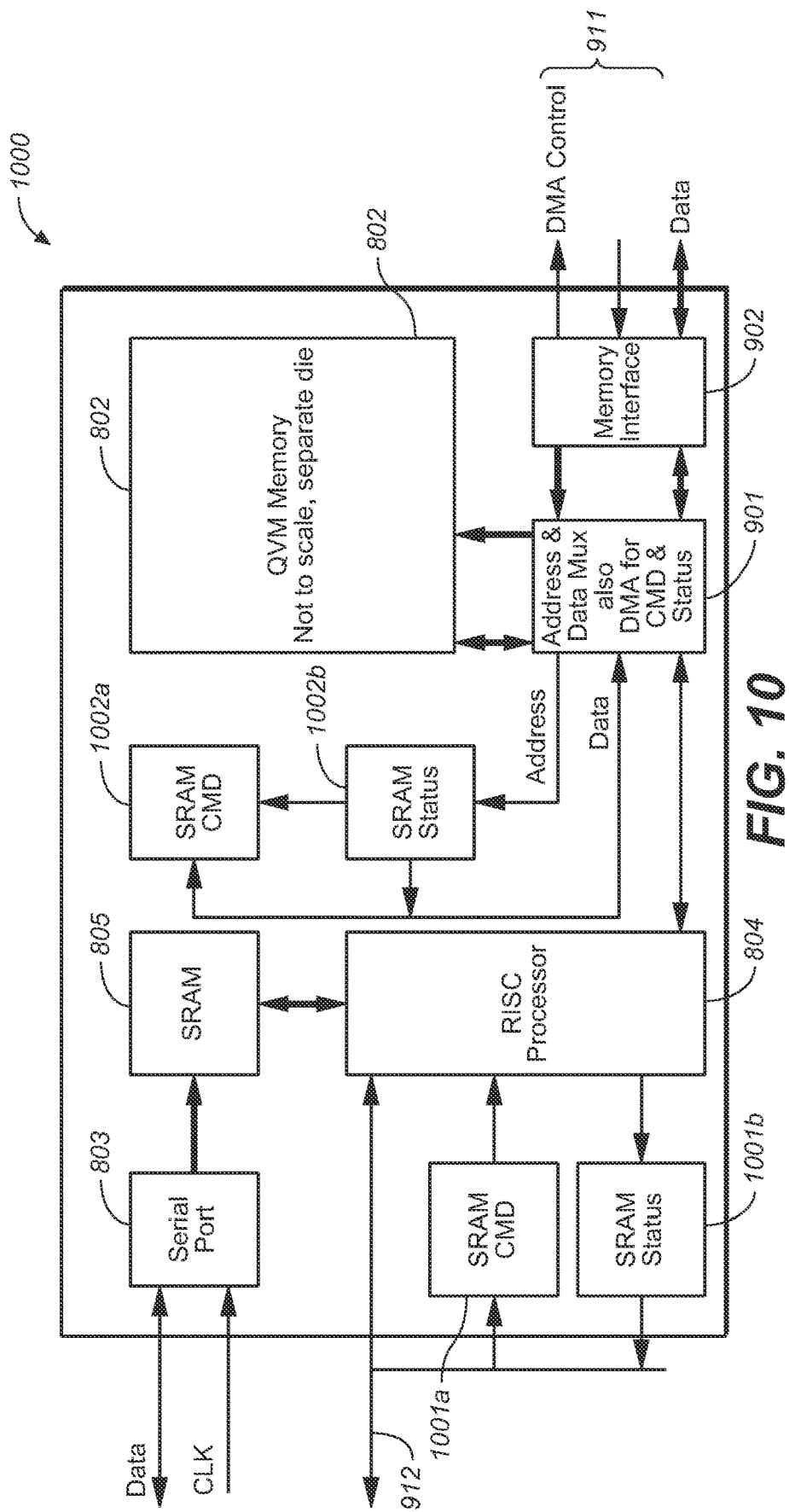
FIG. 10 shows QV memory module 1000 that uses a command-status exchange protocol, in accordance with one embodiment of the present invention.

One way to conduct operations in QV memory module 900 is through a command-status exchange protocol. In one implementation, the host computer and RISC processor 804 maintain a task file in a portion of a memory space that is accessed by the host processor and RISC processor 804 in a semaphore manner FIG. 10 shows QV memory module 1000—a variation of QV memory module 900 of FIG. 9—that uses a command-status exchange protocol, in accordance with one embodiment of the present invention. As shown in FIG. 10, a host processor may issue memory commands to RISC processor 804 in command section 1001a of an SRAM (or, alternatively, a register file). Upon completion of each command, or at predetermined points of command execution, RISC processor 804 reports the status of command execution in status section 1001b of the SRAM memory (or, alternatively, a corresponding register file). Under this approach, QV memory module 1000 can support numerous commands handled by RISC processor 804 simultaneously. In one embodiment, command section 1001a and status section 1001b may each be organized, for example, as a circular queue. Each entry in command section 1001a or status section 1001b may be a predetermined number of bytes (e.g., 64 or 128 bytes) long that may be written or read by the host processor on processor bus 912 under a suitable protocol. A similar command-status exchange protocol may be similarly implemented over memory bus 911 (controlled by memory interface 902) for DMA-type commands carried out between one or more peripheral devices and QV memory module 1000.

Figure 11:
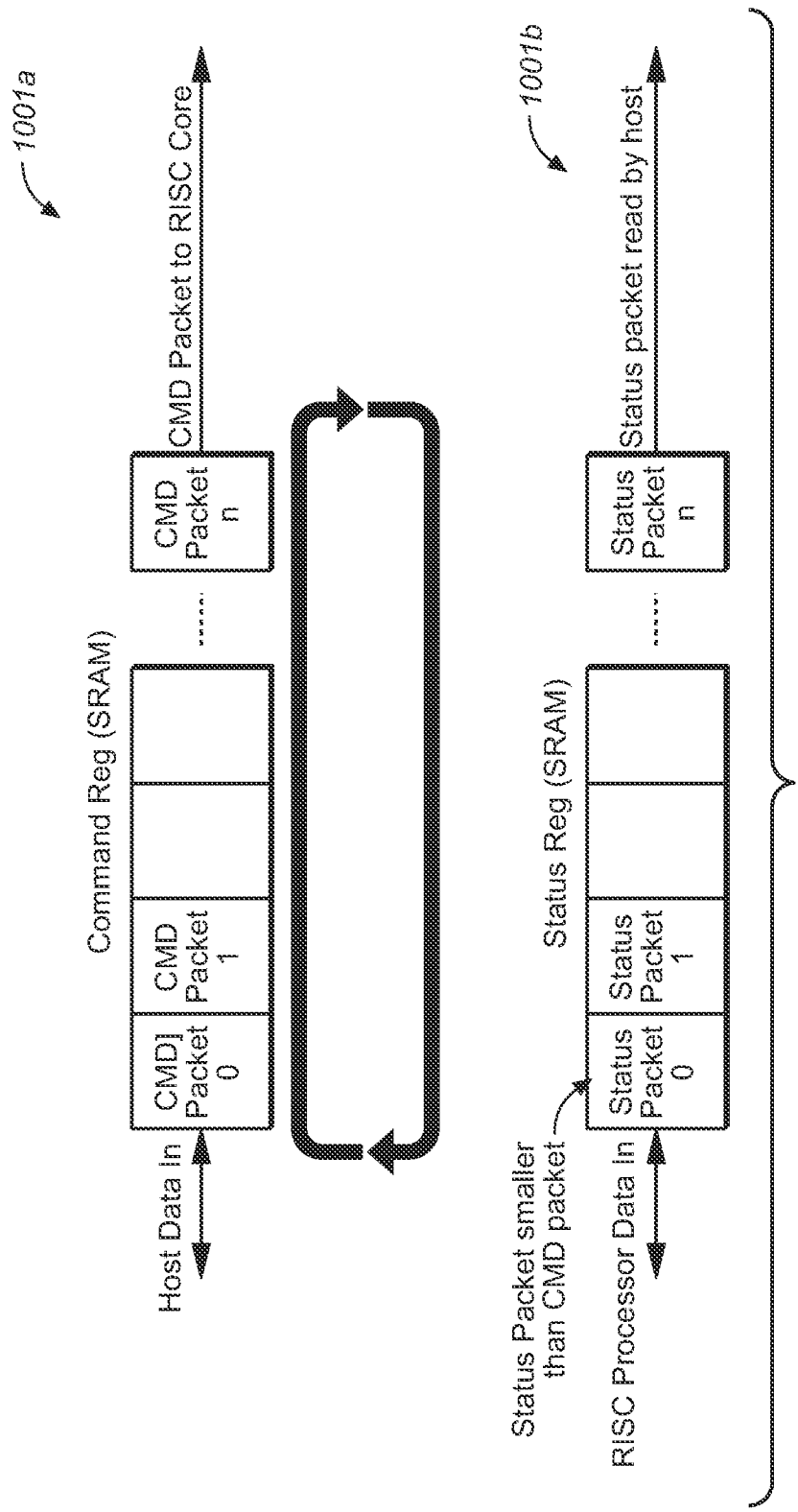
FIG. 11 illustrates command section 1001a and status section 1001b, each organized as a queue, in accordance with one embodiment of the present invention.

FIG. 11 illustrates command section 1001a and status section 1001b, organized as queues (i.e., first-in-first-out buffers), in accordance with one embodiment of the present invention. In one implementation, the queues are implemented as circular queues, i.e., the oldest entry is overwritten when the other entries are active. As shown in FIG. 11, successive commands are loaded into command section 1001a by the host processor, which are read for execution in order of their arrivals by RISC processor 804. Upon completion or at each of predetermined points of command execution, RISC processor 804 writes an entry into status section 1001b, which is retrieved by the host processor in to monitor command execution. When a command completes, RISC processor 804 loads a corresponding status entry in status section 1001b and raises an interrupt (or any suitable wake-up signal) to the host processor. As minimal interaction is exchanged over execution of a command, the task delegated by the host processor to RISC processor 804 represents an efficient off-loading of a host task. In many applications, RISC processor 804 may execute code downloaded from the host processor at predetermined locations in SRAM 805, rather than use the command-status exchange protocol.

As a QV memory module have a longer access latency than conventional DRAM-based memory, SRAM 805 allows the QV memory module to operate with a higher effective speed and better endurance, using various cache control and buffering techniques. One example is the use of buffering for commands and status messages, as illustrated in by FIGS. 10 and 11. Another use of buffering is speed-matching to achieve higher throughput at the memory interface, as a high-speed data stream (e.g., a DMA operation) on the memory interface arrives in bytes or words per bus transaction, while memory accesses within the QV memory module are carried out in a much larger data unit (e.g., one or more pages) per read or write operation. SRAM 805 may provide buffers for accumulating the data from the data stream for the page write operations. Data pages fetched from the QV memory may be output from SRAM 805 over the memory interface. Efficiency may be achieved by inter-leaving memory operations (i.e., filling a page of data in a buffer in SRAM 805, while writing a page of previously filled data from another buffer in SRAM 805 back to the QV memory). Speed-matching sustains a high throughput over the memory interface, whether reading or writing data into the QV memory.

Figure 12:
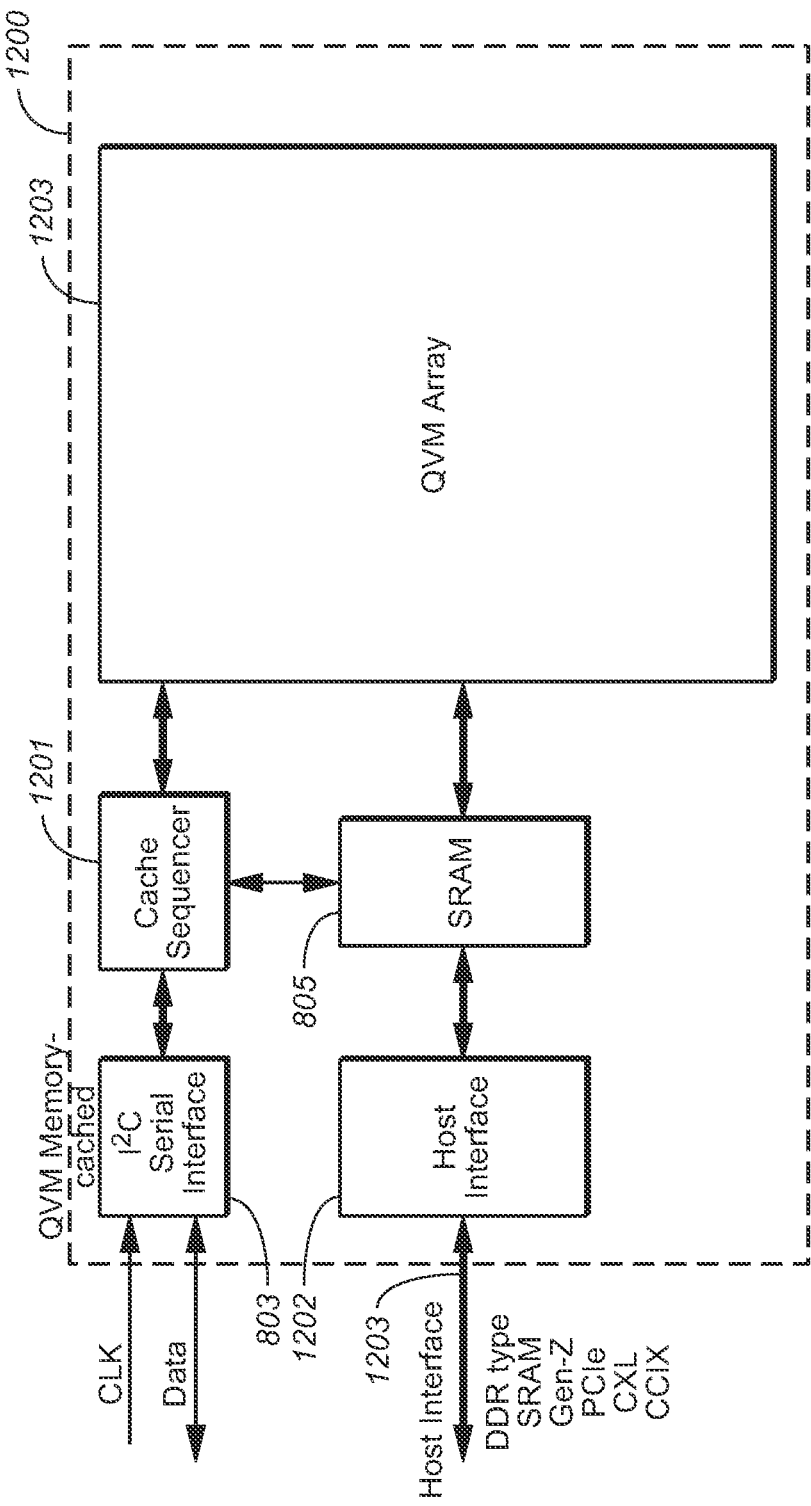
FIG. 12 is a functional block diagram of QV memory module 1200, including cache controller 1201, according to one embodiment of the present invention.

SRAM 805 may also be used for caching data retrieved from the QV memory. FIG. 12 is a functional block diagram of QV memory module 1200, including cache controller 1201, according tone embodiment of the present invention. As shown in FIG. 12, cache controller 1201 manages SRAM cache 805 for QV memory 1203. In a caching operation, cache controller 1201 intercepts any read or write access to QV memory 1203 received over host interface 1202. In a write operation, cache controller 1201 writes into a cached page in SRAM 805 and writes the cached page back to QV memory 1203 simultaneously or at a subsequent time according to a cache write-back policy. Cache controller 1201 may service a read command from a cached page in SRAM 805 (i.e., a "hit"); otherwise (i.e., a "miss"), i.e., if the page has not been cached, cache controller 1201 fetches the page containing the data to be read into SRAM 805 from the QV memory 1203. During a miss, the new cached page may retire another cached page. The retired cache page may require writing back, according to the write-back policy. In one embodiment, each cached page includes 4 Kbits of data. The page size may be determined, for example, based on requirements or convenience of the intended applications. For example, many memory managers store program codes in that block size, as it is the size of a typical disk cluster. In some implementation, contiguous pages may be prefetched and cached for upcoming accesses to these contiguous pages based on an anticipated reference pattern. Cached pages most recently accessed are likewise kept in SRAM 805 and not retired (e.g., written back, if accessed for a write operation) immediately. Prefetch can also be facilitated using logical or physical page tables stored in either DRAM or the QV memory module. Detecting fragmentation in page assignments avoid unnecessary prefetching. With caching, the effective performance of the QV memory may approach that of an SRAM in some applications. At that level of performance, the QV memory has a significant cost advantage, as the QV memory has a much higher density than SRAM.

Host interface 1202 may be implemented by any industry-standard interface (e.g., DDR, SRAM, Gen-Z, PCIe, CXL and CCIX), according to the requirements of the intended application (e.g., high-speed, low-power, high-capacity, or any suitable combination). With an effective SRAM cache, one may use an SRAM interface as host interface 1202 for an intended application that prefers treating the QV memory as a dense SRAM with high-speed operations (e.g., a RAM-disk type application). Alternatively, CXL, CCIX and Gen-z interfaces may also be used to allow greater host processor control. For use as a media server, a web-hosting server or any of various graphics applications (e.g., any application that supplies a high data throughput to a network), the QV memory module may have a PCIe interface (e.g., PCIe controller) host interface 1202.

Figure 13:
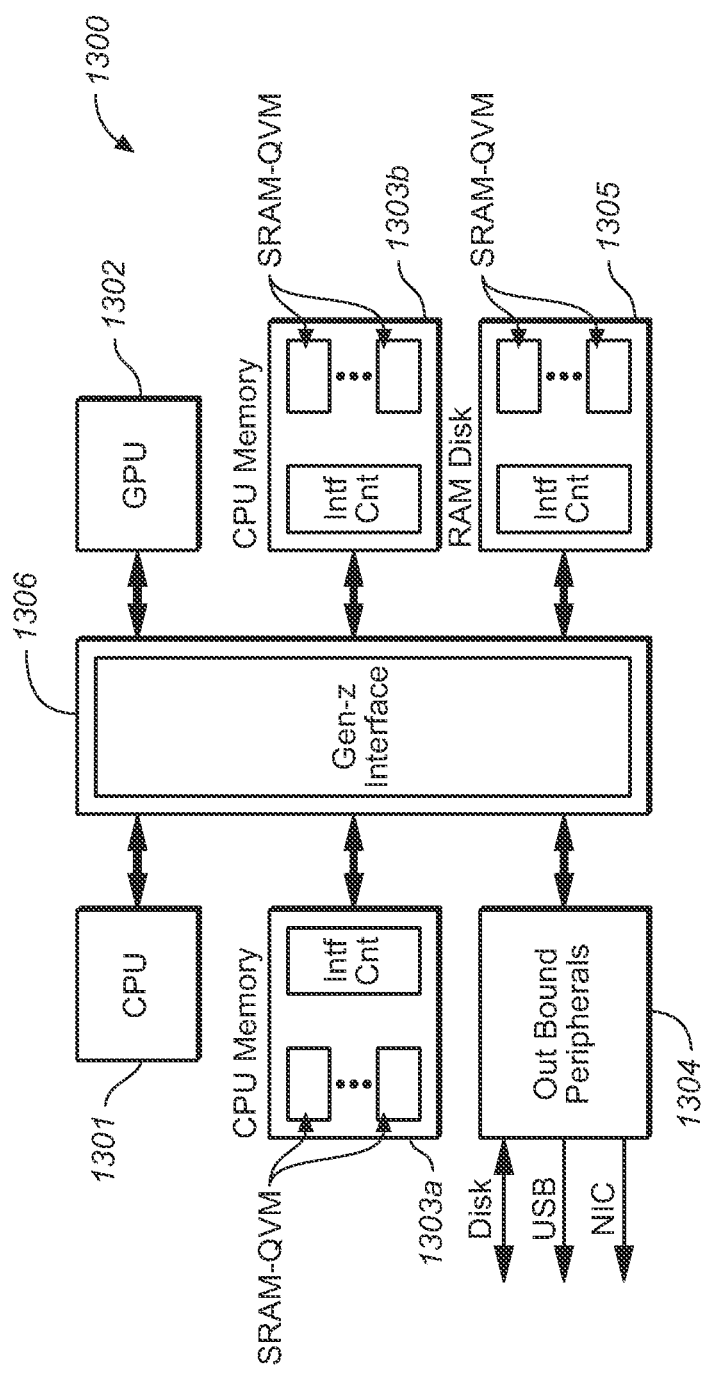
FIG. 13 is a functional block diagram of computer system 1300, which includes CPU 1301, GPU 1302, a memory implemented by QV modules 1303a and 1303b, disk cache (or RAM disk) 1305 and peripheral controller 1304, all communicating over Gen-Z interface 1306, according to one embodiment of the present invention.

FIG. 13 is a functional block diagram of computer system 1300, which includes CPU 1301, GPU 1302, a QV memory implemented by QV modules 1303*a* and 1303*b*, disk cache (or RAM disk) 1305 and peripheral controller 1304, all communicating over Gen-Z interface 1306, according to one embodiment of the present invention. As indicated in FIG. 13, RAM disk 1305 may be implemented by a QV memory module. QV memory modules 1303*a* and 1303*b* and RAM disk 1305 each may be configured functionally in the manner of QV memory module 1200 of FIG. 12. Gen-z interface 1306 provides a high-speed bus to support access to the QV memory or RAM disk 1305 by peripheral devices (e.g., disks and other devices connected by USB ports, local wired or wireless network or a PCIe bus). In this configuration, RAM disk 1305 provides a front-end to the peripheral devices, in the manner described above with respect to QV memory module 1000 of FIG. 10, for example. RAM disk 1305 thus allows high-speed, high-throughput accesses to any of the peripheral devices to be carried out using a SRAM-type interface. With an SRAM cache to concurrently service CPU 1301 or GPU 1302, RAM disk 1305 may use DMA to prefetch sequential data into the quasi-volatile memory arrays from each peripheral device to maintain sustained data transfers, thereby reducing wait states or occasional pauses.

A DIMM formed out of QV memory nodules ("QV DIMM") that incorporates in-memory computation capabilities is not only a high-capacity memory device, but also an independent computing device to which conventional CPU tasks may be off-loaded. If each QV memory module in an integrated circuit package (i.e., a "chip") offers a capacity of 256 Gb (with a single memory die), an 8-chip QV DIMM provides 2 Tb or 256 GB of memory on a one-sided DIMM. (A Tb is $2^{40}$ bits of data; a TB is $2^{43}$ bits of data.) In comparison, a DIMM formed output of 8 contemporary DRAM chips provide merely 32 Gb or 4 GB data. In other words, a QV DIMM has a 64-fold density advantage over a DIMM formed out of contemporary DRAM chips. Further, a QV DIMM may have the computational power of up to 16 RISC processors, considering that two RISC-processors may be implemented in each QV memory module according, for example, the architecture illustrated by QV memory module 850 of FIG. 8(*b*).

With die-stacking in the manner illustrated above in conjunction with FIGS. 2 and 3, a 4-die stack in a QV memory module provides the capacity of 1 TB. The in-memory computation capability breaks the bottleneck in the conventional memory interface. In-memory computation enables a QV memory module to become a host-level device with computation power, using data manipulation, caching and various buffering methods. Provisional Application IV discloses numerous methods of sharing a memory across CPUs through a switching matrix that allows multiple host channels to access the same memory block. FIG. 14(*a*) shows QV DIMM 1400 including memory partitions 1404*a*-1404*d*, each associated with SRAM 1403*a*-1403*d*, in accordance with one embodiment of the present invention. QV DIMM 1400 may include one or more QV memory modules. As shown in FIG. 14(*a*), QV DIMM 1400 includes memory interfaces 1401*a*-1401*d* controlling, respectively, memory channels 1405*a*-1405*d*. Switch matrix 1402 may be configured such that any of memory partitions 1404*a*-1404*d* may be accessed over any of memory channels 1405*a*-1405*d*. Memory caching in SRAMs 1403*a*-1403*d* ensures that each memory partition performs as a high-capacity and low effective latency memory.

As mentioned above, QV DIMM 1400 can also provide in-memory computation capabilities. For example, data sharing among memory channels 1405*a*-1405*d* may be achieved through the memory constituted from memory partitions 1404*a*-1404*d* within QV DIMM 1400. RISC processors in the QV memory modules within QV DIMM 1400 may act as master for accessing, transferring or operating on data in their assigned portions of the QV memory. In one embodiment, each memory channel may be assigned to a portion of an address space that is mapped to specific portions of the memory partitions, allowing channel sharing of the QV memory and uniform memory access (UMA). When the QV memory is partitioned, with each partition accessible by multiple ports, higher performance may be expected, as the availability of multiple ports reduces access delays due to resource conflicts.

FIG. 14(*b*) shows computer system 1450, including processors 1410*a*-1410*d* coupled to memory channels 1405*a*-1405*d* of QV DIMM 1400, respectively, in accordance with one embodiment of the present invention. Processor 1410*a*-1410*d* may each be any suitable computational device requiring access the memory, e.g., a CPU, a GPU or a reconfigurable processor (e.g., one constituted by field programmable gate arrays (FPGAs)). As shown in FIG. 14(*b*), each of memory channels 1405*a*-1405*d* may be individually configured to support any suitable industry-standard memory interface (e.g., DDR4, DDR5 or HBM interface). In the configuration of FIG. 14(*b*), QV DIMM 1400 may be partitioned such that each channel is dedicated a portion of the QV memory or, alternatively, one or more memory channels may share all or a portion of the QV memory. In a shared configuration, access to a memory block from one of the shared channels may be protected by a semaphore (e.g., implemented by a bit set in a configuration register), which blocks access to that memory block by another memory channel. The blocked memory channels may wait in a queue. Upon completion of access to the memory block, the semaphore is released. In other embodiments, an upstream controller may be allowed to arbitrate access conflict to give priority, according to some ordering scheme, set statically or dynamically. As indicated in 14(a), each memory partition may include SRAM circuitry. Provisional Application III, incorporated by reference above, discloses various ways such SRAM circuitry may be used. For example, the SRAM circuitry may accelerate memory operation by acting as buffer memory, cache memory or another suitable manner for the associated memory partition, or as cache memory for the associated memory partition.

Figure 14A:
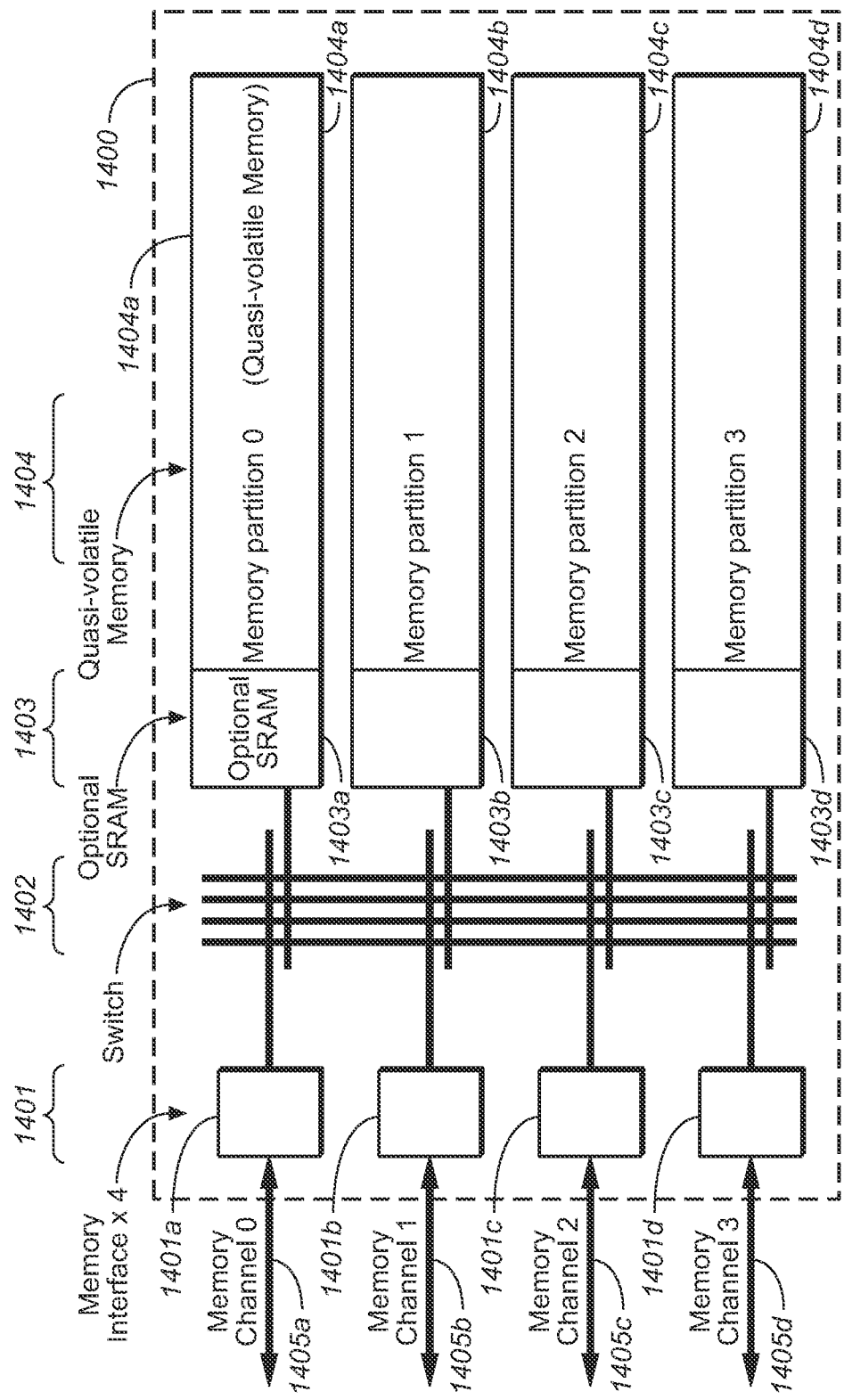
FIG. 14(*a*) shows QV DIMM 1400 including memory partitions 1404*a*-1404*d*, each provided associated SRAM 1403*a*-1403*d*, in accordance with one embodiment of the present invention.
Figure 14B:
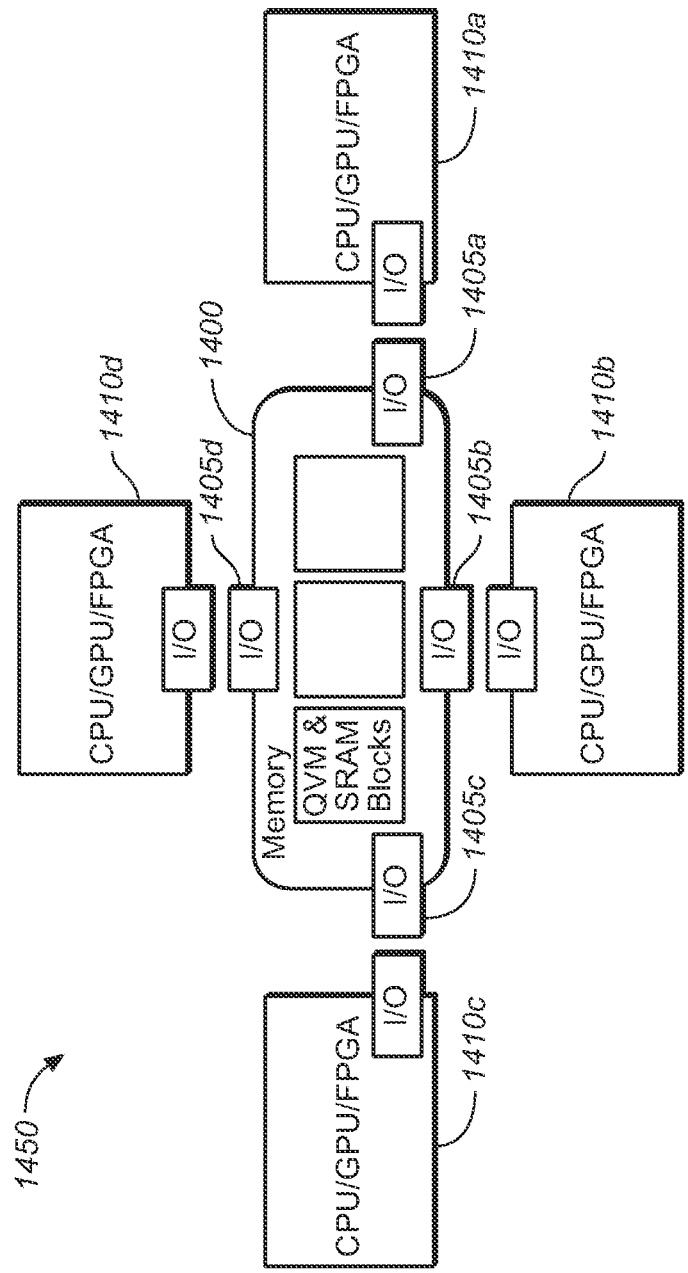

The QV DIMM approach of FIGS. 14(a) and 14(b) enables a system in which significant computational tasks may be carried out on the memory side of the memory interface ("memory-centric computing"). Memory-centric computing avoids latency resulting from waiting for data to be read out of the memory. This approach has significant advantage over the approach in which logic circuits access data using multiple levels of cache that are accessed using register-to-register transfers carried out over short distances (thereby, reducing resistive capacitance delay). The present invention achieves memory-centric computing by providing a high-capacity memory (e.g., tens to hundreds of gigabytes of memory in each memory die, accessible in logical blocks that are much larger than the 8-bit or 128-bit word widths in DRAM and HBM, respectively, as specified by the JEDEC Solid State Technology Association). Within the QV DIMM, each QV memory module has one or more memory dies with memory circuits organized as tiles each allowing 1024 or more bits of readout per memory transaction. The QV memory may be organized as a multi-port memory. In a multiport memory, the memory is partitioned into memory blocks that are each accessible from one or more dedicated ports. With a well-tuned size of partition and a suitable number of ports, such an organization allows the many memory blocks of a large memory to be accessed in parallel, with reduced likelihood of conflicts.

Figure 15A:
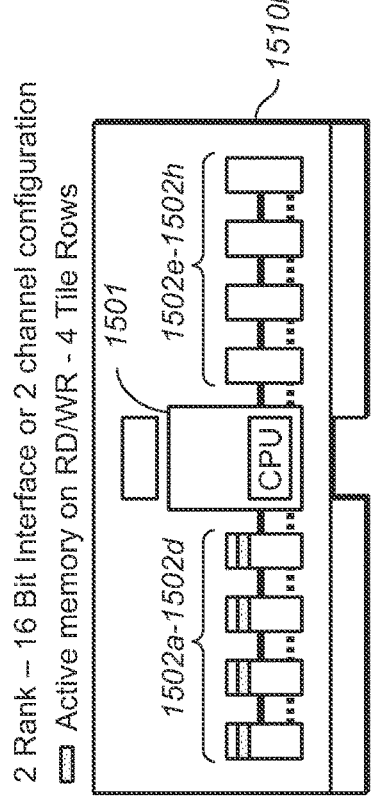
FIGS. 15(*a*)-(*d*) show QV DIMM 1510*a*-1510*d*, each including processor 1501 accessing eight QV memory modules (i.e., QV memory modules 1502*a*-1502*h*) in (a) single-rank configuration, with an 8-bit memory interface, (b) dual-rank configuration, with a 16-bit memory interface, (c) quad-rank configuration, with a 16 bit 32-bit interface, and (d) single-rank configuration, with a 64-bit interface, respectively, according to one embodiment of the present invention.

FIGS. 15(a)-(d) show QV DIMM 1510a-1510d, each including processor 1501 accessing eight QV memory modules (i.e., QV memory modules 1502a-1502h) in (a) single-rank configuration, with an 8-bit memory interface, (b) dual-rank configuration, with a 16-bit memory interface, (c) quad-rank configuration, with a 32-bit interface, and (d) single-rank configuration, with a 64-bit interface, respectively, according to one embodiment of the present invention. In FIG. 15(a), processor 1501 accesses all eight QV memory modules simultaneously for each read or write operation, accessing a tile row in an addressed memory die of each QV memory module. When the QV DIMM receives or provides 64 bits of data per write or read operation, processor 1501 selects 8 bits of data from each QV memory module accessed.

Figure 15B:
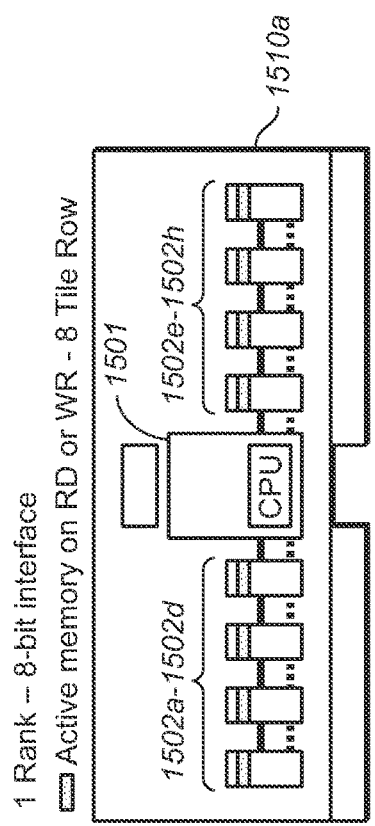

In FIG. 15(b), QV memory modules 1502a-1502h may be divided into two groups each including 4 QV memory modules, and processor 1501 accesses one of the two groups in each read or write operation. In this configuration, the QV memory may be accessed through either one or two memory channels. When the QV DIMM receives or provides 64 bits of data per write or read operation, processor 1501 selects 16 bits of data from each QV memory module accessed.

Figure 15C:
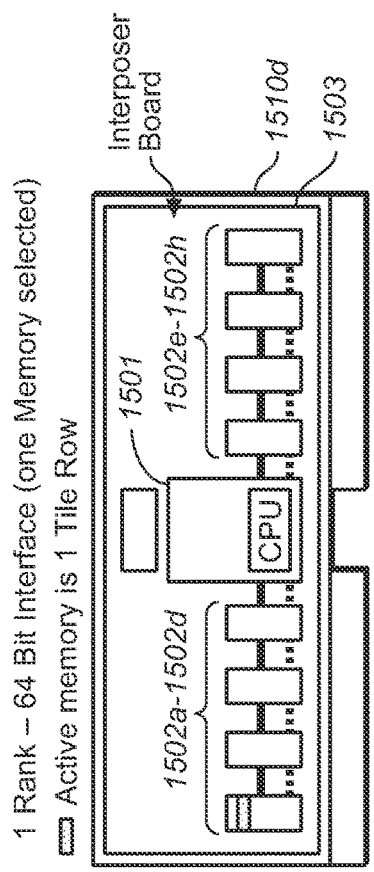

In FIG. 15(c), QV memory modules 1502a-1502h may be divided into four groups each including 2 QV memory modules, and processor 1501 accesses one of the four groups in each read or write operation. In this configuration, the QV memory may be accessed through one, two or four memory channels. When the QV DIMM receives or provides 64 bits of data per write or read operation, processor 1501 selects 32 bits of data from each QV memory module accessed.

Figure 15D:
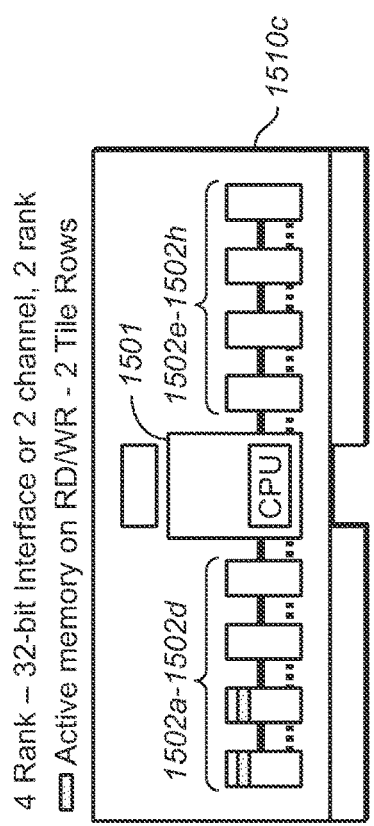

In FIG. 15(d), QV memory modules 1502a-1502h may be divided into eight groups each including a QV memory module, and processor 1501 accesses one of the eight QV memory modules in each read or write operation. In this configuration, the QV memory may be accessed through one, two, four or eight memory channels. When the QV DIMM receives or provides 64 bits of data per write or read operation, processor 1501 selects 64 bits of data from the QV memory module accessed. In this configuration, conductors for data routing between each QV memory module dies to the common memory interface bus of QV DIMM 1510d may be so numerous that an interposer (e.g., a separate printed circuit board layer, or a silicon substrate) may be required.

In each of FIGS. 15(a)-(d), because processor 1501 handles all read and write operations within QV DIMM 1510a-1510d, a complex scheme of data and control signal buffering into and out of the QV DIMM interface—often required for a DIMM supporting multiple memory modules through multiple memory channels—is not necessary. As a result, such a QV DIMM is both cost and board-space efficient. As discussed above, the complexity of processor 1501 depends on the in-memory computation expected to be carried out within the QV DIMM. Processor 1501, in the simplest cases, may be implemented by DMA and ALU circuits for QV memory module, as discussed above in conjunction with FIG. 7, with a single DIMM-wide processor acting as a controller.

Figure 16:
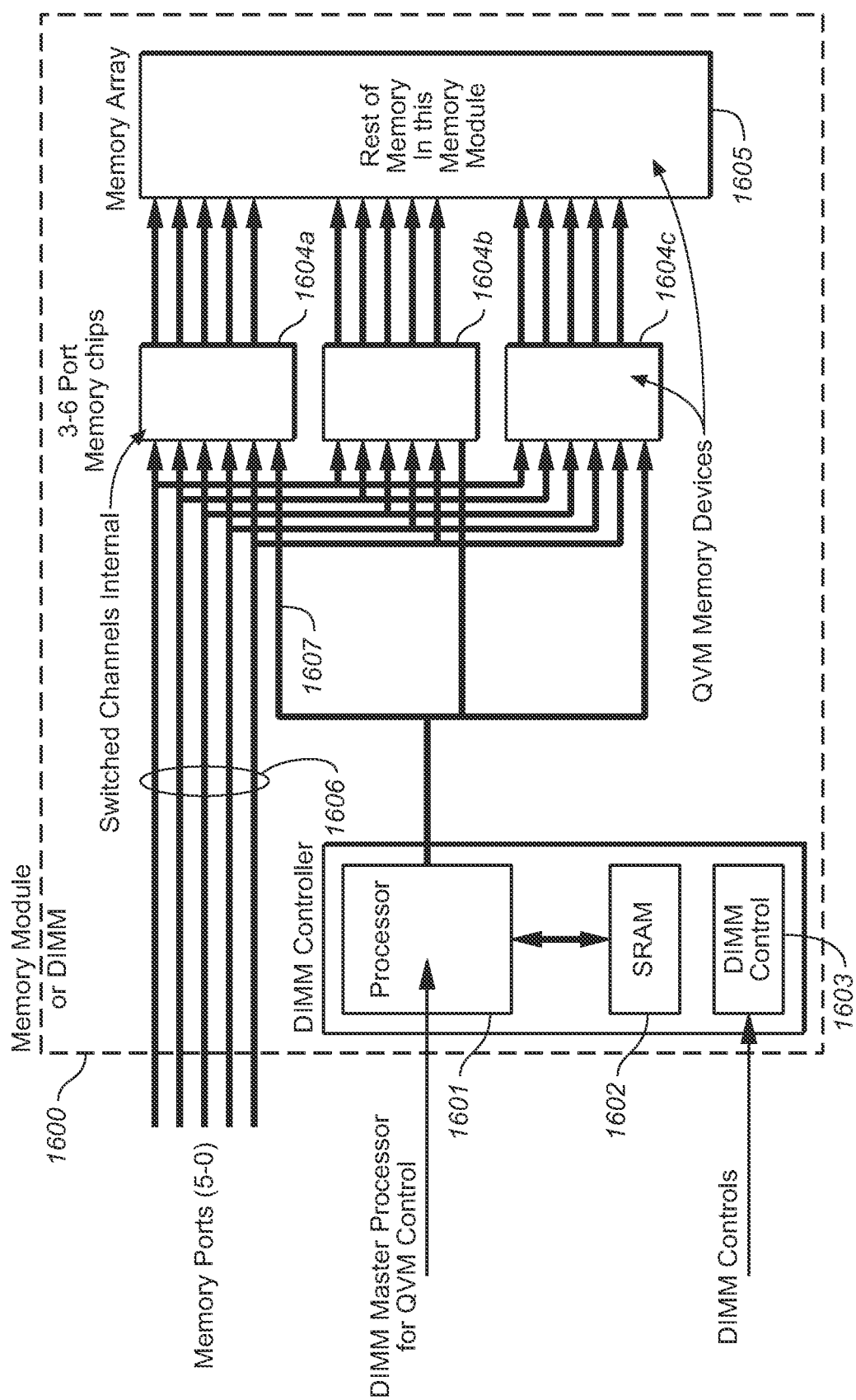
FIG. 16 is a functional block diagram showing QV DIMM 1600 that includes RISC processor 1601, which manages in-memory computation in the QV memory implemented with QV DIMM 1600, according to one embodiment of the present invention.

FIG. 16 is a functional block diagram showing QV DIMM 1600 that includes RISC processor 1601, which manages in-memory computation in the QV memory implemented with QV DIMM 1600, according to one embodiment of the present invention. in various DIMM configurations. With a QV DIMM controller that includes processor 1601 and SRAM 1602, QV DIMM 1600 implements a QV memory that handles high-level command issued from a host processor to be executed in the QV memory of QV DIMM 1600. QV DIMM 1600 preferably has two or more memory channels—provided over shared memory interface data bus 1606, for example—through which the QV memory implemented in QV DIMM 1600 may be accessed. As shown in FIG. 16, for example, the QV memory is implemented in QV memory modules 1604a-1604c and 1605, with QV memory module 1604a-1604c providing multi-port access to its memory arrays. With processor 1601 managing all memory access over shared control bus 1607, numerous in-memory computation tasks may be accomplished using the entire memory. For example, data may be copied or moved from any QV memory module to any other QV memory module within QV DIMM 1600. The combined computational power in the controller dies of each QV memory module, in combination with processor 1601, is suitable, for example, in many artificial intelligence applications.

Interface data bus 1606 may be shared by multiple QV DIMMs to create a still larger in-memory computation memory device. A "bidding" protocol may be provided to allow the processors in the QV DIMMs to gain access to interface data bus 1606 to gain access. The ability to interconnect multiple QV DIMMs enables both in-memory computation over a large amount of data and data transfers among the QV DIMMs with minimal host intervention. A conventional DIMM may provide 8-, 16- or 32-bit memory access per bus transaction. As a QV DIMM has a wide internal bus, a wider memory interface bus may be suitable for many applications. Application programming interfaces (APIs) that allow programmers to take advantage of the in-memory computation commands (e.g., copy, move, or search).

To exploit its computational capability, a QV DIMM may be used as a system device. For example, taking advantage that a QV memory may be configured as a non-volatile memory (e.g., flash memory) when specific programming conditions are met, a QV DIMM may be provided a flash memory interface. To support NVM read, write and erase operations, processor 1601 may serve as a flash controller. Because of its expected fast "save-to-flash" and "load-from-flash" operations, the QV DIMM provides a system device that allow the system a fast boot or the ability to save critical data (e.g., through regular journaling) and checkpoints in advance of system power interruption; such operations may be managed from the computing resources within the QV DIMM. In the prior art, these tasks are carried out in conjunction with a conventional storage system (e.g., a solid state disk) which is a significantly slower devices than a QV memory. The time required and the overhead cost incurred for such tasks limit both the frequency and the amount of critical data or checkpoints that can be saved. Also, by allowing a QV DIMM to be accessed from multiple memory channels, any portion of the QV memory may be shared among multiple devices. This data sharing ability is particularly suitable for transaction-based applications and where short tasks that are amenable to parallel processing may dominate (e.g., search applications).

According to one embodiment, when a read command is issued to a QV DIMM, a page of data corresponding to a specified address within the page is read through sense amplifiers and latched into holding registers or an associated portion of an SRAM. A convenient page size is 1 Kbits or 2 Kbits. The initial page access incurs an entire read access latency. In this regard, the initial access latency is the time between the beginning of row address decoding to data being ready at the memory interface. Preferably, an initial page access in a QV memory module requires less than 100 nanoseconds. For a subsequent read command of data within the same page, as the data has already been latched from the initial access into the holding registers or SRAM, the read latency has a significantly shorter duration: the time incurred between the access to the holding registers or the SRAM and data being available at the memory interface, which is about 20-40 nanoseconds or less. In most applications, memory accesses are for a 64-bit cache line or a 64-byte cache block. Since a 1 Kbit-page is 128 bytes or 16 8-byte cache lines. When an entire page is required, it is satisfied by the QV memory module incurring only one 100-nanosecond initial access, and 31 subsequent accesses of 35 nanoseconds each. In a QV memory module, the memory controller in the controller die tracks each page access to take advantage of the shorter durations of the subsequent accesses.

The QV DIMM can also support a conventional ready/busy protocol (e.g., the NVMDIMM-P standard). Under such a protocol, a memory access from the host processor may be stalled until data is ready, at which time the memory interface sends a ready signal to inform the host processor that the data requested from the memory access is ready at the memory interface. The processor of the QV DIMM monitors the availability of a page in the holding registers or the SRAM. If the page has not been fetched into the holding registers or the SRAM, the processor negates the ready signal until after the page has been fetched into the holding registers or SRAM and made available the requested data at the memory interface. However, if the data requested in the read access is already in the holding registers or the SRAM, the requested data is routed to the memory interface and the ready signal is asserted. To determine if the requested data is already fetched into the holding registers or the SRAM, the processor of the QV DIMM compares the bank, row and page addresses of the pages already fetched against the addresses of the requested accesses. Using the ready/busy protocol, the effective read latency of the QV DIMM may compare favorably with conventional DRAM-based memory performance.

Speculative prefetching additional contiguous pages into the SRAM may further amortize the latency of the initial memory access, as many programs access contiguous pages of data sequentially. By speculative prefetching is meant fetching the additional contiguous pages into SRAM based on a speculation that those pages would be required within the immediate future. Hereinafter, "prefetching" and speculative prefetching are used interchangeably.

In one implementation of a QV memory module, a 3-dimensional memory array within a tile has multiple planes of memory strings stacked one on top of another, with each memory string storing one or more pages of data. In that embodiment, also, each row address is shared in each tile by a set of consecutive pages of data that are stored in multiple planes of vertically aligned memory strings. For example, in one embodiment, each tile includes 4K ($2^{12}$) rows of memory cells in eight planes. In each tile, each row address encompasses eight planes of eight consecutive 1 Kb-page or 2 Kb-page, or 8 Kbits or 16 Kbits of data. In some embodiments, even higher memory density may be achieved by having greater number of pages of data in each plane, or by having additional planes in each tile. Each read or write access results in a transfer of all pages of data sharing that row address ("active pages") to SRAM. In addition, pages corresponding to one or more contiguous row addresses may also be prefetched into SRAM. For example, pages residing in adjacent tiles that are also activated by virtue of having the same row address are also fetched. These pages, which are mapped to contiguous page addresses to the address specified for the read or write operation may also be prefetched into the SRAM, if desired. As prefetching may be overlapped with servicing the read accesses to already cached pages, prefetching reduces the effective access latencies.

One variation caches a predetermined number of memory blocks, based on a strategy that reduces access latency by spreading the data across memory blocks that are written or output through independent sets of drivers or sense amplifiers. For example, each memory block may encompass all pages in the QV memory that are activated by the same row address in all tiles of a tile row ("active pages"). As each tile in the tile row are written or outputs to a different set of drivers or sense amplifiers, the active pages may be loaded into SRAM memory independently (e.g., in parallel, or in any suitable overlapping, pipelined manner). Overlapping accesses to the active pages significantly reduces their effective individual access latencies. Prefetching and caching a predetermined number of active memory blocks in SRAM not only reduces latency (e.g., achieving an effective read latency close to that of SRAM (e.g., 20-25 nanoseconds)), but also increases throughput. When programmers and compilers are made aware and take advantage of overlapping accesses, the reduced latency can be achieved at a high probability, thus resulting in efficient program execution.

FIGS. 17(a)-(b) provide a functional view of a read path from tile 1711 in memory die 1701 to memory interface 1712 of controller die 1702 in QV memory module 1700, according to one embodiment of the present invention. As shown in FIG. 17(a), tile 1711 includes 4K ($2^{22}$) rows, with each row (e.g., row 1717) having multiple 2K-bit pages of memory cells (e.g., one or more 2K-bit pages per plane). FIG. 17(b) shows that, within each row (e.g., row 1717), page decoders 1719a-1719n activate the 2K-bit pages (e.g., pages 1718a-1718n) individually for sensing by sense amplifiers 1713. Each sensed page is latched from sense amplifiers 1713 into SRAM 1714a. FIG. 17(a) shows caching in SRAM 1714a of memory die 1701 (2K-bit) and SRAM 1714b of controller die 1702 (128K-bit). When controller die 1702 is fabricated using an advanced manufacturing process for logic circuits, SRAM 1714b has a greater density than SRAM 1714a, and thus can achieve a greater capacity for a given silicon area. In some instances, the capacity of SRAM 1714b may be limited by the space available after providing for such logic circuits as RISC processors and multiple interfaces for memory channels. In any implementation, the capacity trade-off between available SRAM capacity and logic circuits in the controller die depends on its specific application. In some embodiments, non-volatile memory required by some applications may be provided in QV memory module 1700 either on memory die 1701 or controller die 1702. Providing non-volatile memory in QV memory module 1700 enables storing of critical data, checkpoint data or other critical system data.

In a programming operation of a QV memory, data is written into an erased memory cell. Thus, an erase operation often precedes a program operation. The combination of an erase operation and a following program operation is collectively referred to as a "write sequence." In one embodiment, each erase or programming operation for a 256-KB page requires approximately 500 nanoseconds, so that the latency of a write sequence is about one microsecond. If write request into an 8-byte cache line always triggers a write operation into the QV memory, it is possible to have 32 write sequences in each 2 Kbit-page cached in SRAM. Such frequent write operations into the QV memory can be detrimental to endurance in the QV memory. To reduce this detriment, a write command from a host processor may be queued, though the data in the write command is immediately incorporated into the cached page in SRAM, together with recalculated error correction codes (ECC). At a later time, cache controller 1715 performs the write command by writing the data in SRAM into the QV memory. Until the queued write command is completed in QV memory, any read access to the page may be served from the cached page in SRAM. The writing of a cached page into the QV memory may be deferred until a different page mapped to the same SRAM locations is required in a subsequent read or write command ("switching of active pages"). Substantially the same approach may be adopted for the memory block caching discussed above. This deferred write-back policy significantly enhances endurance in the QV memory. A write operation of a page, a memory block or even a file under the present invention may therefore combine numerous write commands from the host processor over an extended time period, thus results in power savings and better endurance.

Cache controller 1715 carrying out the caching policies described above may be implemented in software, firmware, or both. When a read or write access to a page results in a switching of active pages, and the pages to be evicted incorporates data specified at least one queued write operation, wait states may be generated to stall the read or write access. As mentioned above, the write sequence may take up to a microsecond. Prefetching contiguous pages allowing overlapping the write sequences of the evicted pages, so that the switching of active pages may complete before the actual commands for accessing the replacement pages are received from the host processor. Prefetching thus hides the write latencies of the evicted pages. It is possible that a read access to one of the active pages may arrive while a write access to that page is completing. One approach for handling such a read access is to suspend the ongoing incomplete write operation and to service the read access from SRAM before resuming the write operation. Such an approach is justifiable only when the erase operation within the write sequence is substantially longer than the programming operation in the write sequence. When a write sequence requires a sufficiently short duration, halting an ongoing write sequence to service a read access is unnecessary.

When a write request is received for a data in a page that does not have a queued write command, the write request is accomplished by a "read-modify-write" sequence. During a read-modify-write sequence, the page is first cached in SRAM, which may require a switching of the active pages. The cached page is then modified in SRAM, according to the current write request and, simultaneously, a write operation of the cached page back into the QV memory is queued. If all previous write requests to an active page have been completed at the time of the write request, the write request is satisfied by (i) modifying the cached page in SRAM, and (ii) queuing a write operation for writing back into the QV memory. When a write request is received for an active page with an incomplete queued write operation, the write request may be accomplished by: (i) waiting until the previous write operation is complete, if already initiated, (ii) modifying the cached page in SRAM according to the current write request, and (iii) queuing a write operation to write back the cached page into the QV memory. If the previous write operation to the QV memory has not been initiated, the write request may be satisfied by: (i) merging the data for the current and previous write requests in the cached page in SRAM, (ii) canceling the previous queued write operation, and (iii) queuing a new write operation with the merged data back into the QV memory. In the meantime, any read access may be serviced from the cached, updated page in SRAM. A page in the QV memory that has a write operation queued need not be refreshed. Any queued write operation on a page in the QV memory may be allowed to proceed at the page's appointed refresh time.

Figure 18:
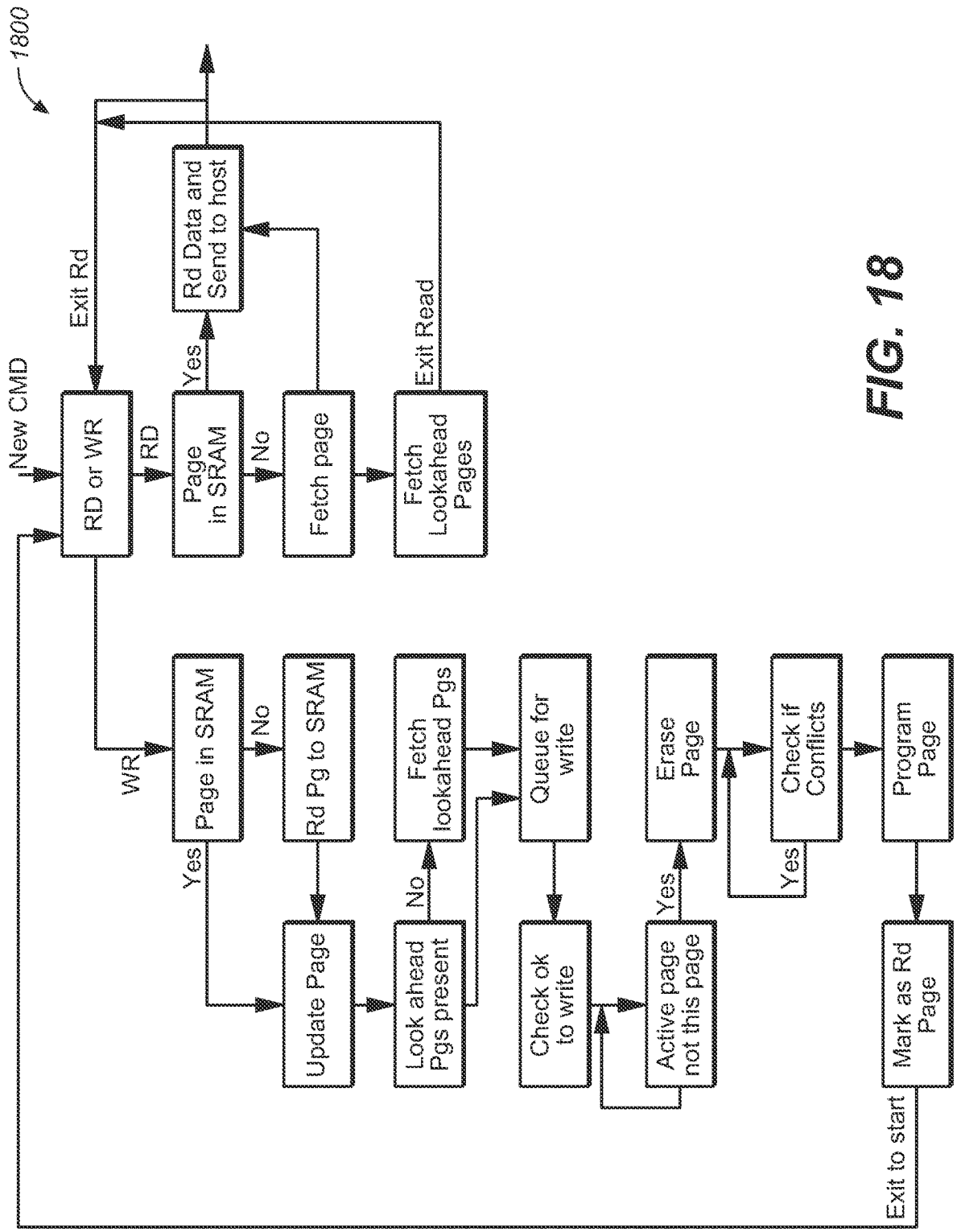
FIG. 18 shows simplified flow chart 1800 for a cache controller (e.g., cache controller 1715), according to the prescribed cache policies, in accordance with one embodiment of the present invention.

FIG. 18 shows simplified flow chart 1800 for a cache controller (e.g., cache controller 1715), according to the cache policies described above, in accordance with one embodiment of the present invention. (FIG. 18 omits some non-essential details for clarity reasons, such as calculation or recalculation of ECC.) The following is a list of functional tasks for a cache controller of the present invention:

1. Receive a Read or Write Command;
2(a) For a Read command (i) if the requested data is in one of the active pages in SRAM (i.e., already cached), service the Read command from SRAM; (ii) otherwise, retrieve and cache into SRAM the page with the requested data from the QV memory, and service the Read command from SRAM;
2(b) For a Write command (i) retrieve and cache into SRAM the page corresponding to the address specified in the Write command from the QV memory;

(ii) merge the data specified in the Write command into the cached page; and (iii) queue a write sequence for the cached page;
3. Prefetch contiguous pages (if desired) following caching of a page from the QV memory into SRAM;
4. When performing a queued write operation of an active page into the QV memory, wait until all prefetching of pages related to the active page are complete. If so, the write operation may proceed. Otherwise, defer the queued write operation until such prefetch operations are complete.
5. If the Read command results in a switching of active pages, activate wait states using a ready/busy protocol. If wait states are not supported, return an error signal that informs the host processor to retry at a later time according to a suitable retry policy.

Regarding a switching of active pages (i.e., the requested page is not currently cached in the SRAM), if a ready/busy protocol is not used, reporting an error as the host processor is preferable than to have the host processor wait for the replacement pages to load. Suitably timed, a retry by the host processor would find the replacement page already loaded in SRAM. In one embodiment, a QV memory may require 100 nanoseconds to bring the requested page into SRAM and 25 nanoseconds to perform a subsequent read of the cached page. Thus, an access time of 125 nanoseconds per cache miss may be achieved, not including any overhead latency in the cache controller. In most applications, a cache miss should be a relatively rare event, so that excessive cache misses is indicative that the cache policy is not suitable for the application. A suitable error logging—which may be as simply as an error counter—provides an indicator for tuning the cache policy. In one implementation, a bit in a configuration register may be set when the accumulated number of errors exceed a predetermined threshold, so as to thereby alert the host processor. The set bit may be cleared by the host processor, after adjusting or changing the cache policy, if desired, in the cache controller.

In most applications, a virtual address translates into a physical address in conventional DRAM that points to a 4-kbyte (4-KB) block of memory, which is also the customary size for a disk cluster. As the memory image of a user task ("job") may be advantageously partitioned into many 4-KB blocks, which are likely loaded from disk at different times by a virtual memory system into different locations in the memory. To access a loaded memory block, the host processor typically uses a logical-to-physical address translation table, often provided in a set of conversion registers. This arrangement suggests that the number of pages in a suitable multiple of 4-KB blocks may be an appropriate unit of data ("fill size") to be prefetched into memory. The fill size may be a parameter that can be initialized at system start-up.

Figure 19:
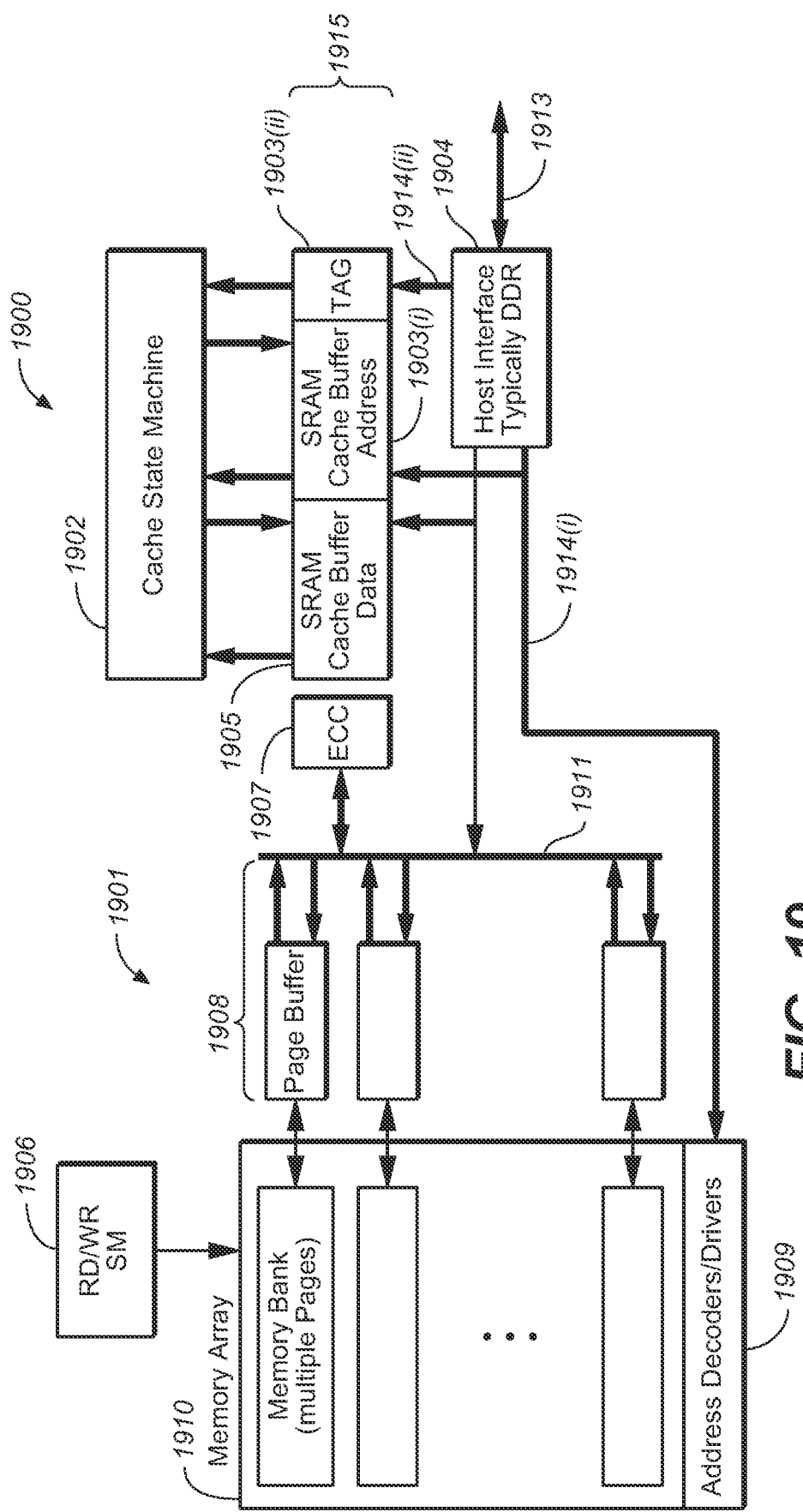
FIG. 19 is a block diagram illustrating the operation of cache controller 1900 on QV memory 1901, in accordance with one embodiment of the present invention.

FIG. 19 is a block diagram illustrating the operation of cache controller 1900 on QV memory 1901, in accordance with one embodiment of the present invention. As shown in FIG. 19, cache controller 1900 includes (i) cache state machine 1902, which is a circuit that controls the operations of cache controller 1900, (ii) SRAM cache buffers 1915, including data cache 1905 and address buffers 1903, and (ii) host interface circuit 1904 (e.g., an industry-standard DDR memory interface), which controls memory interface bus 1913. Data cache 1905 and address buffers 1903—which includes address registers portion 1903(i) and tag portion 1903(ii)—provide a data cache for QV memory 1901 in a conventional manner (e.g., implementing at least tag portion 1904(ii) as a content addressable memory circuit). In conjunction with SRAM cache buffers 1915, QV memory 1901 provides a high-speed memory accessible by a host processor over host interface circuit 1904.

In FIG. 19, QV memory 1901 includes (i) memory array 1910, (ii) read-write state machine 1906, which controls both read and write operations in QV memory 1901, (III) address decoders and input and output drivers circuit 1909, (iv) page buffers 1908, (v) ECC circuit 1907, and (vi) data bus 1911. An address presented by the host processor for a read or write access over host interface 1904 is provided over address bus 1914(i) to be checked by cache state machine 1902 against address buffer 1903(i) to determine if the data in the read or write request is already cached in data cache 1905. If so, for a read operation, the requested data is read from the cached page in data cache 1905 and returned to the host processor. For a write operation, the data presented by the host processor on memory interface bus 1913 is merged into the cached data and a write operation is queued to have the merged data written back to QV memory 1901 at a subsequent time, as discussed above. Otherwise, i.e., the data in the read or write operation is not already resident in SRAM data cache 1905, cache state machine 1902 causes read-write state machine 1906 to latch the address of the read or write request into an address buffer in circuit 1909, the address being provided over address bus 1914(i), and to initiate the requested read or write operation. For a read operation, the data requested is output to data buffers 1908 and driven by circuit 1909 onto data bus 1911 for caching in SRAM data cache 1905 and for host interface 1904 to output the requested data to the host processor. For a write operation, cache state machine 1902 executes the read-modify-write operation, as discussed above, in conjunction with read-write state machine 1906.

Figure 20A:
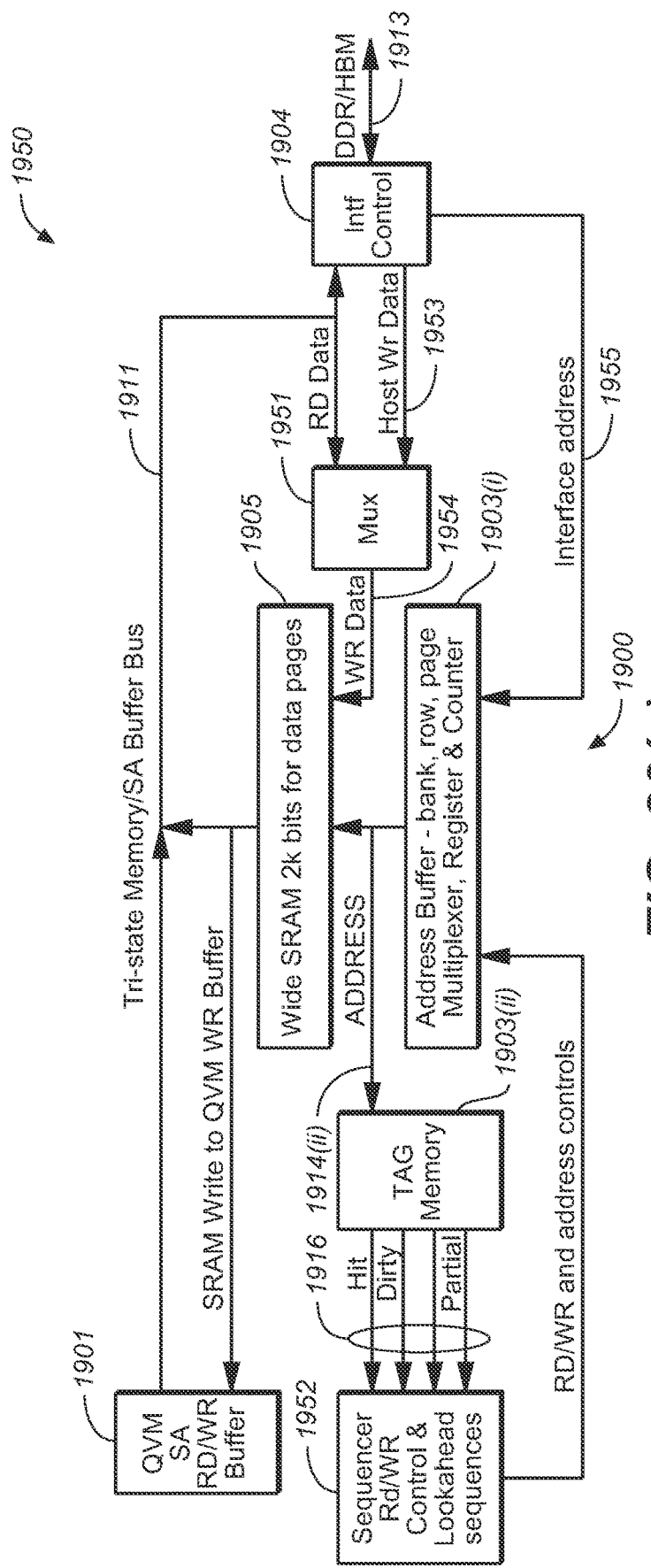
FIG. 20(*a*) illustrates detailed operations of implementation 1950 of cache controller 1900, in accordance with one embodiment of the present invention.

A good prefetching policy that varies according to system operating characteristics is especially advantageous. In one embodiment, cache state machine 1902 includes monitoring circuitry to allow a system analyst to devise and improve a prefetching policy to attain optimal operations. FIG. 20(a) illustrates in greater detail the operations of implementation 1950 of cache controller 1900, in accordance with one embodiment of the present invention. As mentioned above, in a write operation, the data received from the host processor on memory interface bus 1913 is merged into the cached page in SRAM cache 1905 and queued for a subsequently write operation into QV memory 1901 under control of cache state machine 1902.

FIG. 20(a) shows host interface circuit 1904 providing the write data on memory interface bus 1913 onto host write data bus 1953, from which the write data is driven by multiplexer 1951 onto write data bus 1954 for latching into data buffer 1905. For a read operation, the data retrieved from page buffers 1908 in QV memory 1901 is provided on data bus 1911, from which the data is driven by host interface circuit 1904 onto memory interface bus 1913, while concurrently provided by multiplexer 1951 on write data bus 1954. From memory interface bus 1913, the address specified by the host processor for each read or write operation is routed by host interface circuit 1904 to address bus 1955, from which the address is latched into address buffer 1903 (i.e., address portion 1903(i) and tag portion 1903(ii)) through address bus 1914(ii). When data is written back into QV memory 1901 under control of sequencer 1952, which is part of cache state machine 1902, the address and the cached data are provided on address bus 1914 (see, FIG. 19) and data bus 1911, respectively.

In a read operation, data is normally read from data buffer 1905 and provided to the host processor over memory interface bus 1913; concurrently, based on tag portion 1903(*ii*) of address buffer 1903, sequencer 1952 prefetches additional pages from QV memory 1901 into data buffer 1905. Tag portion 1903(*ii*) may be a content address memory that not only indicates through a "hit/miss" bit if the data associated with the address specified in the read request is cached (i.e., a cache hit), but also signals through a "dirty bit" when there is one or more pending write request to write the cached data back to QV memory 1901. These signal bits guide sequencer 1952 whether or not to prefetch additional pages or to write back cached pages back to QV memory 1901. Sequencer 1952 may include circuits for monitoring memory operations and matching prefetching and write back policies according to any detected access patterns in the monitored memory operations.

When QV memory 1901 is multi-ported (i.e., accessible over two or more data buses), a separate cache controller may be provided on the controller die for each port. Each port may operate its associated memory partition independently, with data buffer 1905 being partitioned such that each partition corresponds to a specific non-overlapping portion of QV memory 1901. Alternatively, data buffer 1905 may be shared among the ports, with a port control bit allocated in tag portion 1903(*ii*) to indicate which port has access to the corresponding portion of QV memory 1901. In that configuration, a single cache controller may be provided to service all ports. The choice of cache controller organization depends, for example, on how QV memory 1901 is to be shared and whether or not one or more RISC processors are present.

A high hit rate is essential to high system performance. For example, when retrieving the requested data from cached data requires 25 ns and 100 ns otherwise, a 98% hit rate results in an effective access time of 0.98×25+0.02×100=27 ns. Such performance outperforms most DRAMs. In addition, cache usage and deferred write operations improve endurance, disturb and power performances in QV memory 1901.

In some embodiments, block-level caching is accomplished in QV memory 1901, when QV memory 1901 is organized in banks of memory blocks. In this configuration, as illustrated by system 1970 of FIG. 20(*b*), data buffer 1905 is partitioned into SRAM blocks 1905(*i*), . . . , 1905(*n*), each the size of a memory block of QV memory 1901. Each SRAM block in data buffer 1905 caches a memory block in the corresponding bank of QV memory 1901. Although each SRAM block requires a separate, independent cache controller (i.e., cache controllers 1952(*i*), . . . , 1952(*n*)), each cache controller may be relatively simple in implementation with limited capabilities. System 1970 is particularly suited for applications with frequent write operations. With most accesses serviced from the SRAM blocks, the long write latencies are hidden and improved endurance may be expected.

Figure 20B:
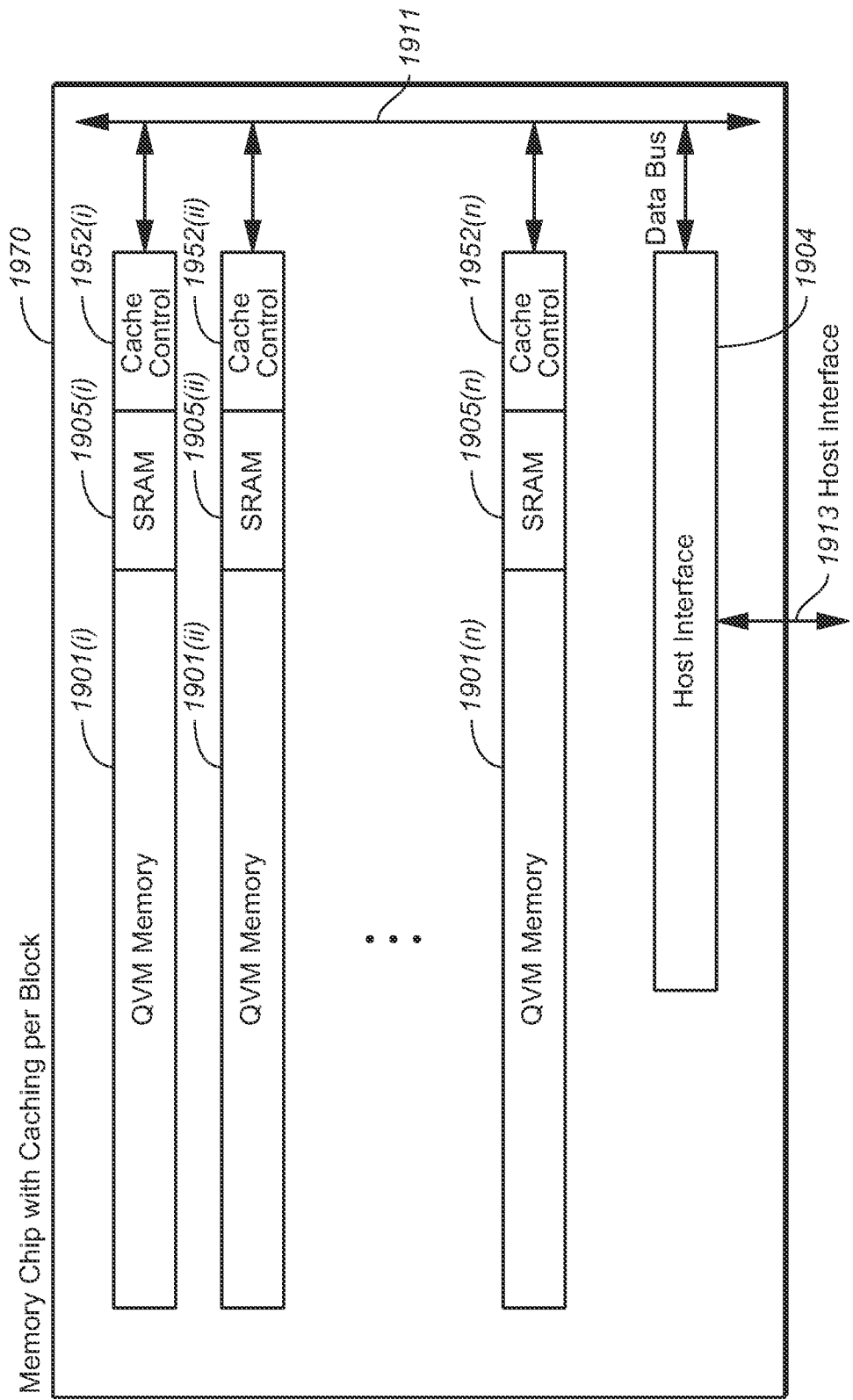
Figure 20C:
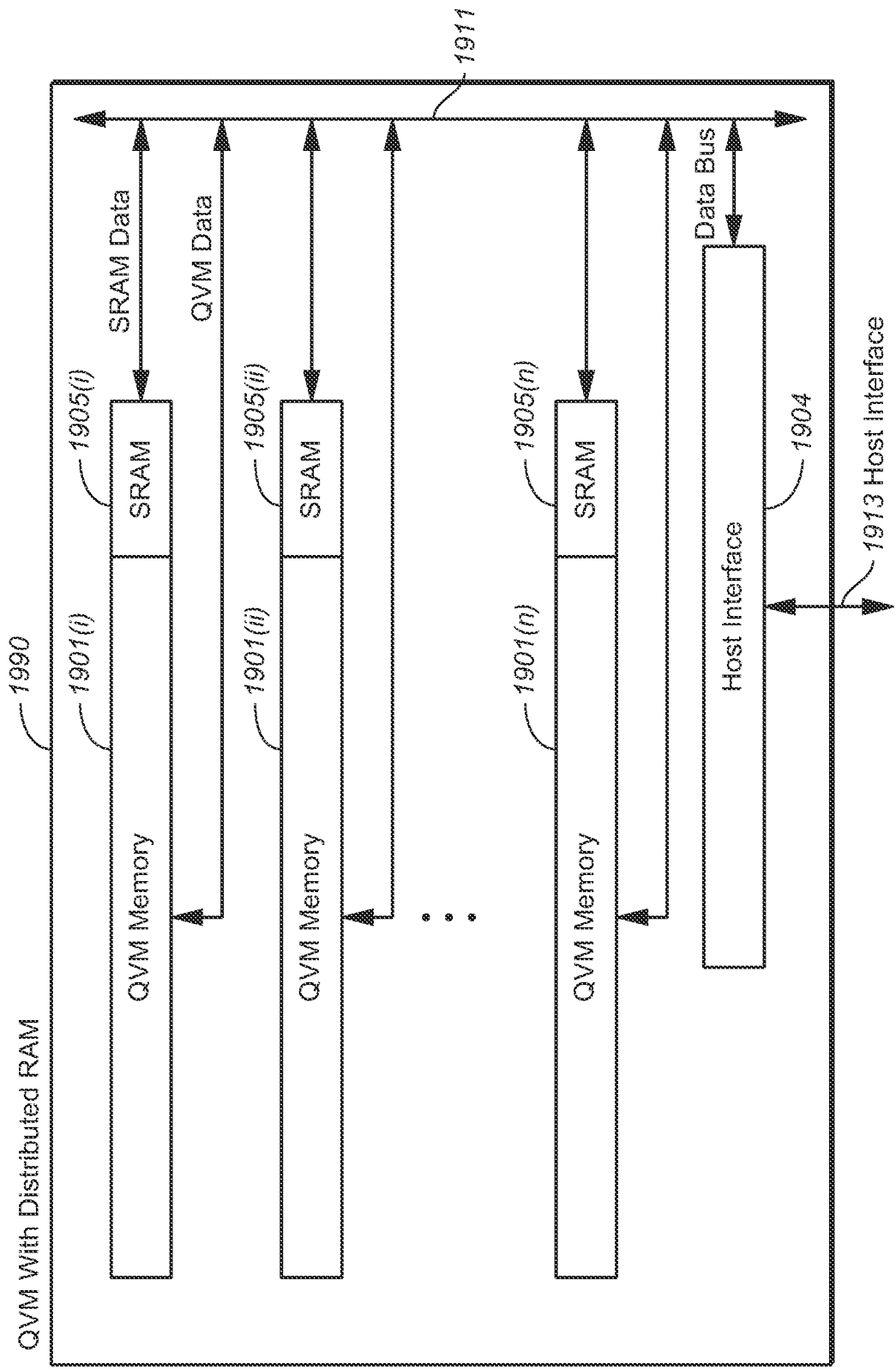

FIG. 20(*c*) shows system 1990 in which SRAM data buffer 1905 is separately addressed from QV memory 1901, in accordance with one embodiment of the present invention. As shown in FIG. 20(*c*), memory blocks 1901(*i*), . . . , 1901(*n*) of QV memory 1901 are assigned contiguous addresses and SRAM blocks 1905(*i*), . . . , 1905(*n*) of data buffer 1905 may assigned contiguous addresses in an address space that is above or below the address space assigned to memory blocks 1901(*i*), . . . , 1901(*n*). Alternatively, memory blocks 1901(*i*), . . . , 1901(*n*) may each be allocated a range of addresses, with a predetermined address gap between adjacent memory blocks. These address gaps are assigned to SRAM blocks 1905(*i*), . . . , 1905(*n*), respectively. This organization is advantageous in certain applications where a host processor may assign the SRAM blocks for storage of frequently accessed critical data (e.g., file meta-data, critical tables, or directories) to ensure that such data may be accessed with short access latencies. Advantageously, in in-memory computation applications, the SRAM blocks may also be accessible from one or more onboard processors.

In some embodiments, the cache function may be handled or augmented by a controller in the QV DIMM. The controller ("QV DIMM controller") may be implemented, for example, by a RISC processor in the QV DIMM. Such a RISC processor may act as a master to numerous slave in-memory computation units, controlling the assignment of in-memory computation tasks to the slave processors operating on data stored in the QV memory. In one embodiment, the QV DIMM controller parses a high-level computation command and renders numerous low-level in-memory computation commands to be executed by the numerous slave in-memory computation units. Under this arrangement, a large logic area in the controller die of each QV memory may be allocated for additional data processing functionalities (e.g., memory channels or any system function controlled or implemented by RISC processors) to be included.

Figure 21:
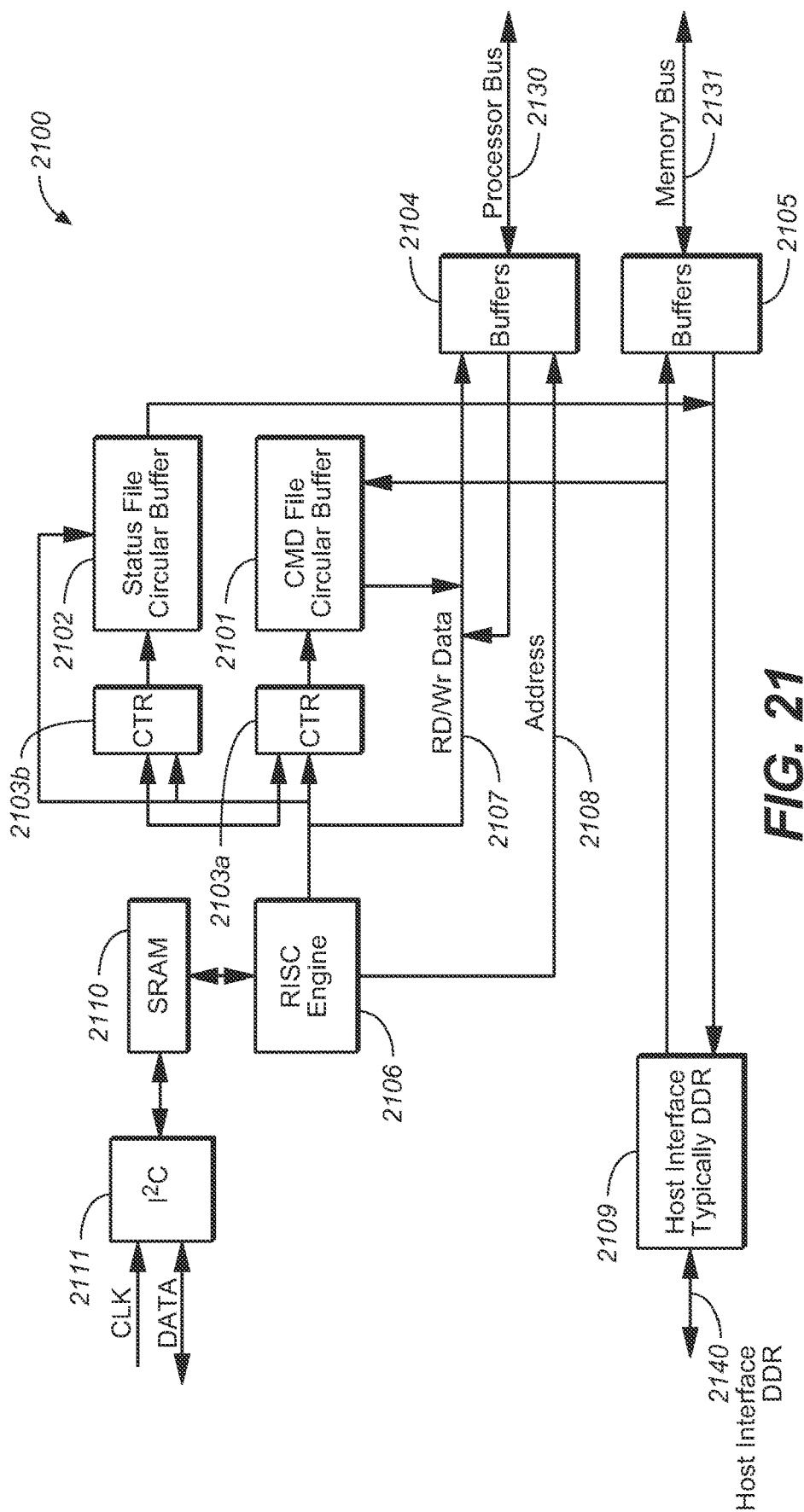
FIG. 21 shows DIMM controller 2100, including RISC processor 2106, command buffer 2101 and status buffer 2102 that enable in-memory computation commands, in accordance with one embodiment of the present invention.

FIG. 21 shows QV DIMM controller 2100, including RISC processor 2016, command buffer 2101 and status buffer 2102 that enable in-memory computation commands, in accordance with one embodiment of the present invention. As shown in FIG. 21, RISC processor 2106 monitors host interface bus 2140 for an in-memory computation command. Such a command may be expressed by a write operation to a special address (i.e., an address-mapped command). Through control logic circuit 2103a, the in-memory computation command is loaded into command buffer 2101. RISC processor 2106 may decode the in-memory computation command into one or more operations and their associated operands (if any), which are loaded into buffers 2104 and 2105, respectively, to be carried out in an appropriate portion of the QV memory. The operations and their associated data are delivered to the designated portion of the QV memory via processor bus 2130 and memory bus 2131, respectively. RISC processor 2106 may monitor the status of the operations. Status information may be stored in status buffer 2102 and may allow query by the host processor through one or more status commands QV DIMM controller 2100 provides a set of scalable, systematized in-memory computation commands and status queries, rather than an ad hoc set of registers distributed among the partitions of the QV memory.

According to one embodiment of the present invention, a flash port (not shown) may be included in a QV DIMM controller (e.g., QV DIMM controller 2100), which allows a portion of the QV memory to be operated as NVM. In that configuration, data of an essential nature in the QV memory may be archived in the NVM portion. Data in the NVM portion may be recovered after a power loss. The NVM portion may also be used for storing firmware for RISC processor 2106, thereby facilitating QV DIMM controller 2100's booting-up. The NVM portion obviates persistent memory software and API's for persistent write operations. The NVM portion may be mirrored in the QV memory for faster read operations.

Figure 22:
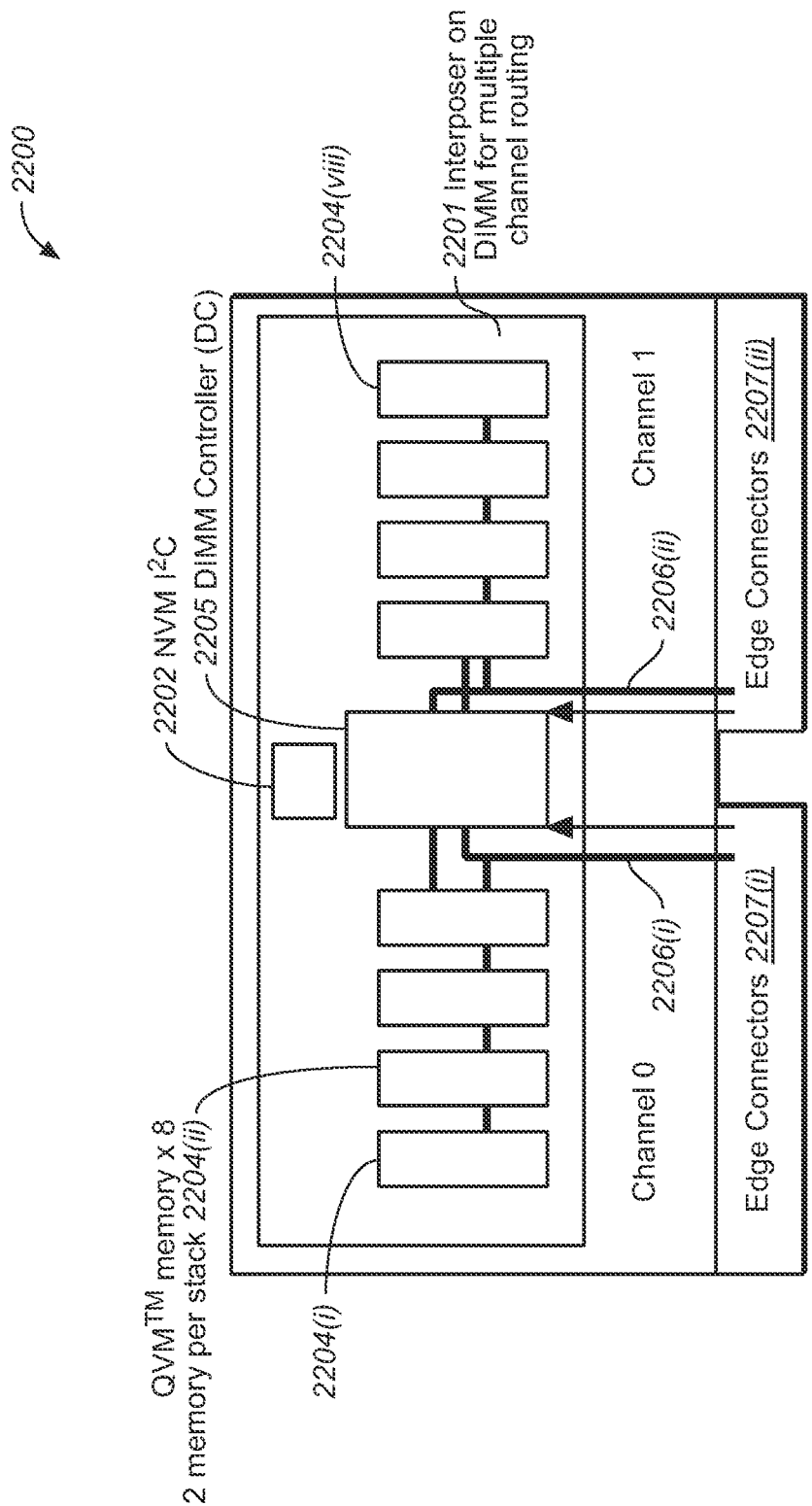
FIG. 22 shows interposer device 2201 (e.g., a silicon substrate) in QV DIMM 2200, which accommodates the required wiring among the QV memory modules and one or more processors (e.g., provided on one or more dies or modules), according to one embodiment of the present invention.

Including additional ports in the QV memory implemented in a QV DIMM affects how signals are routed within the QV memory. The complexity in the QV memory or the QV DIMM cache controller may require accommodation in the packaging technology. For example, the QV memory may be provided by multiple QV memory modules each including multiple layers of memory dies to attain a very high memory capacity. FIG. 22 shows interposer device 2201 (e.g., a silicon substrate) in QV DIMM 2200. Interposer device 2201 accommodates the required wiring among the QV memory modules and one or more processors (e.g., provided on one or more controller dies in each QV memory modules). As shown in FIG. 22, NVM module 2202, QV memory modules 2204(i)-(viii), and QV DIMM cache controllers 2205 are interconnected by conductor groups 2206(i) and 2206(ii) and organized as respective memory channels on interposer device 2201. Interposer device 2201 allows routing multiple memory channels on a planar surface of a single silicon substrate. In addition, TSVs may be provided in the silicon substrate of interposer device 2201 to allow mini-balls provided on an opposite planar surface to connect with a host processor or another external circuit over an industry-standard memory interface (e.g., DDR). Access to the industry-standard memory interface may be provided by edge connectors on an attached printed circuit board (PCB). Alternatively, as shown in FIG. 22, PCB edge connectors 2207(i) and 2207(ii) are attached and interconnected by conductor groups 2206(i) and 2206(ii) to interposer device 2201 to allow external access to the memory channels over one or more memory interfaces (not shown).

For an even higher capacity QV memory, a ball-grid array socket may be used in place of edge connectors. FIGS. 23(a) and 23(b) are, respectively, exemplary side and top views of implementations of ball-grid array socket-based system 2300, including interposer device 2301, according to one embodiment of the present invention. As shown in FIG. 23(a), ball-grid array socket-based system 2300 includes QV memory module 2304, GPU 2303, CPU 2305, memory interface circuits 2308(i) and 2308(ii), and FPGA circuit 2310 provided and interconnected by conductors on a first planar surface of interposer device 2301. As mentioned above, interposer device 2301 may be a silicon substrate with mini-balls connectors provided on the opposite planar surface, which are connected to conductors on the first planar surface through TSVs in interposer device 2301. Socket 2309 includes high-density pins or other connectors for external access; the high-density connectors of socket 2309 are connected to the mini-balls on interposer device 2301 using a suitable technology (e.g., a zero force socket that can use lever-applied force to hold interposer device 2301 against socket 2309 for solid connections). System 2300 thus provides a very dense and low-power solution that incorporate various processors or computing devices (e.g., CPU 2303, GPU 2305 or FPGA circuit 2310) at reduced routing connect distances to a high-capacity QV memory. QV memory module 2304 may have any number of memory and controller dies incorporated therein to achieve any suitable memory capacity. QV memory module 2304 is a low-power device, resulting from both a relatively infrequent refresh requirement and short interconnection distances among the memory dies.

Figure 24:
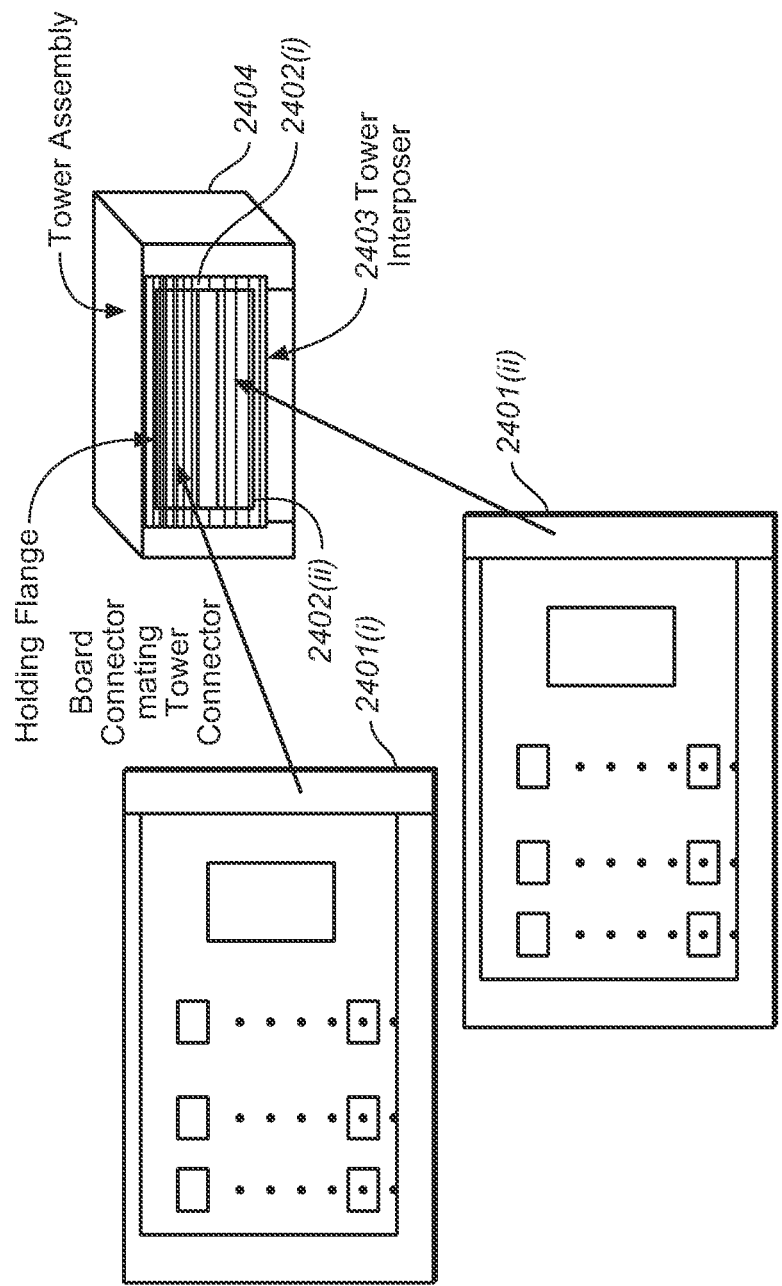
FIG. 24 shows package 2400 which includes multiple system boards (e.g., system boards 2401*a* and 2401*d*) interconnected by tower connectors 2402*a* and 2402*b* that engage the board connectors on the system boards.

Even higher density may be achieved by stacking, for example, multiple system boards each connected by edge connectors or sockets, with each system board having a structure such as those illustrated in FIG. 22 (e.g., edge connector-based) or FIGS. 23(a) and 23(b) (socket-based). FIG. 24 shows package 2400 which includes multiple system boards (e.g., system boards 2401(i) and 2401(ii)) interconnected by tower connectors 2402(i) and 2402(ii) that engage the board connectors on the system boards. Additional interconnections may be provided by tower interposer device 2403, which may have a structure such as that described above for interposer device 2201, for example. The stacked structure, including tower interposer device 2403 may be encapsulated in housing 2404 implemented using any suitable package technology. Package 2400 provides for a dense solution that can be incorporated into a system using, for example, a conventional DIMM interface or an PCIe interface, similar to the PCIe interface to a conventional RAM-disk attachment. Package 2400 offers a flexible, high-density memory attachment.

The above detailed description and its accompanying drawings are provided to illustrate specific embodiments of the present invention and are not intended to be limiting. Numerous modifications and variations are possible and are encompassed within the scope of the present invention. Various aspects of the present invention are set forth in the following Claims.

We claim:

1. A memory device, comprising:
a first plurality of modular memory circuits, each comprising a plurality of thin-film storage transistors, formed above a planar surface of a first substrate;
a second plurality of modular memory circuits, comprising a plurality of thin-film storage transistors, formed above a planar surface of a second substrate, wherein (i) both the first and the second substrates each have formed therein through-silicon vias; (ii) the through-silicon vias of the first substrate are electrically connected with the first plurality of modular memory circuits and the through-silicon vias of the second substrate are electrically connected with the second plurality of modular memory circuits, and (iii) the first plurality of modular memory circuits and the second plurality of modular memory circuits are organized into a plurality of partitions, wherein each partition (a) comprises a plurality of modular memory circuits from both the first plurality of modular memory circuits and the second plurality of modular memory circuits, and (b) is assigned to a portion of an address space which does not overlap the portions of the address space assigned to other partitions; and
a memory controller circuit formed on a third substrate, wherein (i) the memory controller circuit comprises a plurality of memory channel controller each communicating data and control signals with one or more partitions through the through-silicon vias in the first substrate and through the through-silicon vias in the second substrate; and (ii) each memory channel controller comprises a first logic circuit for handling memory addresses, a second logic circuit for handling data stored or to be stored in the partition, and an arithmetic logic unit operating in conjunction with the first logical circuit and the second logic circuit.

2. The memory device of claim 1, wherein a portion of the data and control signals are communicated further over wafer-bonds between the first and the substrates.

3. The memory device of claim 2, wherein the wafer-bonds comprise hybrid-bonds.

4. The memory device of claim 3, further comprising a memory interface that allows access to the memory device by a host processor.

5. The memory device of claim 4, further comprising a multiplexing circuit that connects the memory interface to any one of the memory channel controllers.

6. The memory device of claim 5, further comprising one or more additional memory interfaces, wherein the multiplexing circuit connects any one of the additional memory interfaces to any one of the partitions.

7. The memory device of claim 5, wherein a bidding protocol regulates access to each memory channel controller from any of the memory interfaces, such that the memory channel controller is accessed from exactly one of the memory interfaces at any given time.

8. The memory device of claim 7, wherein each memory interface is configured to access multiple partitions.

9. A memory device, comprising:
a memory interface that allows access to the memory device by a host processor;
a first plurality of modular memory circuits, each comprising a plurality of thin-film storage transistors, formed above a planar surface of first substrate, wherein the first plurality of modular memory circuits are organized into a plurality of partitions, each partition being assigned to a portion of an address space which does not overlap the portions of the address space assigned to other partitions;
a second plurality of modular memory circuits, comprising a plurality of thin-film storage transistors, formed above a planar surface of a second substrate, wherein (i) both the first and the second substrates each have formed therein through-silicon vias; and (ii) the through-silicon vias of the first substrate are electrically connected with the first plurality of modular memory circuits and the through-silicon vias of the second substrate are electrically connected with the second plurality of modular memory circuits;
a memory controller circuit formed on a third substrate, wherein (i) the memory controller circuit communicates data and control signals with the first plurality of modular memory circuits through the through-silicon vias in the first substrate and with the second plurality of modular memory circuits through the through-silicon vias in the second substrate, (ii) the memory controller circuit comprises a plurality of memory channel controllers each providing data and control signals to the modular memory circuits of a corresponding one of the partitions; and (iii) each memory channel controller comprises an arithmetic logic unit, a first logic circuit for handling memory addresses, a second logic circuit for handling data stored or to be stored in its partitions, wherein the arithmetic logic unit is shared between the first and second logic circuits; and
a multiplexing circuit that connects the memory interface to any one of the memory channel controllers.

10. The memory device of claim 9, wherein the arithmetic logic unit is part of the first logic circuit.

11. The memory device of claim 9, wherein the arithmetic logic unit generates the address used for a direct memory access operation within the partition.

12. The memory device of claim 10, the arithmetic logic unit performs incrementing and decrementing of the address by a specified value.

13. The memory device of claim 12, wherein the memory channel controller operates a copy operation that moves data from one portion of the partitions to another portion of the partitions.

14. The memory device of claim 13, wherein the copy operation moves data in units of pages, wherein each page comprises at least 512 bits.

15. The memory device of claim 9, wherein the arithmetic logic unit operates a search operation on the data stored in the partition.

16. The memory device of claim 9, wherein the arithmetic logic unit performs arithmetic or logic operations on selected data in the partition.

17. The memory device of claim 16, wherein the arithmetic or logic operation operates on data in units of pages, wherein each page comprises at least 512 bits.

18. The memory device of claim 16, wherein the arithmetic or logic unit is part of a processor in the memory controller.

19. The memory device of claim 18, wherein the processor comprises a reduced instruction set computer (RISC) processor.

20. The memory device of claim 19, wherein each memory channel controller further comprises a static random-access memory (SRAM) circuit accessible by the processor.

21. The memory device of claim 20, wherein the processor performs arithmetic or logic operations on data stored in the first plurality of modular memory circuits.

22. The memory device of claim 21, further comprising a memory interface that allows access to the memory device by a host processor.

23. The memory device of claim 22, wherein the memory interface comprises a serial memory interface.

24. The memory device of claim 23, further comprising a non-volatile memory (NVM) module, wherein the serial memory interface loads boot code for the memory controller circuit from the NVM module to the SRAM circuit at power-up.

25. The memory device of claim 22 wherein the processor executes in-memory computational commands provided by the host processor over the memory interface.

26. The memory device of claim 25, wherein the host processor provides the in-memory computational commands by writing data packets each enclosing one of the in-memory computational commands into the SRAM circuit.

27. The memory device of claim 20, wherein the SRAM circuit comprises a circular status buffer into which the processor writes status packets, and wherein the status buffer is accessible by the host processor over the memory interface.

28. The memory device of claim 20, further comprising a cache memory that is configured in the SRAM circuit, wherein the cache memory caches pages of data retrieved from the partitions, each page having at least 512 bits, wherein the host processor requests data to be read from or to be written into the partitions by specifying a memory address, the data is requested in units of a cache line, the cache line being no greater than 512 bits.

29. The memory device of claim 23, wherein the memory interface further comprises a data buffer through which data is transferred between the host processor and the memory controller circuit.

30. The memory device of claim 28, further comprises a cache controller that manages caching of data in the cache memory wherein, when the host processor requests data to be read, the cache controller causes (i) a page of data associated with the specified memory address to be retrieved and cached in the cache memory, when the page of data is not already cached in the cache memory, and (ii) the requested data to be sent to the host processor over the memory interface.

31. The memory device of claim 30 wherein, when the host processor requests data to be written, the cache controller causes (i) a page of data associated with the specified memory address to be retrieved and cached in the cache memory, when the page of data is not already present in the cache memory, and (ii) the data to be written to be merged into the cached page.

32. The memory device of claim 31, wherein the cache controller causes check bits to be generated in conjunction with merging the data to be written into the cached page.

33. The memory device of claim 32, wherein the cache controller further causes the merged data to be written into the partition at the specified memory address during a write back operation.

34. The memory device of claim 33, wherein the cache controller maintains tag bits associated with each page of data, the tag bits indicating that the page of data has been updated and pending a write back operation into the partitions.

35. The memory device of claim 33, wherein the memory controller performs refresh operations on memory cells within the partition at predetermined times, and wherein the write back operation takes place in lieu of one of the refresh operations.

36. The memory device of claim 30, wherein the cache controller prefetches multiple pages of data in addition to the page of data associated with the specified memory address.

37. The memory device of claim 36, wherein the partition is organized into data blocks, each data block being served by a separate, non-overlapping set of drivers or sense amplifiers, and wherein prefetched pages of data are retrieved from more than one data block.

38. The memory device of claim 37, wherein the cache controller, upon detecting the host processor accesses data in a memory block, prefetches all data stored in the memory block based on an address associated with the memory block accessed.

39. The memory device of claim 30, wherein the cache controller further comprises a content addressable memory that stores addresses associated with pages of data stored in the cache memory.

40. The memory device of claim 30, wherein the cache controller further comprises a look-up table for accessing the pages of data stored in the cache memory.

41. A memory system, comprising:
a plurality of memory devices, each configured substantially the same as the memory device of claim 1, provided and interconnected to form a dual-in-line memory module (DIMM); and
a processor controlling operations in the memory devices.

42. The system of claim 41, wherein the processor comprises a reduced instruction set computer (RISC) processor.

43. The memory device of claim 1, wherein the memory device is one of a plurality of memory devices interconnected on a printed circuit board (PCB) to form a PCB memory module.

44. The memory device of claim 1, wherein the memory device is one of a plurality of memory devices provided and interconnected to form a dual-in-line memory module (DIMM).

45. The memory device of claim 1, wherein the first and second substrates are stacked using a wafer-scale stacking technique.

46. The memory device of claim 1, wherein the first plurality of modular memory circuits project a two-dimensional regular-shape footprint when projected onto the first substrate along a first direction substantially orthogonal to the planar surface of the first substrate.

47. The memory device of claim 46, wherein the footprint comprises a plurality of rows of modular memory circuits along a second direction and a plurality of columns of modular memory circuits along a third direction, the second and the third directions being each orthogonal to the first direction and orthogonal to each other.

48. The memory device of claim 47, wherein the rows of modular memory circuits form one or more memory banks.

49. The memory device of claim 48, wherein the memory banks are further organized into one or more memory bank groups.

50. The memory device of claim 47, wherein the memory controller circuit comprises modular logic circuits arranged such that each modular logic circuit is positioned for interconnection by hybrid bonds with an associated one of the first plurality of modular memory circuits.

51. The memory device of claim 1, wherein the first plurality of modular memory circuits each comprise a 3-dimensional array of memory cells.

* * * * *